(12) United States Patent
Venkatraman et al.

(10) Patent No.: US 9,781,698 B2
(45) Date of Patent: Oct. 3, 2017

(54) DISTRIBUTION AND UTILIZATION OF ANTENNA INFORMATION FOR LOCATION DETERMINATION OPERATIONS

(71) Applicant: QUALCOMM Incorporated, San Diego, CA (US)

(72) Inventors: Sai Pradeep Venkatraman, Santa Clara, CA (US); Subash Marri Sridhar, San Jose, CA (US); Saumitra Mohan Das, Santa Clara, CA (US); Carlos Horacio Aldana, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/836,190

(22) Filed: Aug. 26, 2015

(65) Prior Publication Data
US 2016/0255603 A1    Sep. 1, 2016

Related U.S. Application Data

(60) Provisional application No. 62/126,204, filed on Feb. 27, 2015.

(51) Int. Cl.
*H04W 24/00* (2009.01)
*H04W 64/00* (2009.01)
(Continued)

(52) U.S. Cl.
CPC .......... *H04W 64/003* (2013.01); *G01R 29/10* (2013.01); *G01S 5/0252* (2013.01); *H04W 24/08* (2013.01); *H04W 64/00* (2013.01); *H04W 88/08* (2013.01)

(58) Field of Classification Search
CPC .... G01R 29/10; H04W 24/08; H04W 64/003; H04W 88/08; H04W 64/00; G01S 5/00
(Continued)

(56) References Cited

U.S. PATENT DOCUMENTS 7,260,408 B2 *  8/2007  Friday ................... G01S 5/0252
                                                          342/357.43
8,170,546 B2 *  5/2012  Bennett .............. H04N 21/4126
                                                          370/331
(Continued)

FOREIGN PATENT DOCUMENTS

WO        2015027118 A1    2/2015

OTHER PUBLICATIONS

International Search Report and Written Opinion—PCT/US2016/015624—ISA/EPO—dated May 4, 2016.
(Continued)

*Primary Examiner* — Nathan Taylor
(74) *Attorney, Agent, or Firm* — Hunter Clark PLLC; Thien T. Nguyen

(57) ABSTRACT

Disclosed are methods, devices, systems, apparatus, servers, computer-/processor-readable media, and other implementations, including a method, performed at a processor-based device, that includes obtaining antenna information for one or more wireless nodes, and generating based, at least in part, on the antenna information for the one or more wireless nodes, a heatmap representative of values measurable at a plurality of locations from signals transmitted by the one or more wireless nodes.

22 Claims, 22 Drawing Sheets

(51) Int. Cl.
*G01S 5/00* (2006.01)
*G01R 29/10* (2006.01)
*H04W 24/08* (2009.01)
*G01S 5/02* (2010.01)
*H04W 88/08* (2009.01)

(58) Field of Classification Search
USPC ...................................................... 455/456.1
See application file for complete search history.

(56) References Cited

U.S. PATENT DOCUMENTS

| | | | |
|---|---|---|---|
| 9,320,010 B2* | 4/2016 | Segev | H04W 64/003 |
| 2002/0058503 A1 | 5/2002 | Gutowski | |
| 2005/0190081 A1 | 9/2005 | Banks et al. | |
| 2008/0085692 A1* | 4/2008 | Hart | H04W 16/20 |
| | | | 455/187.1 |
| 2011/0159884 A1* | 6/2011 | Chawla | H04W 52/0254 |
| | | | 455/456.1 |
| 2011/0201357 A1* | 8/2011 | Garrett | G01S 5/0252 |
| | | | 455/456.2 |
| 2011/0244887 A1 | 10/2011 | Dupray et al. | |
| 2011/0305233 A1* | 12/2011 | Seok | H04W 52/248 |
| | | | 370/338 |
| 2012/0028654 A1* | 2/2012 | Gupta | H04W 4/04 |
| | | | 455/456.3 |
| 2012/0044265 A1* | 2/2012 | Khorashadi | G01C 21/206 |
| | | | 345/641 |
| 2012/0056786 A1* | 3/2012 | Pandey | G01S 5/021 |
| | | | 342/463 |
| 2012/0094639 A1* | 4/2012 | Carlson | H04W 4/021 |
| | | | 455/414.1 |
| 2012/0220315 A1* | 8/2012 | Karttaavi | G01S 3/046 |
| | | | 455/457 |
| 2012/0287783 A1* | 11/2012 | Kuhn | H04W 16/08 |
| | | | 370/230 |
| 2013/0260799 A1* | 10/2013 | Tarlow | G01S 5/0252 |
| | | | 455/456.5 |
| 2013/0267257 A1* | 10/2013 | Palanki | H04W 64/003 |
| | | | 455/456.5 |
| 2013/0279349 A1* | 10/2013 | Pandey | H04W 24/00 |
| | | | 370/252 |
| 2013/0307723 A1* | 11/2013 | Garin | H04W 64/003 |
| | | | 342/357.29 |
| 2014/0221005 A1* | 8/2014 | Marshall | G01S 5/021 |
| | | | 455/456.1 |
| 2014/0256346 A1* | 9/2014 | Venkatraman | H04W 4/043 |
| | | | 455/456.1 |
| 2014/0355461 A1* | 12/2014 | Aldana | G01S 5/00 |
| | | | 370/252 |
| 2015/0045055 A1* | 2/2015 | Prechner | H04W 64/00 |
| | | | 455/456.1 |
| 2015/0133173 A1* | 5/2015 | Edge | G01S 1/66 |
| | | | 455/456.6 |
| 2015/0181553 A1* | 6/2015 | Segev | H04W 64/00 |
| | | | 455/456.1 |
| 2015/0235266 A1* | 8/2015 | Jain | H04W 4/021 |
| | | | 705/14.58 |
| 2015/0319707 A1* | 11/2015 | Abdelmonem | H04L 5/006 |
| | | | 455/522 |
| 2016/0034724 A1* | 2/2016 | Zumsteg | G06K 7/10386 |
| | | | 235/439 |
| 2016/0077184 A1* | 3/2016 | Steiner | G01S 5/021 |
| | | | 455/456.5 |
| 2016/0255463 A1 | 9/2016 | Das | |
| 2016/0255471 A1 | 9/2016 | Marri Sridhar et al. | |
| 2016/0255604 A1 | 9/2016 | Venkatraman et al. | |

OTHER PUBLICATIONS

International Search Report and Written Opinion—PCT/US2016/015524—ISA/EPO—dated May 4, 2016.
International Search Report and Written Opinion—PCT/US2016/015513—ISA/EPO—dated May 4, 2016.
International Search Report and Written Opinion—PCT/US2016/015506—ISA/EPO—dated May 4, 2016.
Second Written Opinion from International Application No. PCT/US2016/015513, dated Oct. 12, 2016, 9 pgs.
International Preliminary Report on Patentability—PCT/US2016/015513—European Patent Office—Berlin, Germany—dated Jan. 16, 2017—36 pgs.
Second Written Opinion from International Application No. PCT/US2016/015624, dated Mar. 9, 2017, 5 pages.
International Preliminary Report on Patentability—PCT/US2016/015524—European Patent Office—Berlin, Germany—Mar. 14, 2017—20 pgs.
International Preliminary Report on Patentability—PCT/US2016/015624—European Patent Office—Berlin, Germany—dated Apr. 26, 2016—32 pp.

* cited by examiner

DISTRIBUTION AND UTILIZATION OF ANTENNA INFORMATION FOR LOCATION DETERMINATION OPERATIONS

CLAIM OF PRIORITY UNDER 35 U.S.C. §119

The present Application claims the benefit of and priority to U.S. Provisional Application Ser. No. 62/126,204, entitled "DISTRIBUTION AND UTILIZATION OF ANTENNA INFORMATION FOR LOCATION DETERMINATION OPERATIONS," filed Feb. 27, 2015, which is assigned to the assignee hereof, and expressly incorporated herein by reference.

BACKGROUND

Antenna information for wireless devices, such as access points, base stations, personal mobile devices, etc., is generally determined and used for network analysis purposes. Such antenna information may include, for example, information about the nodes' antenna types or models, antenna gain data, antenna configuration, etc.

Location determination techniques often rely on certain assumptions about the nodes' antennas when computing data used to derive a device's position. For example, when computing range values (i.e., the distance between a receiving device and a transmitting device) it is sometimes assumed that the transmitting device's antenna is omnidirectional. Such an assumption, and/or other assumptions made about a transmitting device's antenna attributes, may not always be correct, and may thus lead to inaccurate position determination results, or otherwise hamper or degrade performance.

SUMMARY

In some variations, an example method, performed at a processor-based device, is disclosed. The method includes obtaining antenna information for one or more wireless nodes, and generating based, at least in part, on the antenna information for the one or more wireless nodes, a heatmap representative of values measurable at a plurality of locations from signals transmitted by the one or more wireless nodes.

In some variations, a device is provided that includes at least one transceiver to communicate with one or more remote devices, memory, and one or more processors coupled to the memory and the at least one transceiver. The device is configured to obtain antenna information for one or more wireless nodes, and generate based, at least in part, on the antenna information for the one or more wireless nodes, a heatmap representative of values measurable at a plurality of locations from signals transmitted by the one or more wireless nodes.

In some variations, an apparatus is provided. The apparatus includes means for obtaining antenna information for one or more wireless nodes, and means for generating based, at least in part, on the antenna information for the one or more wireless nodes, a heatmap representative of values measurable at a plurality of locations from signals transmitted by the one or more wireless nodes.

In some variations, non-transitory computer/processor readable media is provided. The computer readable media is programmed with a set of instructions, executable on a processor, to obtain antenna information for one or more wireless nodes, and generate based, at least in part, on the antenna information for the one or more wireless nodes, a heatmap representative of values measurable at a plurality of locations from signals transmitted by the one or more wireless nodes.

BRIEF DESCRIPTION OF THE DRAWING

Like reference symbols in the various drawings indicate like elements, in accordance with certain example implementations.

DETAILED DESCRIPTION

Figure 1:
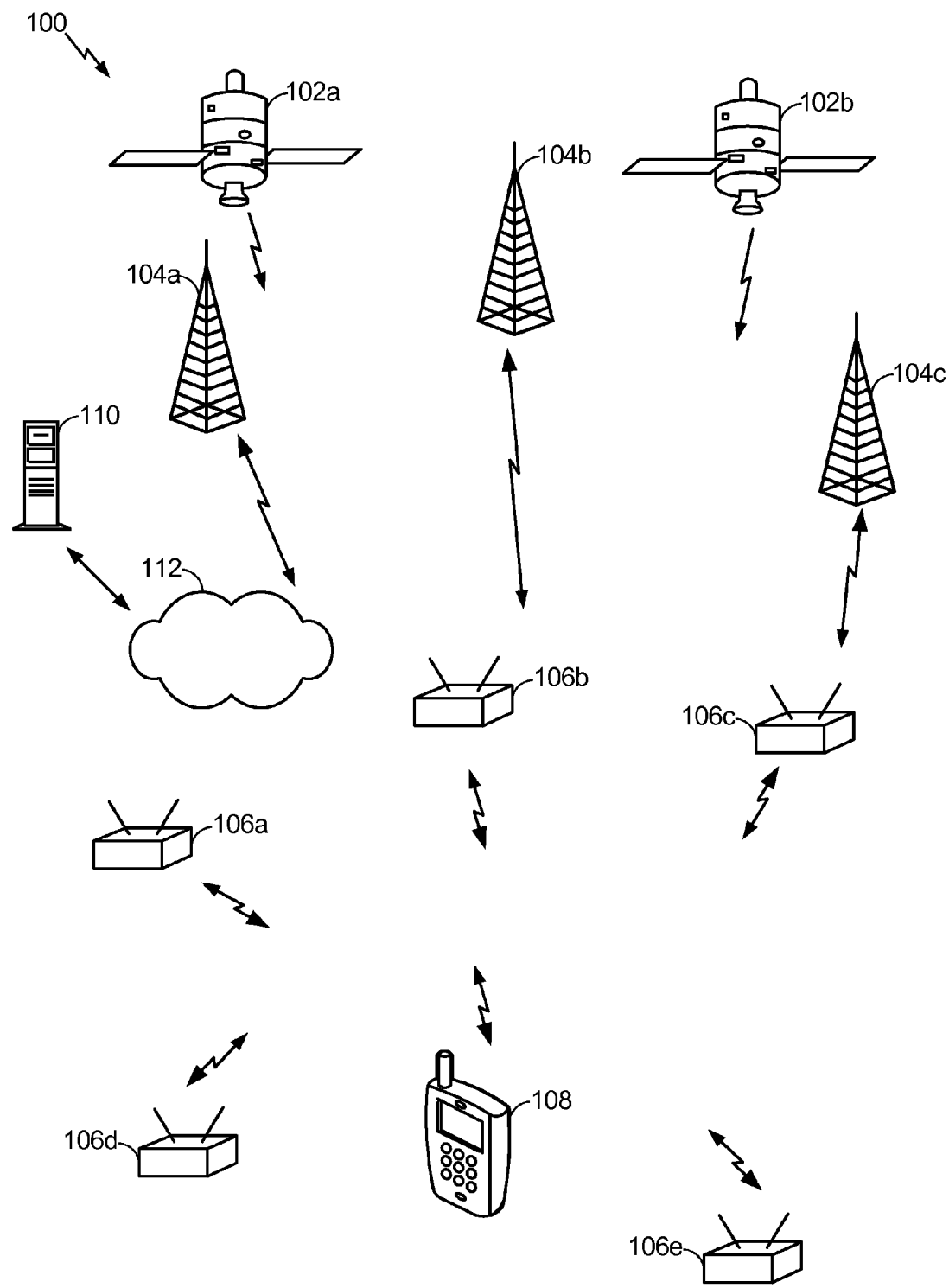
FIG. 1 is a schematic diagram of an example operating environment that includes a mobile wireless device in communication with one or more wireless nodes, in accordance with certain example implementations.

Described herein are methods, systems, devices, computer readable media, and other implementations, for collection, management, and utilization of antenna information (e.g., to perform location-determination operations). Example embodiments include, for example, one or more of the following methods.

One method may include obtaining by a first wireless device a communication comprising antenna information for one or more antennas of a second wireless device, determining at the first wireless device signal strength values for signals transmitted from the second wireless device, and performing location determination operations based on the determined signal strength values for the signals transmitted from the second wireless device, and on the antenna information for the one or more antennas of the second wireless device.

An additional method may include receiving, by a wireless device, signals that include at least one message comprising antenna data for a first wireless node transmitting the signals, and transmitting, by the wireless device, an information message including the antenna information for the first wireless node to a remote device configured to receive and store antenna information for multiple wireless nodes obtained by one or more wireless devices while visiting respective areas covered by the multiple wireless nodes.

Another method may include receiving at multiple locations of a mobile device communications transmitted from a first wireless node, and deriving based on measurements performed on the received communications at the multiple locations of the mobile device, in response to a determination that a spatial distribution of the multiple locations at which the measurements were performed is sufficiently large, antenna information for one or more antennas of the first wireless node.

Yet another method may include determining at the mobile wireless device information pertaining to a first wireless node in communication with the mobile wireless device, wherein at least some antenna information for the first wireless node is not available. The method also includes transmitting, by the mobile wireless device, an information message including at least some of the information pertaining to the first wireless node, the information message transmitted to a remote device configured to receive and store antenna information for multiple wireless nodes obtained by one or more wireless devices while visiting respective areas covered by the multiple wireless nodes. The remote device is further configured to identify from data records containing the stored multiple antenna information for the multiple wireless nodes one or more records with data matching at least one value from the information message transmitted by the mobile wireless device, and to determine from the one or more identified data records values representative of potential antenna parameters for the at least some antenna information that is not available for the first wireless node.

One further method may include obtaining antenna information for one or more wireless nodes, and generating based, at least in part, on the antenna information for the one or more wireless nodes, a heatmap representative of values measurable at a plurality of locations from signals transmitted by the one or more wireless nodes.

A further method may include obtaining (e.g., at a mobile device) antenna information, including a transmitter gain, for a wireless node, deriving an estimate of a receiver gain for a receiver of the mobile device based, at least in part, on the transmitter gain for the wireless node, and adjusting one or more signal strength values determined for signals received from the wireless node based on the estimate of the receiver gain of the receiver of the mobile device derived based on the transmitter gain for the wireless node.

Another method may include obtaining (e.g., at a mobile device) antenna information for a wireless node, determining based on the antenna information an antenna type for the wireless node (transmitting signals received at the mobile device), and computing one or more range values, representative of one or more distances of the wireless node to the mobile device, from determined one or more signal strength values in response to a determination that the antenna type for the wireless node corresponds to an omnidirectional antenna.

With attention now drawn to FIG. 1, shown is a schematic diagram of an example operating environment 100 that includes a wireless device (also referred to as a mobile wireless device or as a mobile station) 108 in communication with one or more wireless nodes. The mobile device 108 may be configured, in some embodiments, to obtain antenna information for one or more of the wireless node (e.g., access points 104a-c and 106a-e depicted in FIG. 1) with which the mobile device communicates, to receive and measure signals from the one or more wireless nodes (e.g., to determine/derive signal strength values for the received signals), to process the received and measured signals based, at least in part, on the obtained antenna information, to communicate some of the antenna information it obtained to a remote device (e.g., a central repository of information), and/or to perform other operations with respect to its own or other devices' antenna information. The processing performed by the mobile device (or, alternatively, by some other remote device in communication with the mobile device 108) may include performing location determination operations based, at least in part, on the signals (e.g., the signals' determined strength values) received from the one or more transmitting nodes, and on antenna information for antennas of the transmitting nodes. By taking into account antenna information to perform, for example, location determination operations, location determination accuracy may be improved.

In some embodiments, and as will be described in greater details below, antenna information may be obtained by the mobile device 108 through one or more of the following types of communications.

One communication type is broadcasting of broadcast messages (e.g., beacon frames), communicated by at least one access point, that includes an information element with data pertaining to antenna information for the transmitting access point and/or for other nodes.

In another communication type, a reply message is transmitted by the at least one node (e.g., any one or more of the base stations 104*a-c* or the access points 106*a-e*) in response to a request message from the mobile device 108 to obtain antenna information in order to use such antenna information to perform various operations (such as location determination operations). In some embodiments, the request-reply message exchange between the mobile device 108 and the at least one node may be implemented according to the Fine Timing Measurement (FTM) protocol, or a Timing Measurement protocol, in which messages exchanged by the communicating devices include antenna information elements with data pertaining to antenna information for the communicating devices.

In a further communication type, assistance data that includes antenna information, is transmitted from a server(s) configured to maintain such assistance data. In some embodiments, the assistance data server (which may be implemented as part of one of the one or more nodes with which the mobile device is communicating/interacting) is configured to manage a repository of assistance data, including such data as maps of various locales that may be visited by mobile devices, heatmaps used for location determination, almanac information for the various nodes and/or positioning satellite vehicles, antenna information for antennas of the various nodes, etc. In some embodiments, the antenna information provided as assistance data may have been collected or compiled through crowd-sourcing operations, in which various mobile devices collected antenna information from various nodes (e.g., access points) during their operation (i.e., while moving around) and communicated the collected antenna information to the central repository maintained by the assistance data server. Subsequently, the crowd-sourced collected information may be provided to another mobile device visiting similar (or same) locations visited by the mobile devices that initially collected the antenna information stored in the repository. In some embodiments, the central repository is configured to infer antenna information for a particular node from the information maintained for other nodes when actual antenna information for the particular node is not available.

The mobile device 108 may be configured, in some embodiments, to operate and interact with multiple types of other communication systems/devices, including local area network devices (or nodes), such as WLAN for indoor communication, femtocells, Bluetooth® wireless technology-based transceivers, and other types of indoor communication network nodes, wide area wireless network nodes, satellite communication systems, etc., and as such the mobile device 108 may include one or more interfaces to communicate with the various types of communications systems. As used herein, communication systems/devices/nodes with which the mobile device 108 may communicate are also referred to as access points (AP's) or base stations.

As noted, the environment 100 may contain one or more different types of wireless communication systems or nodes. Such nodes, also referred to as wireless access points (or WAPs) may include LAN and/or WAN wireless transceivers, including, for example, WiFi base stations, femto cell transceivers, Bluetooth® wireless technology transceivers, cellular base stations, WiMax transceivers, etc. Thus, for example, and with continued reference to FIG. 1, the environment 100 may include the Local Area Network Wireless Access Points (LAN-WAPs) 106*a-e* that may be used for wireless voice and/or data communication with the mobile device 108. The LAN-WAPs 106*a-e* may also be utilized, in some embodiments, as independents sources of position data, e.g., through fingerprinting-based procedures, through implementation of multilateration-based procedures based, for example, on timing-based techniques (e.g., RTT-based measurements), signal strength measurements (e.g., RSSI measurements), etc. The LAN-WAPs 106*a-e* can be part of a Wireless Local Area Network (WLAN), which may operate in buildings and perform communications over smaller geographic regions than a WWAN. Additionally in some embodiments, the LAN-WAPs 106*a-e* could also include pico or femto cells. As will be further discussed in greater details, one or more of the LAN-WAP nodes depicted in FIG. 1 may be configured to communicate antenna information for the antenna(s) of the transmitting nodes, with such information including one or more of, for example, antenna gain information for the respective transmitting nodes, antenna model information for the respective transmitting nodes, antenna orientation/pattern information, antenna down-tilt information, etc. In some embodiments, the LAN-WAPs 106*a-e* may be part of, for example, WiFi networks (802.11x), cellular piconets and/or femtocells, Bluetooth® wireless technology Networks, etc. The LAN-WAPs 106*a-e* can also include a Qualcomm indoor positioning system (QUIPS). A QUIPS implementation may, in some embodiments, be configured so that a mobile device can communicate with a server that provides the device with data (such as to provide the assistance data, e.g., floor plans, AP MAC IDs, RSSI maps, etc.) for a particular floor or some other region where the mobile device is located. Although five (5) LAN-WAP access points are depicted in FIG. 1, any number of such LAN-WAP's may be used, and, in some embodiments, the environment 100 may include no LAN-WAPs access points at all, or may include a single LAN-WAP access point.

As further illustrated, the environment 100 may also include a plurality of one or more types of the Wide Area Network Wireless Access Points (WAN-WAPs) 104*a-c*, which may be used for wireless voice and/or data communication, and may also serve as another source of independent information through which the mobile device 108 may determine its position/location. The WAN-WAPs 104*a-c* may be part of wide area wireless network (WWAN), which may include cellular base stations, and/or other wide area wireless systems, such as, for example, WiMAX (e.g., 802.16). A WWAN may include other known network components which are not shown in FIG. 1. Typically, each WAN-WAPs 104*a*-104*c* within the WWAN may operate from fixed positions or may be moveable, and may provide network coverage over large metropolitan and/or regional areas. Although three (3) WAN-WAPs are depicted in FIG.

1, any number of such WAN-WAPs may be used. In some embodiments, the environment 100 may include no WAN-WAPs at all, or may include a single WAN-WAP.

Communication to and from the mobile device 108 (to exchange data, enable location determination operations with respect to the position(s) of the device 108, etc.) may be implemented, in some embodiments, using various wireless communication networks and/or technologies such as a wide area wireless network (WWAN), a wireless local area network (WLAN), a wireless personal area network (WPAN), and so on. The term "network" and "system" may be used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, a WiMax (IEEE 802.16), and so on. A CDMA network may implement one or more radio access technologies (RATs) such as cdma2000, Wideband-CDMA (W-CDMA), and so on. Cdma2000 includes IS-95, IS-2000, and/or IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. In some embodiments, 4G networks, Long Term Evolution ("LTE") networks, Advanced LTE networks, Ultra Mobile Broadband (UMB) networks, and all other types of cellular communications networks may also be implemented and used with the systems, methods, and other implementations described herein. A WLAN may also be implemented, at least in part, using an IEEE 802.11x network, and a WPAN may be a Bluetooth® wireless technology network, an IEEE 802.15x, or some other type of network. The techniques described herein may also be used for any combination of WWAN, WLAN and/or WPAN.

In some embodiments, and as further depicted in FIG. 1, the mobile device 108 may also be configured to at least receive information from a Satellite Positioning System (SPS) 102a-b, which may be used as an independent source of position information for the mobile device 108. The mobile device 108 may thus include one or more dedicated SPS receivers specifically designed to receive signals for deriving geo-location information from the SPS satellites. In embodiments in which the mobile device 108 can receive satellite signals, the mobile device may utilize a receiver (e.g., a GNSS receiver) specifically implemented for use with the SPS to extract position data from a plurality of signals transmitted by at least the SPS satellites 102a-b. Transmitted satellite signals may include, for example, signals marked with a repeating pseudo-random noise (PN) code of a set number of chips and may be located on ground based control stations, user equipment and/or space vehicles. The techniques provided herein may be applied to, or otherwise enabled, for use in various other systems, such as, e.g., Global Positioning System (GPS), Galileo, Glonass, Compass, Quasi-Zenith Satellite System (QZSS) over Japan, Indian Regional Navigational Satellite System (IRNSS) over India, Beidou over China, etc., and/or various augmentation systems (e.g., a Satellite Based Augmentation System (SBAS)) that may be associated with, or otherwise enabled, for use with one or more global and/or regional navigation satellite systems. By way of example but not limitation, an SBAS may include an augmentation system(s) that provides integrity information, differential corrections, etc., such as, e.g., Wide Area Augmentation System (WAAS), European Geostationary Navigation Overlay Service (EGNOS), Multi-functional Satellite Augmentation System (MSAS), GPS Aided Geo Augmented Navigation or GPS and Geo Augmented Navigation system (GAGAN), and/or the like. Thus, as used herein, an SPS may include any combination of one or more global and/or regional navigation satellite systems and/or augmentation systems, and SPS signals may include SPS, SPS-like, and/or other signals associated with such one or more SPS.

The system 100 may further include a server 110 (e.g., a location server, or any other type of server) configured to communicate, via a network 112 (e.g., a cellular wireless network, a WiFi network, a packet-based private or public network, such as the public Internet), or via wireless transceivers included with the server 110, with multiple network elements or nodes, and/or mobile devices. For example, the server 110 may be configured to establish communication links with one or more of the WLAN nodes, such as the access points 106a-e, which may be part of the network 112, to communicate data and/or control signals to those access points, and receive data and/or control signals from the access points. Each of the access points 106a-e can, in turn, establish communication links with mobile devices located within range of the respective access points 106a-e. The server 110 may also be configured to establish communication links (directly via a wireless transceiver(s), or indirectly, via a network connection) with one or more of the WWAN nodes, such as the WWAN access points 104a-c depicted in FIG. 1, which may also be part of the network 112. The server 110 may also be configured to at least receive information from satellite vehicles 102a and/or 102b of a Satellite Positioning System (SPS), which may be used as an independent source of position information. In some embodiments, the server 110 may be part of, attached to, or reachable from network 112, and may communicate with the mobile device 108 via the network 112. In such embodiments, the server 110 may not establish communication links with some or all of WWAN APs 104a-c and the WLAN APs 106a-e. In some embodiments, the server 110 may implement such protocols as Secure User plane Location (SUPL). User plane Location Protocol (ULP), LTE Positioning Protocol (LPP) and/or the LPP Extensions (LPPe) protocol for direct communication and to control and transfer measurements. The LPP protocol is defined by 3GPP, and the ULP and LPPe protocols are defined by the Open Mobile Alliance (OMA). In some embodiments, the server 110 may also be used to implement a central repository of information to store, inter alia, antenna information for multiple wireless nodes and devices.

Thus, in some embodiments, the mobile device 108 may communicate with any one or a combination of the SPS satellites 102a-b, the WAN-WAPs 104a-c, and/or the LAN-WAPs 106a-e. In some embodiments, each of the aforementioned systems can provide an independent information estimate of the position for the mobile device 108 using the same or different techniques. In some embodiments, the mobile device may combine the solutions derived from each of the different types of access points to improve the accuracy of the position data. It is also possible to hybridize measurements from different systems to get a position estimate, particularly when there is an insufficient number of measurements from all individual systems to derive a position. For instance, in an urban canyon setting, only one GNSS satellite may be visible and provide adequate measurements (i.e. raw pseudorange and Doppler observables). By itself, this single measurement cannot provide a position solution. However, it could be combined with measurements from urban WiFi APs, or WWAN cell ranges. When deriving a position using the access points 104a-b, 106a-e, and/or the satellites 102a-b, at least some of the operations/processing may be performed using a server (e.g., a positioning server) 110 which may be accessed, in some embodiments, via a network 112.

Figure 2:
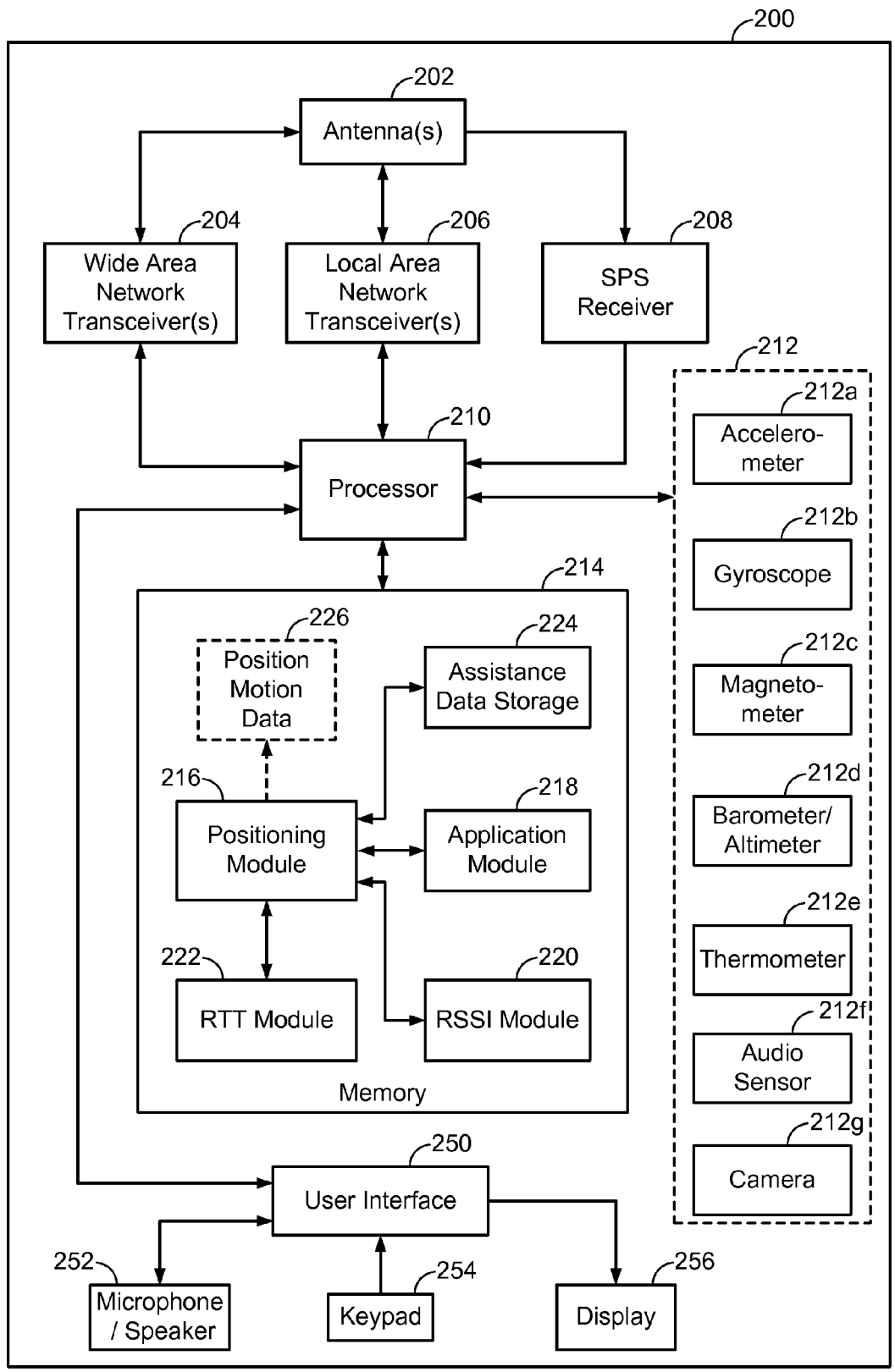
FIG. 2 is a schematic diagram of an example wireless device (e.g., a mobile wireless device), in accordance with certain example implementations.

With reference now to FIG. 2, a schematic diagram illustrating various components of an example mobile device 200, which may be similar to or the same as the mobile device 108 depicted in FIG. 1 is shown. For the sake of simplicity, the various features/components/functions illustrated in the schematic boxes of FIG. 2 are connected together using a common bus to represent that these various features/components/functions are operatively coupled together. Other connections, mechanisms, features, functions, or the like, may be provided and adapted as necessary to operatively couple and configure a portable wireless device. Furthermore, one or more of the features or functions illustrated in the example of FIG. 2 may be further subdivided, or two or more of the features or functions illustrated in FIG. 2 may be combined. Additionally, one or more of the features or functions illustrated in FIG. 2 may be excluded. In some embodiments, some or all of the components depicted in FIG. 2 may also be used in implementations of one or more of the access points 106a-e and/or 104a-c illustrated in FIG. 1. In such embodiments, the components depicted in FIG. 2 may be configured to cause the operations performed by access points as described herein (e.g., to communicate messages that include antenna information, to process and manage antenna information, to perform location determination operations, etc.)

As shown, the mobile device 200 may include one or more local area network transceivers 206 that may be connected to one or more antennas 202. The one or more local area network transceivers 206 comprise suitable devices, circuits, hardware, and/or software for communicating with and/or detecting signals to/from one or more of the WLAN access points 106a-e depicted in FIG. 1, and/or directly with other wireless devices within a network. In some embodiments, the local area network transceiver(s) 206 may comprise a WiFi (802.11x) communication transceiver suitable for communicating with one or more wireless access points; however, in some embodiments, the local area network transceiver(s) 206 may be configured to communicate with other types of local area networks, personal area networks (e.g., Bluetooth® wireless technology networks), etc. Additionally, any other type of wireless networking technologies may be used, for example, Ultra Wide Band, ZigBee, wireless USB, etc.

The mobile device 200 may also include, in some implementations, one or more wide area network transceiver(s) 204 that may be connected to the one or more antennas 202. The wide area network transceiver 204 may comprise suitable devices, circuits, hardware, and/or software for communicating with and/or detecting signals from one or more of, for example, the WWAN access points 104a-c illustrated in FIG. 1, and/or directly with other wireless devices within a network. In some implementations, the wide area network transceiver(s) 204 may comprise a CDMA communication system suitable for communicating with a CDMA network of wireless base stations. In some implementations, the wireless communication system may comprise other types of cellular telephony networks, such as, for example, TDMA, GSM, WCDMA, LTE etc. Additionally, any other type of wireless networking technologies may be used, including, for example, WiMax (802.16), etc.

In some embodiments, an SPS receiver (also referred to as a global navigation satellite system (GNSS) receiver) 208 may also be included with the mobile device 200. The SPS receiver 208 may be connected to the one or more antennas 202 for receiving satellite signals. The SPS receiver 208 may comprise any suitable hardware and/or software for receiving and processing SPS signals. The SPS receiver 208 may request information as appropriate from the other systems, and may perform the computations necessary to determine the position of the mobile device 200 using, in part, measurements obtained by any suitable SPS procedure.

As further illustrated in FIG. 2, the example mobile device 200 includes one or more sensors 212 coupled to a processor/controller 210. For example, the sensors 212 may include motion sensors to provide relative movement and/or orientation information (which is independent of motion data derived from signals received by the wide area network transceiver(s) 204, the local area network transceiver(s) 206, and/or the SPS receiver 208). By way of example but not limitation, the motion sensors may include an accelerometer 212a, a gyroscope 212b, and a geomagnetic (magnetometer) sensor 212c (e.g., a compass), any of which may be implemented based on micro-electro-mechanical-system (MEMS), or based on some other technology. The one or more sensors 212 may further include an altimeter (e.g., a barometric pressure altimeter) 212d, a thermometer (e.g., a thermistor) 212e, an audio sensor 212f (e.g., a microphone) and/or other sensors. The output of the one or more sensors 212 may be provided as part of the data (along with antenna information for nodes communicating with the device 200 and/or with such data as location data) transmitted to a remote device or server (via the transceivers 204 and/or 206, or via some network port or interface of the device 200), for storage or further processing (e.g., antenna information for an AP communicating with the mobile device 200 may be inferred by matching sensor data measured by the sensors of the mobile device with records that are maintained at the server and that include antenna information for various wireless nodes and associated sensor data that was previously obtained by one or more wireless devices). As further shown in FIG. 2, in some embodiments, the one or more sensors 212 may also include a camera 212g (e.g., a charge-couple device (CCD)-type camera, a CMOS-based image sensor, etc.), which may produce still or moving images (e.g., a video sequence) that may be displayed on a user interface device, such as a display or a screen, and that may be further used to determine an ambient level of illumination and/or information related to colors and existence and levels of UV and/or infra-red illumination.

The processor(s) (also referred to as a controller) 210 may be connected to the local area network transceiver(s) 206, the wide area network transceiver(s) 204, the SPS receiver 208 and the one or more sensors 212. The processor may include one or more microprocessors, microcontrollers, and/ or digital signal processors that provide processing functions, as well as other calculation and control functionality. The processor 210 may be coupled to storage media (e.g., memory) 214 for storing data and software instructions for executing programmed functionality within the mobile device. The memory 214 may be on-board the processor 210 (e.g., within the same IC package), and/or the memory may be external memory to the processor and functionally coupled over a data bus. Further details regarding an example embodiment of a processor or computation system, which may be similar to the processor 210, are provided below in relation to FIG. 21.

A number of software modules and data tables may reside in memory 214 and may be utilized by the processor 210 in order to manage both communications with remote devices/nodes (such as the various nodes and/or the server 110 depicted in FIG. 1), perform positioning determination functionality, and/or perform device control functionality. As illustrated in FIG. 2, in some embodiments, the memory 214 may include a positioning module 216, an application module 218, a received signal strength indicator (RSSI) module 220, and/or a round trip time (RTT) module 222. It is to be noted that the functionality of the modules and/or data structures may be combined, separated, and/or be structured in different ways depending upon the implementation of the mobile device 200. For example, the RSSI module 220 and/or the RTT module 222 may each be realized, at least partially, as a hardware-based implementation, and may thus include such devices or circuits as a dedicated antenna (e.g., a dedicated RTT and/or an RSSI antenna), a dedicated processing unit to process and analyze signals received and/or transmitted via the antenna(s) (e.g., to determine signal strength of received signals, determine timing information in relation to an RTT cycle, etc.)

The application module 218 may be a process running on the processor 210 of the mobile device 200, which requests position information from the positioning module 216. Applications typically run within an upper layer of the software architectures, and may include indoor navigation applications, shopping applications, location aware service applications, etc. The positioning module 216 may derive the position of the mobile device 200 using information derived from various receivers and modules of the mobile device 200, e.g., based on measurements performed by the RSSI module and/or the RTT module. The positioning and application modules may also perform various processes (e.g., determine location estimates, perform navigation operations) based, in part, on antenna information associated with the transmitter(s) with which the mobile device is communicating (as discussed below in greater detail). For example, in implementations where the mobile device collects measurements from one or more access points, antenna gain information and antenna orientation information for the one or more access points may be used to derive positioning data. For instance, an antenna's gain pattern, representative of transmission lobes and/or regions of attenuated transmission levels (resulting from the configuration of the antenna(s)), and/or orientation information, representative of the direction at which the antennas of the access points may be pointing (such information would be indicative of expected transmission strength levels at radial positions relative to the antenna), may be used to derive more accurate heatmap data, derive more accurate positioning data, etc. For example, a signal strength measurement may be adjusted if the gain pattern and/or antenna orientation are such that the measurement taken by the mobile device occurred in a location (as determined from the received or known antenna orientation and gain pattern data, and/or from an independently computed position of the mobile device) in which the signal level would be attenuated.

As further illustrated, the mobile device 200 may also include assistance data storage 224, where assistance data (which may have been downloaded from a remote server), such as map information, data records relating to location information in an area where the device is currently located, antenna information obtained for wireless nodes in the vicinity or range of the device 200, etc., is stored. In some embodiments, the mobile device 200 may also be configured to receive supplemental information that includes auxiliary position and/or motion data which may be determined from other sources (e.g., from the one or more sensors 212). Such auxiliary position data may be incomplete or noisy, but may be useful as another source of independent information for estimating the position of the device 200, or for performing other operations or functions. Supplemental information may also include, but not be limited to, information that can be derived or based upon Bluetooth signals, beacons, RFID tags, and/or information derived from a map (e.g., receiving coordinates from a digital representation of a geographical map by, for example, a user interacting with a digital map). The supplemental information may optionally be stored in the storage module 226 schematically depicted in FIG. 2.

The mobile device 200 may further include a user interface 250 providing suitable interface systems, such as a microphone/speaker 252, a keypad 254, and a display 256 that allows user interaction with the mobile device 200. The microphone/speaker 252 (which may be the same or different from the sensor 212f) provides for voice communication services (e.g., using the wide area network transceiver(s) 204 and/or the local area network transceiver(s) 206). The keypad 254 may comprise suitable buttons for user input. The display 256 may include a suitable display, such as, for example, a backlit LCD display, and may further include a touch screen display for additional user input modes.

Figure 3:
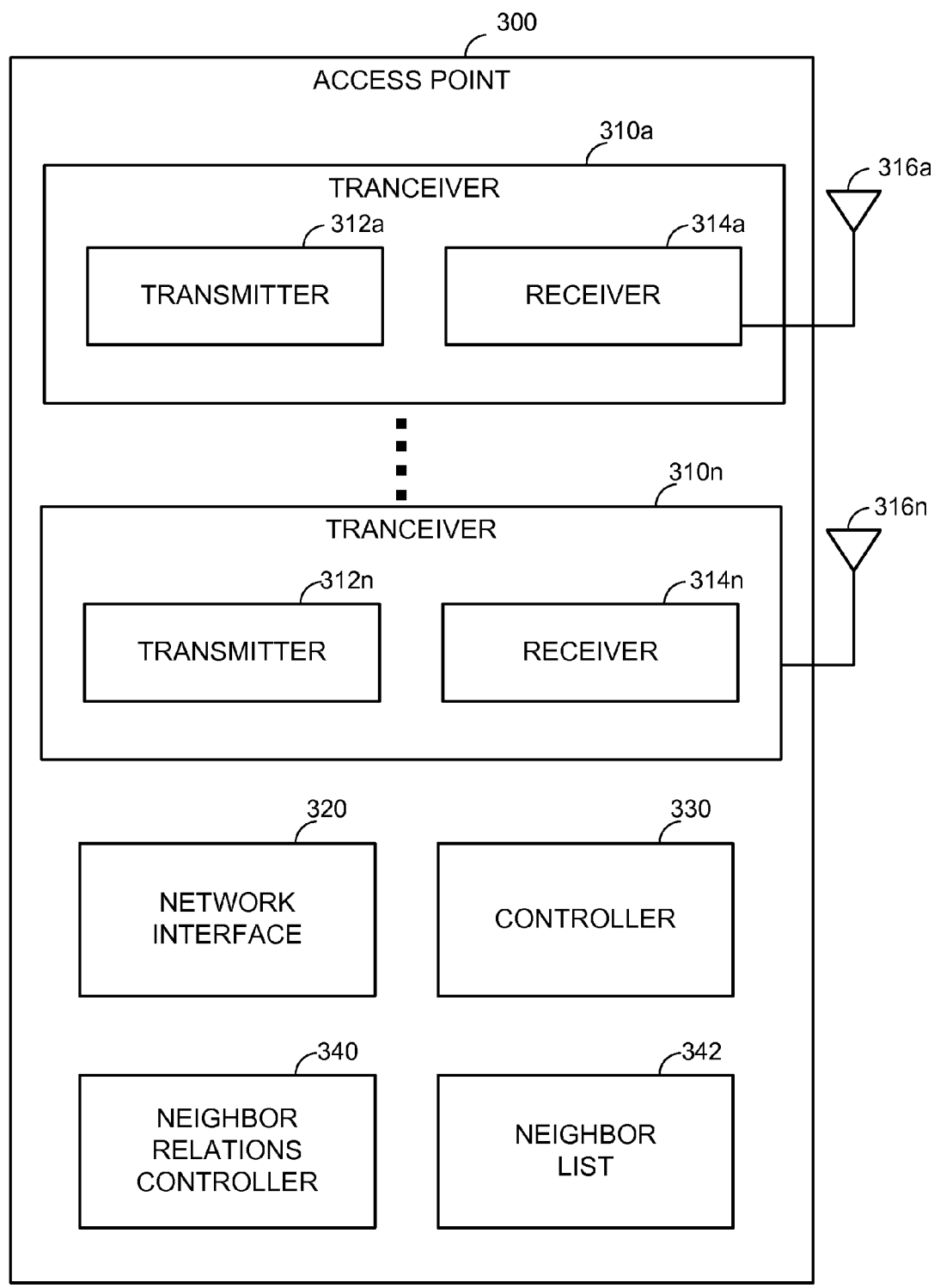
FIG. 3 is a schematic diagram of an example node (e.g., an access point), in accordance with certain example implementations.

With reference now to FIG. 3, a schematic diagram of an example transmitting node 300, such as access point, which may be similar to, and be configured to have a functionality similar to that, of any of the various nodes depicted in FIG. 1 (e.g., the nodes 104a-c, 106a-e, and/or the server 110), is shown. The node 300 may include one or more transceivers 310a-n electrically coupled to one more antennas 316a-n for communicating with wireless devices, such as, for example, the mobile devices 108 or 200 of FIGS. 1 and 2, respectively. The each of the transceivers 310a-310n may include a respective transmitter 312a-n for sending signals (e.g., downlink messages) and a respective receiver 314a-n for receiving signals (e.g., uplink messages). The node 300 may also include a network interface 320 to communicate with other network nodes (e.g., sending and receiving queries and responses). For example, each network element may be configured to communicate (e.g., wired or wireless backhaul communication) with a gateway, or other suitable entity of a network, to facilitate communication with one or more core network nodes (e.g., any of the other access points shown in FIG. 1, the server 110, and/or other network devices or nodes). Additionally and/or alternatively, communication with other network nodes may also be performed using the transceivers 310a-n and/or the respective antennas 316a-n.

The node 300 may also include other components that may be used with embodiments described herein. For example, the node 300 may include, in some embodiments, a controller 330 (which may be similar to the processor 210 of FIG. 2) to manage communications with other nodes (e.g., sending and receiving messages) and to provide other related functionality. For example, the controller 330 may be configured to control the operation of the antennas 316a-n so as to adjustably control the antennas' transmission power and phase, gain pattern, antenna direction (e.g., the direction at which a resultant radiation beam from the antennas 316a-n propagates), antenna diversity, and other adjustable antenna parameters for the antennas 316a-n of the node 300. In some embodiments, the antennas' configuration may be controlled according to pre-stored configuration data provided at the time of manufacture or deployment of the node 300, or according to data obtain from a remote device (such as a central server sending data representative of the antenna configuration, and other operational parameters, that are to be used for the node 300). In some embodiments, and as will be discussed in greater details below, the node 300 may be configured to transmit messages that include antenna information representative of the current antenna configuration for the one or more antennas 316*a-n* of the node 300. The controller 330 may thus cause a message to be generated (e.g., a broadcast message such as, for example, a beacon message formatted according to IEEE 802.11 standard, or a message formatted according to a fine timing measurement, or FTM, message destined to a particular device), and to be transmitted through at least one of the one or more antennas 316*a-n* to destination mobile device in communication, or in transmission range, with the node 300. In some embodiments, the node 300 may also be configured to receive a message containing antenna information for an antenna(s) of another wireless device, and perform location determination operations based, at least in part, on the antenna information for the other wireless device received in the message. The node 300 may also be configured, in some implementations, to store and manage antenna information for multiple wireless devices, received from various devices, and to provide assistance data comprising antenna information for a particular one of the multiple wireless nodes to a mobile device requiring the antenna information for the particular one of the multiple wireless nodes (e.g., in situations where the mobile device entered an area served/covered by the particular one of the multiple wireless nodes).

In addition, the node 300 may include, in some embodiments, neighbor relations controllers (e.g., neighbor discovery modules) 340 to manage neighbor relations (e.g., maintaining a neighbor list 342) and to provide other related functionality. The controller 330 may be implemented, in some embodiments, as a processor-based device, with a configuration and functionality similar to that shown and described in relation to FIG. 21. In some embodiments, the node may also include one or more sensors (not shown), such as any of the one or more sensors 212 of the mobile device 200 depicted in FIG. 2.

Obtaining Antenna Information Via Messaging-Based Procedures

Figure 4:
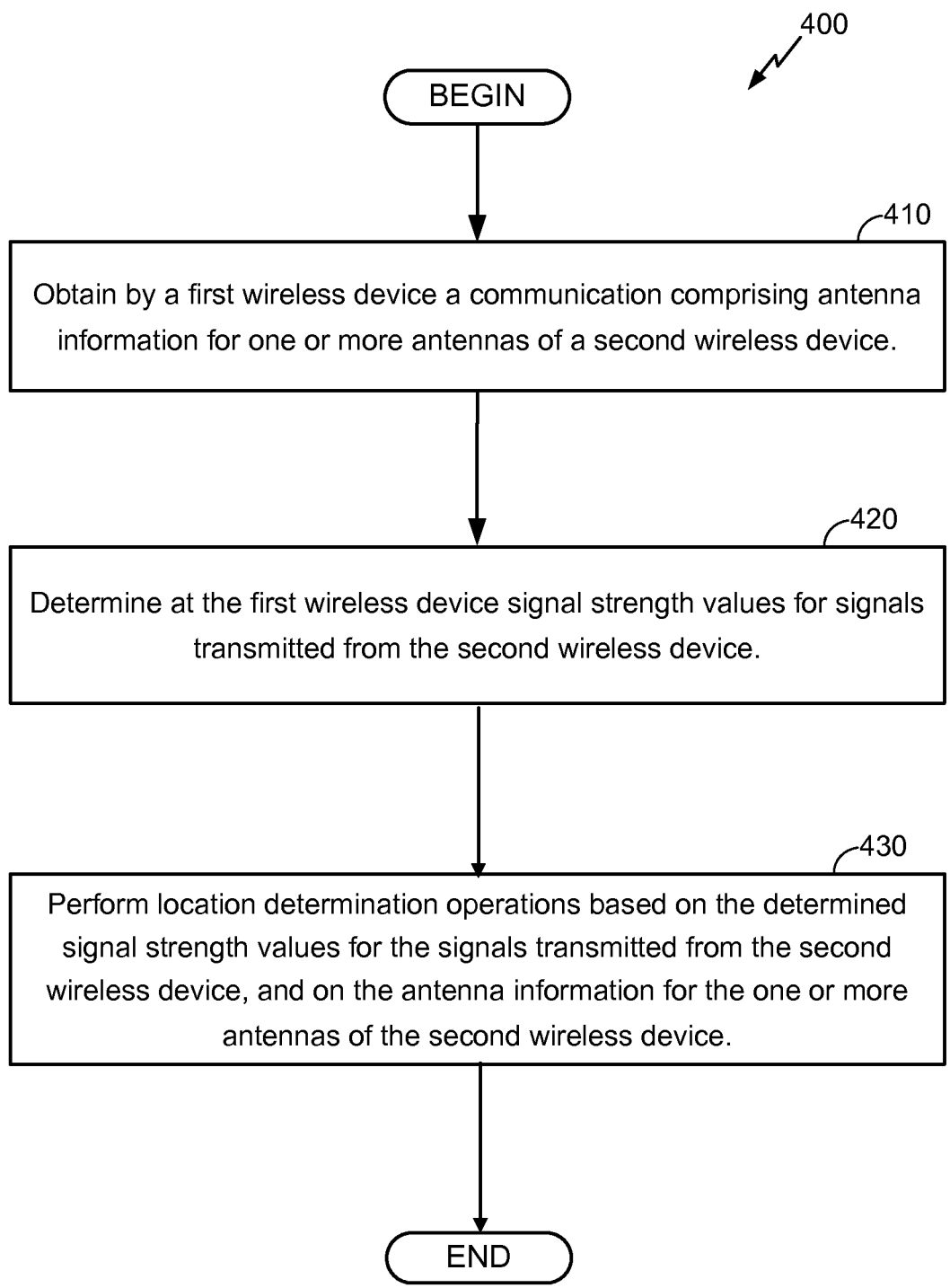
FIG. 4 is a flowchart of an example procedure to obtain, by a first wireless device, antenna information for an antenna(s) of another (second) wireless device, in accordance with certain example implementations.

As noted, wireless devices described herein, such as the mobile device 108 and/or the access points of FIG. 1, or the mobile device 200 of FIG. 2, may be configured, in some embodiments, to obtain antenna information based on which position/location determination operations (and/or other types of operations) may be performed. Thus, with reference to FIG. 4, a flowchart of an example procedure 400 to obtain, by a first wireless device, antenna information for antennas of another (second) wireless device, is shown. The procedure 400 includes obtaining at block 410 by the first wireless device a communication comprising antenna information for one or more antennas of the second wireless device. In some embodiments, the antenna information may include one or more of antenna type information (e.g., whether the antenna is unidirectional or omnidirectional, or providing other forms of antenna type information), antenna gain pattern (e.g., data representative of the radiation strength as a function of angular direction from the antenna), antenna orientation (e.g., direction at which the antenna(s) are pointing, and thus the direction at which radiation beams would propagate), antenna identification, antenna configuration information (e.g., number of antennas and their structural arrangement), antenna model data, antenna diversity, beam control data, maximum gain for the antennas, transmission power, etc.

In some embodiments, the communication transmitted by the second wireless device, which comprises the antenna information for the antenna(s) of the second wireless device, may include a broadcast message transmitted from the second wireless device to multiple wireless devices (including the first wireless device). Thus, in such embodiments, obtaining the communication comprising the antenna information may include receiving a broadcast message comprising the antenna information from the second wireless device. In some embodiments, the broadcast message may include a beacon frame (e.g., a control frame, that includes identifying and control data, which is periodically sent by the transmitting wireless device) or a data frame (a frame that includes encoded data, and may also include header/control information). Thus, with reference to FIG. 5, an example beacon frame 500 formatted according to IEEE 802.11 standard and transmitted by a WiFi access point (such as any of the access points 106*a-e* depicted in FIG. 1) is shown. A similar frame, but one configured according to a different protocol may be sent by non-WiFi access points. The beacon frame may be transmitted periodically, and may include antenna information provided in an information element defined in the beacon frame. As shown, the example beacon frame 500 depicted in FIG. 5 may include a median access control (MAC) header 502, a frame body 504, and a frame control sequence (FCS) 506. The MAC header 502 may, in some embodiments, be 24 bytes long, the frame body 504 may be of variable length, and the FCS 506 may be four bytes long. The MAC header 502 generally serves to provide basic control and/or routing information for the beacon frame 500. In the illustrated example, the MAC header 502 may include a frame control (FC) field 508, a duration field 510, a destination address (DA) field 512 (e.g., to identify a particular destination if the frame is used for a unicast transmission, or to indicate that the frame is a broadcast transmission), a source address (SA) field 514, a basic service set identification (BSSID) field 516, and a sequence control field 518. As shown, the FC field 508 is two bytes long, the duration field 510 is two bytes long, the DA field 512 is six bytes long, the SA field 514 is six bytes long, the BSSID field 516 is six bytes long, and the sequence control field 518 is two bytes long.

The frame body 504 is configured to provide detailed information about the transmitting node, including antenna information. Thus, one or more of the following fields of data may be included in the frame body portion of the example frame 500 (the field length for each of the example fields depicted is also indicated): a timestamp field 520, a beacon interval field 522, a capability information field 524, a service set identifier (SSID) field 526, a supported rates field 528, a frequency-hopping (FH) parameter set 530, a direct-sequence parameter set 532, a contention-free parameter set 534, an independent basic service set (IBSS) parameter set 536, a country information field 538, a FH hopping parameter field 540, a FH pattern table 542, a power constraint field 544, a channel switch announcement field 546, a quiet field 548, a IBSS direct frequency selection (DFS) field 550, a transmit power control (TPC) field 552, an effective radiated power (ERP) information field 554, an extended supported rates field 556, and a robust security network (RSN) field 558.

Additionally, as noted herein, in some embodiments, the frame body 504 of the example beacon frame 500 may also include an antenna information element field 560 to provide antenna information for the one or more antennas of the transmitting node (e.g., such as any of the access points or base stations depicted in FIG. 1) transmitting the beacon frame (the beacon frame may additionally or alternatively include antenna information for other nodes with which the receiving wireless devices may communicate). As further illustrated in FIG. 5, the antenna information element field 560 may include an element ID field 562 that holds a unique identifier associated with the antenna information (e.g., to indicate that an antenna information element is being transmitted) and which may be used, e.g., by a receiving device, to parse the different fields. A length filed 564 of the example antenna information element 560 may include data indicating the number of bytes after the "Length" field that are part of the particular information field of the frame (e.g., the information element field, in this example). In some embodiments, the length field may have a minimum value of 2 and a maximum value of 255. The antenna information element 560 may also include an antenna ID field 566 specifying pre-assigned identification values for the one or more antennas of the transmitting node. In some embodiments, the assigned antenna ID's are locally unique values (i.e., the values distinguish between various antennas for the particular node identified by the element ID), and in some embodiments the antenna ID's are globally unique ID's, where every antenna of every node is assigned a different ID value. Although the field 566 is illustrated as a 1 byte field, the field may be of any size, and may include information for all individual antennas of the transmitting node (if the transmitting node includes multiple antennas). As further shown in FIG. 5, the beacon frame 500 may include, in some embodiments, antenna gain field 568 which may hold data representative of the maximum antenna gain(s) (e.g., expressed in dB) for the antenna(s) of the transmitting node. The antenna gain value(s) may, for example, be determined through previously conducted measurements for the antenna(s) of the transmitting node. Antenna type field 570 may be included in the antenna information element 560 of FIG. 5 holds data indicative of the antenna type, including, for example, model name of the antenna, an indication of whether the antenna is a directional or omnidirectional antenna (or some other antenna type), etc.

Figure 5:
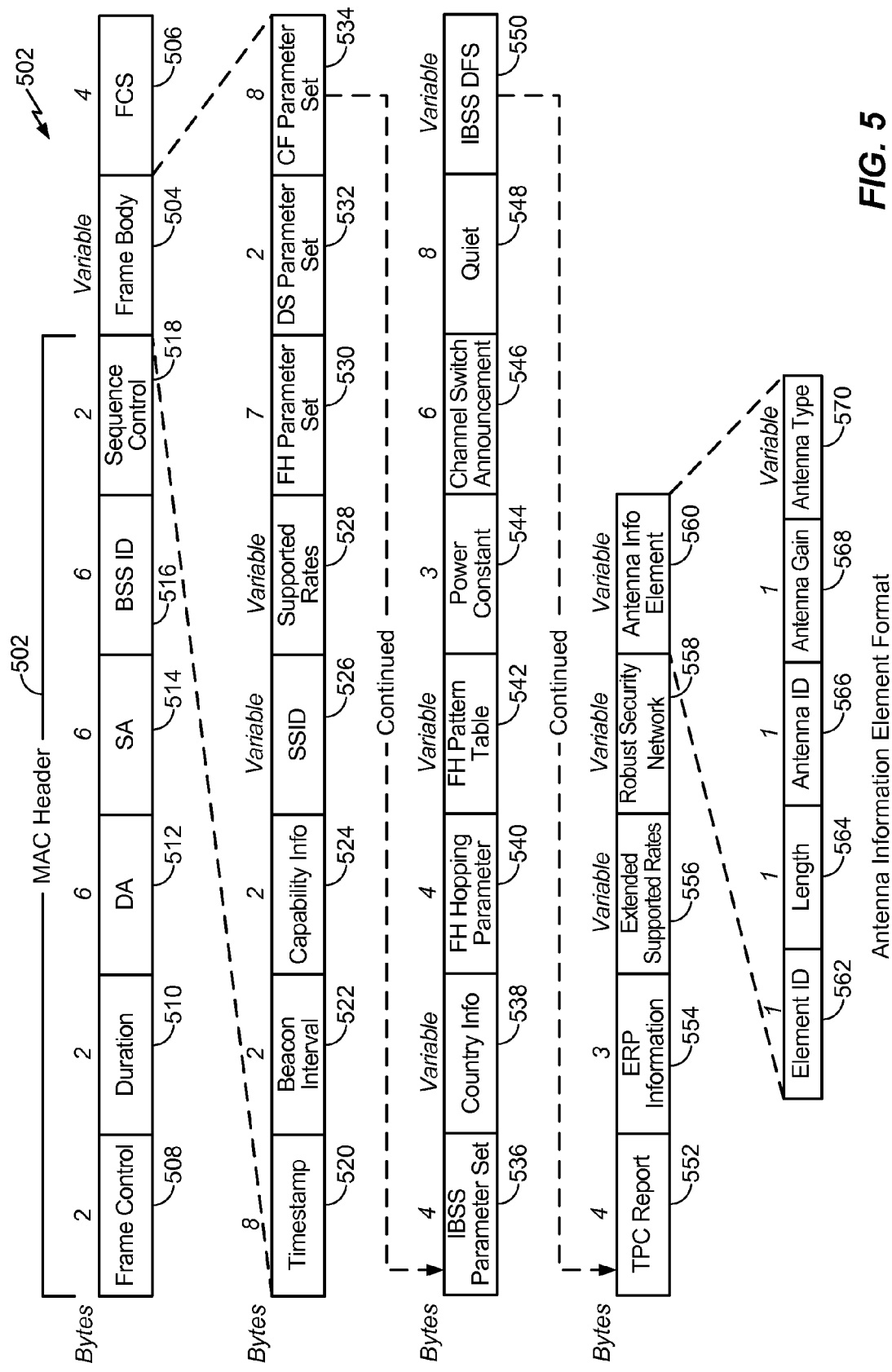
FIG. 5 is an example beacon frame, formatted according to IEEE 802.11 standard and transmitted by a WiFi access point, that includes antenna information, in accordance with certain example implementations.

Although not shown in FIG. 5, the antenna information element 560 may further include, in some embodiments, additional antenna information (arranged in one or more fields of the antenna information element 560). For example, the antenna information element 560 may further include one or more of the following.

In some embodiments, the information element 560 may include a gain pattern field, holding data representative of the angular and/or distance dependence of the antenna's gain, and may thus include data representative of gain at different angular positions relative to a point of origin for the antenna (the data may be provided at appropriate angular increments, depending on desired resolution required and on the available bandwidth needed to transmit the information). In some embodiments, the gain pattern may also be frequency-dependent (e.g., the gain pattern for signals transmitted at a frequency of 2.5 GHz may be different from the gain patterns for signals transmitted at a frequency of 5.0 GHz).

The information element 560 may further include an antenna orientation field, providing data representative of the direction at which the antenna(s) is pointing (generally relative to some geographical bearing, such as the magnetic north, or some other geographical reference point).

Also included in the information element 560 may be a transmitter power field, providing data indicative of the transmission power (e.g., Tx).

The information element 560 may additionally include a beam control field, providing data about operational parameters of respective ones of multiple antennas of the transmitting node (relative phases and amplitudes at which signals are to be transmitted from the multiple antennas) to thus control the beam transmitted by the transmitting node.

Another field that the information element 560 may include is an antenna diversity field, to indicate antenna diversity configurations (e.g., whether the antenna(s) is configured as a left or right sectorized, whether the antenna is configured as omnidirectional antenna, etc.)

Other data fields, to provide additional antenna information, may be included in the antenna information element 560 of the example beacon frame 500 of FIG. 5. In some embodiments, at least some of the information contained in the beacon frame 500 may be used infrequently or not at all. For example, in low-power radio environments, it may be desirable to reduce the length of the beacon frame 500 in order to reduce power consumption. Moreover, some radio environments use low data rates, and thus it may be desirable to reduce the length of the beacon frame 500 in order to shorten the amount of time it takes to transmit the beacon frame 500. Depending on implementation requirements and/or constraints (e.g., available or desired bandwidth, data rate, etc.), the antenna information element may be included in control portion of data frames transmitted by the transmitting node, and not only in beacon frames. Furthermore, the example beacon frame may include various other information elements, including, but not limited to, BSS AC Access Delay element, Measurement Pilot Transmission element, Multiple BSSID element, RM enabled Capabilities element, Advertisement Protocol element, Roaming Consortium element, Mesh ID element, etc.

In some embodiments, obtaining the communication that includes the antenna information may be implemented through a message-exchange type protocol, and may thus include transmitting from a first wireless device to a second wireless device a request message comprising information indicating a request for antenna information of the second wireless device, and receiving by the first wireless device, responsive to the request message, a reply message from the second wireless device with the requested antenna information for the second wireless device. In some embodiments, a request message may be implemented according to the fine timing measurement (FTM) protocol used to support differential distance computations between two wireless devices (either of which may be a non-AP station) by time stamping messages exchanged between the participating devices (thus enabling determination of round trip times between the two devices). Briefly, under the FTM protocol, a first, initiating, wireless device (also referred to as a "receiving STA," which may be similar to any of the devices 108, 104a-c, or 106a-e depicted in FIG. 1) may obtain or compute one or more measurements of RTT based, at least in part, on timing of messages or frames transmitted between the initiating wireless device and another, second, wireless device (also referred to as a "sending STA," which may be similar to any of the devices 108, 104a-c, or 106a-e depicted in FIG. 1). In some embodiments, the initiating wireless device (i.e., the "receiving STA") may initiate a message exchange transaction with the other wireless device (the "sending STA") by transmitting a fine timing measurement request (FTMR) message or frame (also referred to as a "Request") to the other wireless device. The initiating wireless device may subsequently receive an action frame or an acknowledgement message (also referred to as "Ack") that is transmitted from the other wireless device in response to the Request. The Action frame (also referred to as an M frame) or the Ack frame may, in some embodiments, provide an indication of receipt of a previously transmitted message. The initiating wireless device and/or the responding wireless device may then obtain or compute an RTT measurement based, at least in part, on time stamp values provided in the messages exchanged.

Thus, in some embodiments, the reply message sent by the other wireless device, which includes antenna information for the antenna of the other wireless device, may include a fine timing measurement (FTM) message such as an FTM-type Ack message or M frame (either of which may be modified, as more particularly described herein, to include antenna information). The request message sent by the initiating wireless device may include a fine timing measurement request (FTMR) message (or a request message for some other protocol, modified, as described herein, to cause the other, second, wireless device to send an FTM-type Ack message or M frame (or a reply message for some other protocol) with the requested antenna information for the other wireless device (or with antenna information for other wireless devices). In some embodiments, a request message of some other communication protocol may be sent as an initiating message.

Figure 6A:
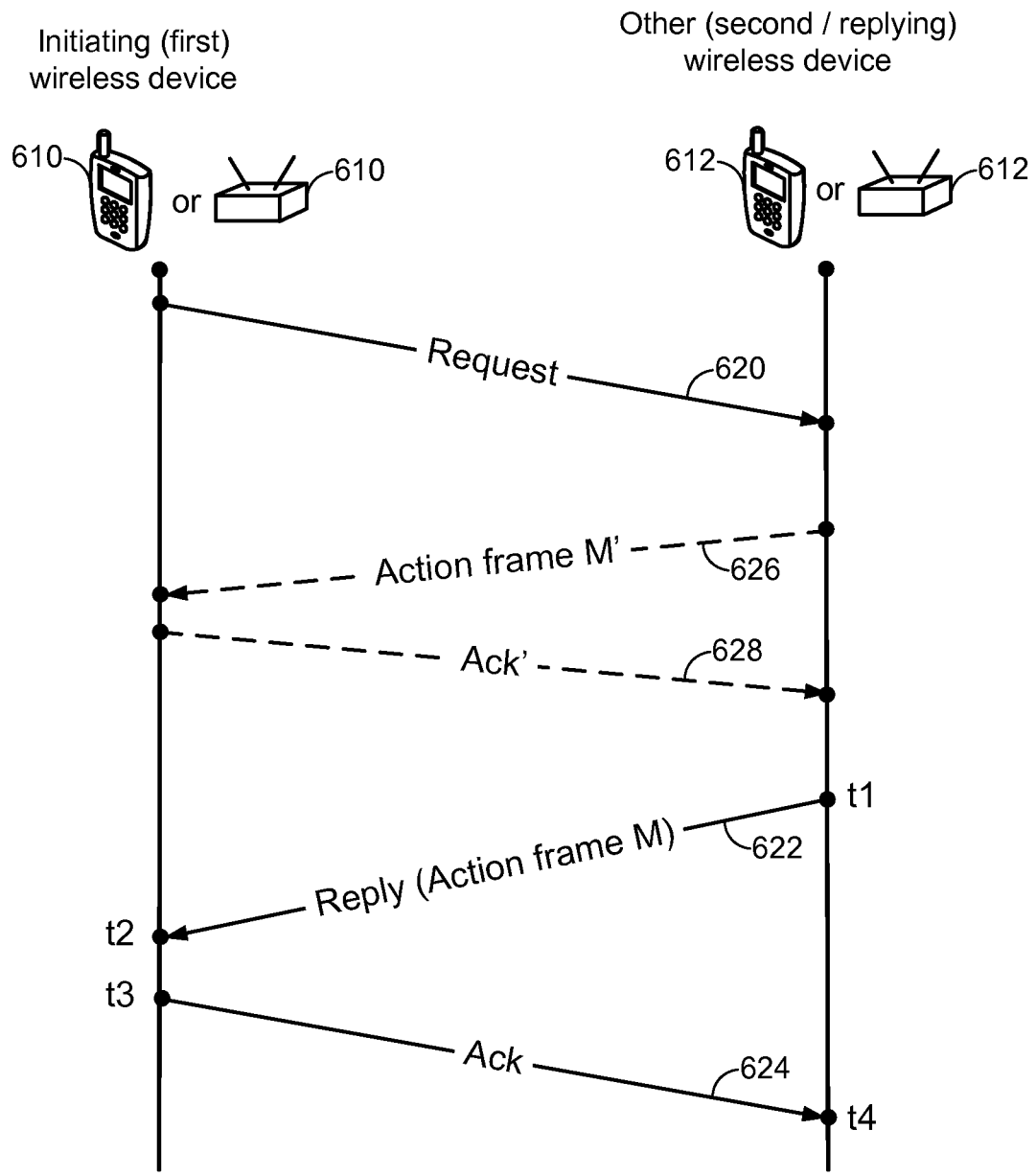
FIG. 6A is a signal flow diagram illustrating example interactions between two wireless devices to obtain antenna information, in accordance with certain example implementations.

More particularly, with reference to FIG. 6A, an example signal flow diagram illustrating interactions 600 between two wireless devices to obtain antenna information is shown. The interactions 600 include a Request message 620, which may be configured or formatted according to the FTM protocol discussed herein (e.g., the Request message may be an FTMR message), or according to some other protocol, transmitted by an initiating wireless device 610 (which may be similar to any of the devices 108, 104a-c, 106a-e, 200, or 300 depicted in FIG. 1, 2, or 3) to another, second, wireless device 612 (which may also be similar to any of the devices 108, 104a-c, 106a-e, 200, or 300 depicted in FIG. 1, 2, or 3), to request the other wireless device's antenna information (and/or antenna information for antennas of other wireless devices). In response to receiving the Request message 620, the other wireless device 612 transmits to the initiating, first, wireless device a reply message 622, which may be an 'Action' ('M') frame, that may be configured according to the FTM protocol (or according to some other protocol corresponding to the protocol that was used to send the request message 620), may be populated with data in accordance with the FTM protocol, and may further include, as an additional information element embedded in the reply message 622, the antenna information for the second wireless device. The reply message 622 may be an FTM protocol Action frame M, an Ack message, or any other type of communication implemented under the FTM protocol. The reply message 622 includes timing information, including time-of-arrival of the message 620 at the second wireless device 612, that may be used, together with timing measurements at the first wireless device to compute round trip times between the two wireless devices. As further depicted in the example system of FIG. 6A, in some embodiments, a third message, namely, an Ack message 624, may be sent from the first wireless device to the second wireless device as part of a Fine Time Measurement transaction. In the example system of FIG. 6A, the RTT between the two wireless devices 610 and 612 may be derived according to the relationship (t4−t1)−(t3−t2), where t1 is the timestamp value indicating the departure time of the Action frame M (corresponding to the message 622 in FIG. 6A), at the device responding to the Request (i.e., at the second wireless device of the example of FIG. 6A), t2 is the value indicating the time of arrival of the FTM Action frame M message (at the device initiating the request), t3 is the timestamp value indicating the time of departure of the Ack frame (the message 624) from the first (initiating) wireless device 610 in response to FTM frame received at t2, and t4 is the timestamp value indicating the arrival time of the Ack at the responding device (responsive to the FTM frame just sent at t1).

Figure 6B:
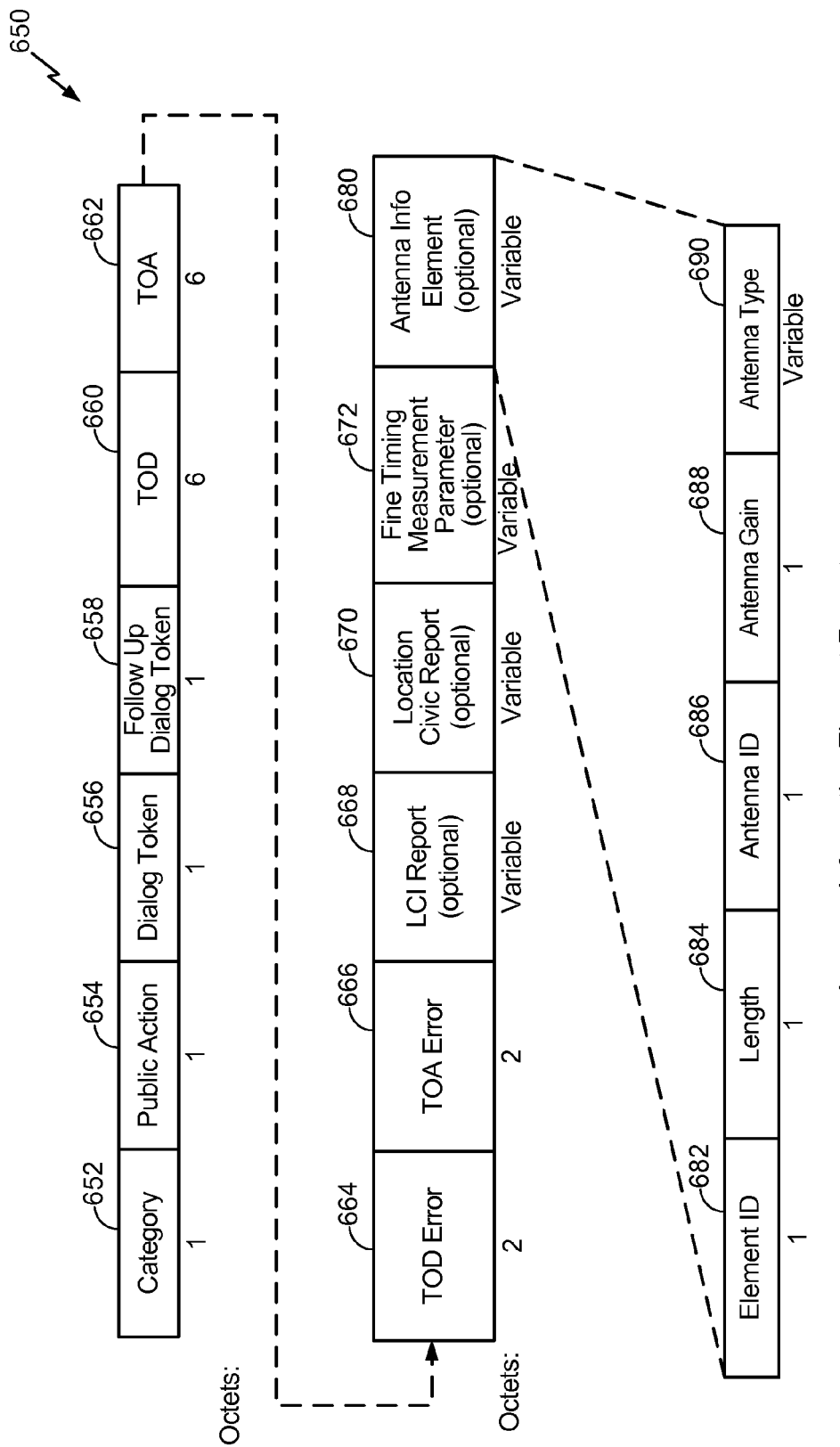
FIG. 6B is an example schematic diagram of a Reply message formatted according to a fine timing measurement (FTM) protocol, and including antenna information for a transmitting node or device, in accordance with certain example implementations.

An example schematic diagram of a message 650, which may be formatted and populated with data in a manner similar to the reply message 622 (the Action frame M message) is shown in FIG. 6B (the schematic of the example reply message also includes markings indicating possible fields lengths of the various fields). The message 650 includes a category field 652 with a value indicating the general use for which the message 650 is directed. For example, the field 652 may include, in some embodiments, a value specifying that the reply message, and the data contained therein, are for facilitating "Wireless Network Management." The category field 652 may, alternatively, specify a value corresponding to a category of "public." Other category values for the field 652 may also be used.

As further shown, the example message 650 may include a public action field 654 to hold a value indicating the type of action frame that is to be communicated, and thus the formatting to be followed for the particular action frame specified. For example, in some embodiments, a values of '22' specified in the public action field 654 indicates that the frame is for timing measurement. The Dialog Token field 656 may be set to a non-zero value chosen by the requesting station (e.g., the initiating wireless device 610 in the example of FIG. 6A) to identify the transaction and/or to identify the Fine Timing Measurement frame as the first of a message pair, with the second or follow-up Fine Timing Measurement frame to be sent later. In some embodiments, the dialog token field may be set to zero ('0') to specify that a timing measurement action frame is not part of a time synchronization transaction and/or to indicate that a fine timing measurement frame will not be followed by a subsequent follow-up fine timing measurement frame. A follow-up dialog token field 658 may be set to the non-zero value of the dialog token field of a previously transmitted fine timing measurement frame to indicate that it is the follow-up fine timing measurement frame. The follow-up dialog token may be set to a value of zero ('0') to indicate that the fine timing measurement frame is not a follow up to a previously transmitted Fine Timing Measurement frame (e.g., it is a first frame of a sequence).

With continued reference to FIG. 6B, the example message 650 may include a time of departure (TOD) field 660 that generally contains a timestamp representing the time at which a previous message from the responding device departed to the initiating device. Thus, if the reply message 622 of FIG. 6A was preceded by an earlier Action frame M' message 626 (in the example of FIG. 6A) sent by the second device 612 to the first device 610, the TOD included in the message 622 would be the time at which that earlier message 626 departed the second device 612 to the first device 610. As further shown in FIG. 6B, the message 650 may also include a time-of-arrival (TOA) field 662 containing a timestamp representing the time at which a message from the first wireless device, responsive to an earlier message sent by the responding device (i.e., responsive to the earlier Action frame M' message 626 sent by the second device 612) arrived at the responding device (i.e., arrived at the second device 612). Thus, for example, the time of arrival of an Ack' message 628, sent in response to the earlier sent Action frame M' message 626, at the second device 612 could be the value populated into the TOA field 662 of the message 650. The TOD and TOA fields may both contain values representative of time expressed in units of, for example, 0.1 ns (although other timing/resolution units may be used instead).

In some embodiments, the message 650 may further include a TOD Error field 664 specifying an upper bound for the error in the value specified in the TOD field 660. For example, a value of 2 in the TOD Error field 664 may indicate that the value in the TOD field has a maximum error of ±0.02 ns. TOA Error field 666 may contain an upper bound for the error in the value specified in the TOA field. For instance, a value of 2 in the TOA Error field indicates that the value in the TOA field has a maximum error of, for example, ±0.02 ns. Additionally, an LCI Report field 668 may contain a latitude/longitude coordinate values, a Location Civic Report field 670 may contain an address, and a Fine Timing Measurement Parameters field 672 may include different settings values are requested by the initiating STA and allocated by the responding STA.

As further shown in FIG. 6B, in some embodiments, the fine timing measurement message 650 may be used to provide antenna information for a requesting wireless device, and may thus include an antenna information element 680 with data representative of antenna information for the transmitting device (in this example, antenna information for the second, replying, wireless device 612 of FIG. 6A). A wireless device receiving the message 650 may recognize that the reply message includes antenna information for the replying wireless device based, for example, on a value include in an element ID field 682 (as more particularly discussed below). In some embodiments, the antenna information element 680 may be configured/formatted similarly to the antenna information element 560 of FIG. 5, as described herein. Thus, for example, the information element 680 may include the element ID field 682 to hold data representative of a unique identification value associated with the antenna information, and that is used to parse the different fields, a length field 684 indicating the number of bytes following the length field, an antenna ID field 686 containing an antenna ID (e.g., specifying pre-assigned identification values for the one or more antennas of the transmitting node), an antenna gain field 688 to hold data representative of the maximum antenna gain(s) for the antenna(s) of the transmitting node (e.g., for the wireless device 612 in the example depicted in FIG. 6A), and/or an antenna type field 690 with data indicative of the antenna type (e.g., model name of the antenna, an indication of whether the antenna is a directional or omnidirectional antenna, etc.) Like the antenna information element 560 of the beacon frame 500 in FIG. 5, the antenna information element 680 of the example FTM-based reply message may also include one or more of the following fields: a gain pattern field holding data representative of the angular dependence (or other type of positional and/or temporal dependence) of the antenna's gain, antenna orientation field providing data representative of the direction at which the antenna is pointing, transmitter power field providing data indicative of the transmission power (e.g., Tx) for the second wireless device, beam control field providing data about operational parameters of respective ones of multiple antennas of the transmitting node, antenna diversity field to indicate antenna diversity configurations, etc.

As noted, generating and transmitting the reply message 622 or 650 may be performed in response to receiving an FTMR request message such as the message 620 depicted in FIG. 6A. In some embodiments, the request message may include antenna information for the antenna of the initiating device (namely, the first wireless device 610 in the example of FIG. 6A), to thus implement an exchange of antenna information between the two interacting wireless devices. Upon determination, by the other, replying, wireless device (e.g., the device 612 of FIG. 6A), that the received FTM-type message includes antenna information, the replying wireless device may determine that the message represents a request for the replying wireless device's antenna information, and would thus generate and format a reply message, such as the messages 622 or 650, and include within the reply message the device's antenna information. Additionally and/or alternatively, the initiating message transmitted by the first, initiating, wireless device to the second, replying, wireless device may include an identifier, e.g., in a category field, an action field, and/or a trigger field (as will be discussed in greater details below), identifying the initiating message as a message requesting antenna information from the target wireless device, and causing the target wireless device to include its antenna information in the reply message transmitted back to the initiating wireless device. In some embodiments, the antenna information provided by the second, replying, wireless device may have been pre-stored at the second wireless device. Alternatively, in some embodiments, the second, replying, wireless devices obtains the antenna information from some remote device (e.g., the server 110 shown in FIG. 1, at which a repository for antenna information for multiple wireless devices may be implemented) in response to receiving the initiating message from the first wireless device and determining that the message constitutes or represents a request for the second, replying, wireless device's antenna information.

Figure 7:
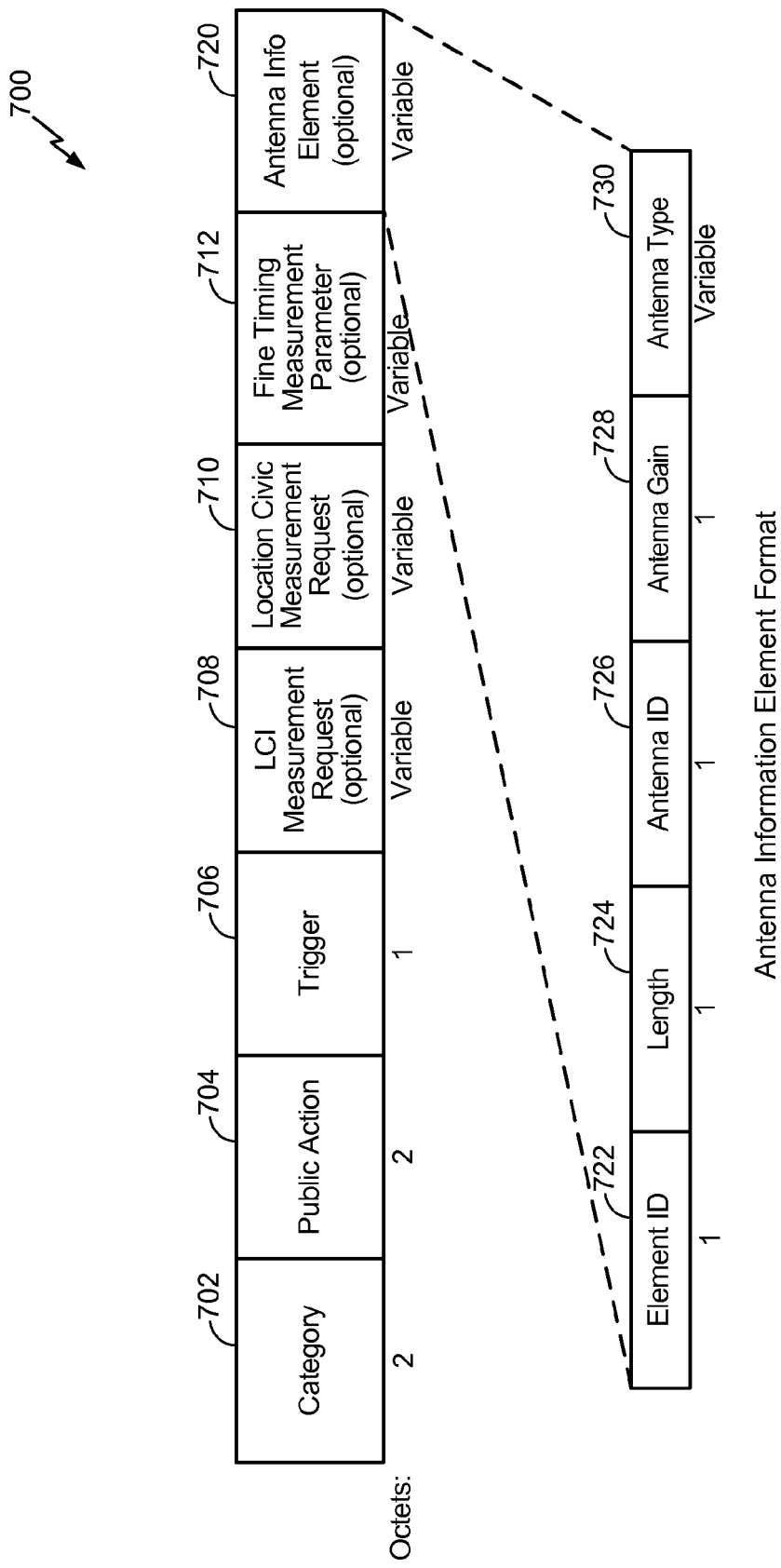
FIG. 7 is a schematic diagram of an example FTM-based request message (FTMR) used to request antenna information from a target wireless device/node, in accordance with certain example implementations.

Thus, with reference to FIG. 7 a schematic diagram of an example FTM-based request message (FTMR) 700, which may be similar to the message 620 transmitted by the example first, initiating, wireless device 610 of FIG. 6A, is shown. Similarly to the example FTM message 650 of FIG. 6B, the example request message 700 may include a category field 702 (e.g., with a value corresponding to a category of "public"). The example message 700 may also include a public action field 704 which, like the field 654 of the example message 650, may hold a value indicating the type of action frame that is to be communicated, and thus the formatting to be followed for the particular action frame specified, e.g., a value to indicate that the present message/frame is to request a fine timing measurement.

As further shown, the example message 700 may also include a trigger field 706 to indicate the type of operation the first, initiating, wireless device is requesting the second wireless device to perform. For example, setting the trigger field to a value of zero ('0') may indicate that the initiating device is requesting that the second wireless device stop sending fine timing measurement frames, while setting the trigger field 706 to a value of one ('1') may indicate that the initiating device is requesting that a Fine Timing Measurement procedure be performed by the second wireless device. The trigger field may use other values to indicate the operations the initiating wireless device is requesting the second wireless device to perform. The example message 700 may also include an LCI measurement request field 708 (containing for example, latitude/longitude coordinate values), a location civic measurement request field 710, and a fine timing measurement parameters field 712 (including different settings values that are requested by the initiating STA and allocated by the responding STA).

As noted, the initiating FTM request message (in this example, the message 620 of FIG. 6A or the message 700 of FIG. 7) may include, in some embodiments, antenna information for the initiating first wireless device to that may indicate to the target wireless device (in this case, the device 612 of FIG. 6A) that the initiating wireless device is requesting the second wireless device's antenna information, and to otherwise provide the second wireless device with the initiating device's antenna information to enable the second wireless device to perform location determination operations. Accordingly, the message 700 may further include, similar to the configuration of the message 650 of FIG. 6B, an antenna information element 720 that includes an element ID field 722 to hold data representative of a unique identification value assigned to the initiating node, a length field 724, an antenna ID field 726 containing an antenna ID specifying, for example, pre-assigned identification values for the one or more antennas of the transmitting node, an antenna gain field 728 to hold data representative of the maximum antenna gain(s) for the antenna(s) of the initiating node, and/or an antenna type field 730 with data indicative of the antenna type (e.g., model name of the antenna, an indication of whether the antenna is a directional or omnidirectional antenna, etc.) Like the antenna information element 680 of the FTM message 650, the antenna information element 720 of the example FTMR message may also include one or more of the following fields: a gain pattern field holding data representative of the angular dependence of the antenna's gain, antenna orientation field providing data representative of the direction at which the antenna is pointing, transmitter power field providing data indicative of the transmission power (e.g., Tx) for the wireless device, beam control field providing data about operational parameters of respective ones of multiple antennas of the node, antenna diversity field to indicate antenna diversity configurations, etc.

While not specifically shown, in some embodiments, the example messages 650 and/or 700 may also include addressing data to identify the source wireless device/node, and to further identify the address or identity of the intended recipient of the message. In some embodiments, other message configurations/formats may be used in addition to or instead of the configurations/formats of the example messages 650 and/or 700.

Thus, a first wireless device obtains antenna information from a second wireless device (another personal mobile wireless device, such as a mobile phone, or a wireless network node such as an access point/base station) through, for example, a broadcast message (such as the example broadcast message 500 illustrated in FIG. 5), a message exchange procedure/protocol (e.g., a fine timing measurement protocol), or via some other messaging procedure in which at least some of the information exchanged includes antenna information used to perform, for example, location determination operations. Turning back to FIG. 4, the first wireless device receives one or more signals from the second wireless device and/or from other wireless devices with respect to which the first wireless device has received their respective antenna information, and determines at block 420 signal strength values for the received signals. For example, in some embodiments, the first wireless device may compute RSSI values for the one or more received signals. In some embodiments, other signal characteristics (phase, time information, etc.) may also be determined (e.g., in order to derive time-based values such as RTT, etc.)

Subsequently, location determination operations are performed at block 430 based on the determined signal strength values for the signals transmitted from the second wireless device, and on the antenna information for the one or more antennas of the second wireless device. As will be described in greater details below, the location determination operations may include, for example, generating heatmaps, determining a location according to a pre-determined heatmap (e.g., based on the computed signal strength value), performing multilateration procedures, etc. Data used for performing location determination operations may be adjusted according to received antenna information. For example, RSSI values may be adjusted according to antenna gain values, range values may be computed only for signals originating from nodes determined to have omnidirectional antennas, etc.

Figure 8:
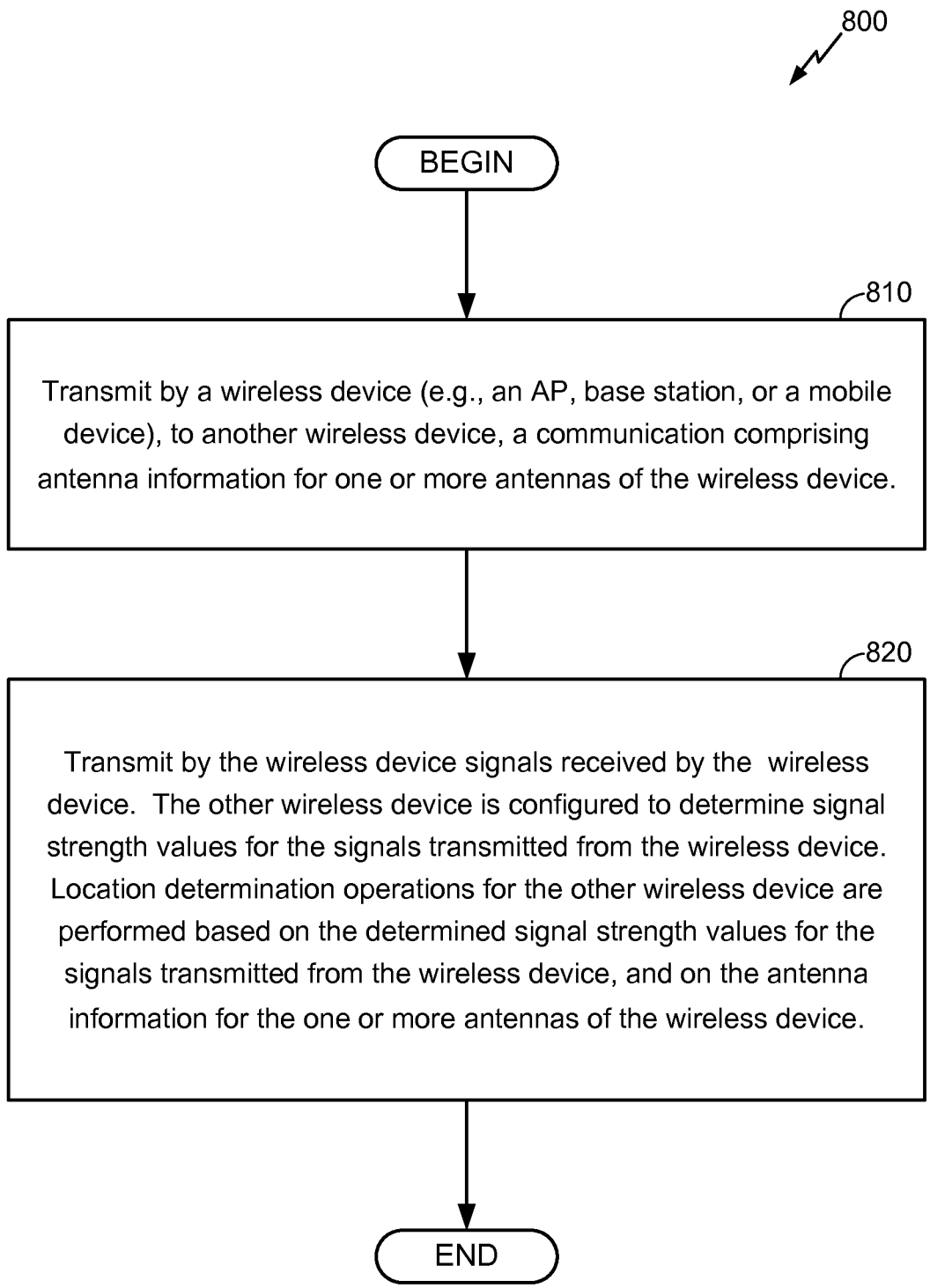
FIG. 8 is a flowchart of an example procedure to provide, by a wireless device to another wireless device, antenna information for the wireless device, in accordance with certain example implementations.

With reference now to FIG. 8, an example procedure 800 to provide, by a wireless device (such as an AP, base station, some other wireless node, or a mobile device) to another (second) wireless device, antenna information for the wireless device, is shown. The procedure 800 includes, in some embodiments, transmitting at block 810 to the other wireless device (e.g., a device such as the wireless device 610 of FIG. 6A, where the other device may be a personal mobile device or a network node), by the wireless device (e.g., the device 612 of FIG. 6A, which may also be a personal mobile device or a network node), a communication comprising antenna information for one or more antennas of the wireless device. The antenna information may include, for example, the antenna information included with the antenna information element 560 of the broadcast message 500 (as depicted in FIG. 5), or the antenna information element 680 of the FTM messages 650 or 700 (as depicted in FIGS. 6B and 7).

The procedure 800 may also include transmitting at block 820 by the wireless device (or by some other device with respect to which antenna information was provided) signals (e.g., control or data signals) that are received by the other wireless device. Having received the antenna information and the signals from the transmitting wireless device, the other wireless device is configured to determine signal strength values (e.g., RSSI values) for the signals transmitted from the wireless device. As more particularly described herein, location determination operations for the other wireless device may be performed based on the determined signal strength values for the signals transmitted from the wireless device, and based on the antenna information for the one or more antennas of the wireless device.

Collecting and Managing Antenna Information

In some embodiments, antenna information for multiple wireless device (personal mobile device and/or network nodes) may be stored at a data repository (e.g., implemented as a central server repository, or as a distributed system), and disseminated to wireless devices either in response to a specific request, or in the course of periodical unsolicited dissemination.

In some embodiments, collection of antenna information may be implemented through collecting crowd-source information from multiple wireless devices configured to receive messages from network nodes (e.g., WLAN or WWAN access points) and to communicate with a remote device (e.g., the server 110 of FIG. 1, although other remote devices may be used) to transmit collected antenna information, as well as other data, such as various measurements performed by the collecting wireless device, to the remote device. The remote device is configured to receive antenna information collected by multiple wireless devices for multiple network nodes with which the multiple wireless devices communicated, and to store the information in a database-like structure (a repository of crowd-source antenna information and other types of data). The data collected may then be communicated to wireless devices, e.g., as assistance data. For example, a mobile device entering an area served by a network node (e.g., any of the nodes 104a-c, or 106a-e depicted in FIG. 1) may request or automatically receive (e.g., upon establishment of a communication link with the network node) assistance data from the remote device (or from an intermediary device that earlier received the assistance data). The assistance data may include local maps, heatmaps, and, in some embodiments, antenna information for the particular network node serving the area currently being visited by the mobile device.

Figure 9:
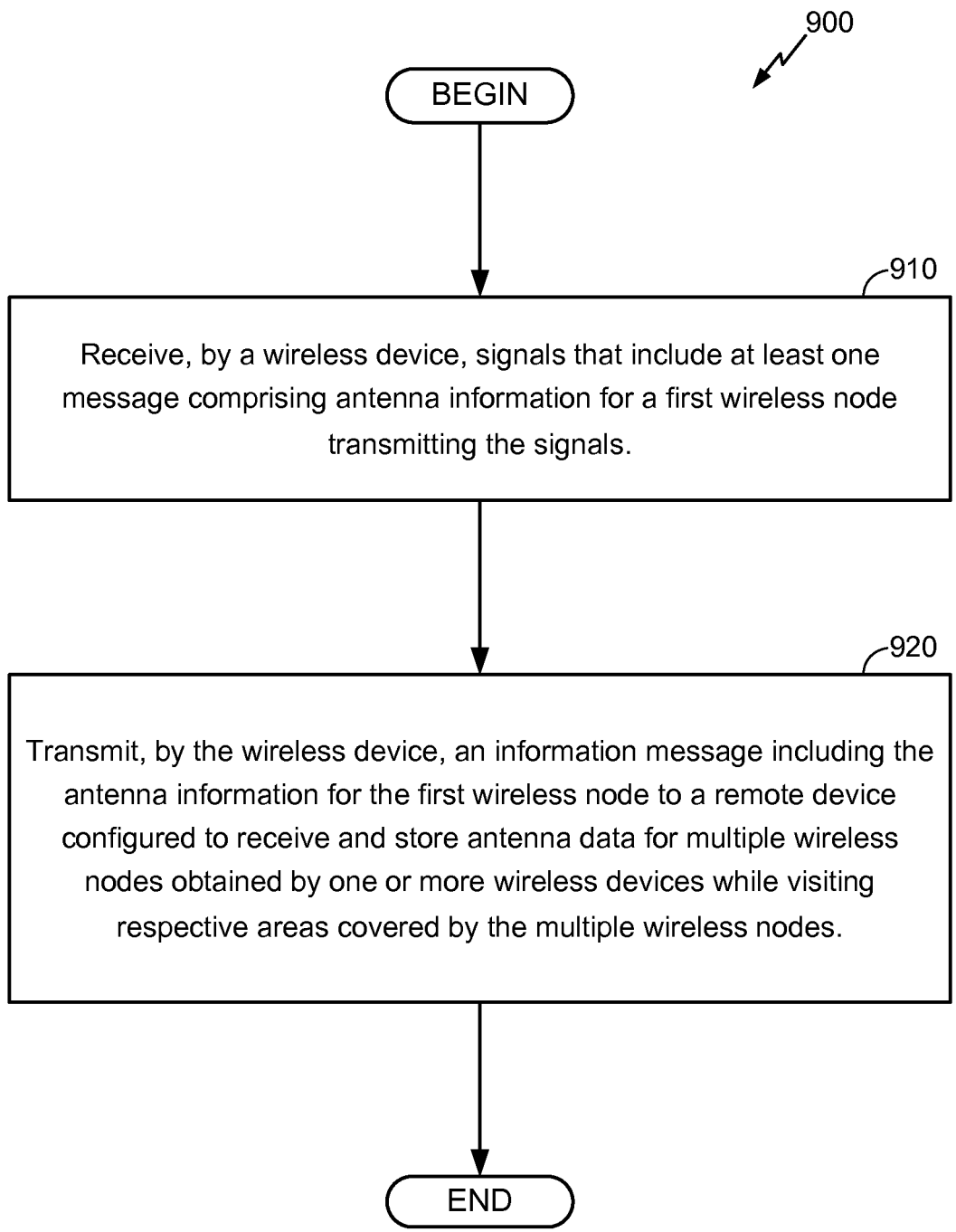
FIG. 9 is a flowchart of an example procedure to collect crowd-sourced-based antenna information, in accordance with certain example implementations.

Thus, with reference to FIG. 9, a flowchart of an example procedure 900 for collecting crowd-sourced-based antenna information is shown. The procedure 900 includes receiving at block 910, by a wireless device, e.g., a personal mobile device such as the wireless device 108 or 200 of FIGS. 1 and 2, signals that include at least one message comprising antenna information for a first wireless node transmitter, e.g., any of the nodes 104a-c or 106a-e of FIG. 1, that is transmitting the signals (control or data signals). As noted, in some embodiments, the at least one message that includes antenna information may include a broadcast message, such as the broadcast message 500 illustrated in FIG. 5 which is a beacon signal configured, for example, according to IEEE 802.11 standard, and includes in the frame body portion of the beacon frame an antenna information element with data pertaining to the behavior and characteristics (e.g., gain pattern, antenna orientation, number and configuration of the antennas, antenna type, etc.) of the antenna(s) of the transmitting node. In some embodiments, the at least one message may be a reply message directed/addressed to the mobile device, e.g., a message configured under a protocol such as the fine timing measurement (FTM) protocol discussed herein. Other types of messaging transmissions may also be used to provide antenna information for the transmitting node to one or more wireless devices that are in communication therewith. The antenna information provided by the transmitting node may be stored locally at a memory module of the transmitting node, and periodically adjusted to reflect changes to adjustable antenna parameters of the node's antennas. For example, periodically, the antennas being used (where the node includes multiple antennas) may change, or the spatial orientation of the antenna(s) may change, thus causing a commensurate change to such antenna parameters as the gain pattern, antenna diversity parameters, etc. Initial antenna information may have been stored at the transmitting node at the time of manufacture or at the time the node was deployed and activated. Alternatively, initial and/or subsequent antenna information may be retrieved from a remote device (e.g., a server maintained by the node's manufacturer current operator). In some embodiments, the antenna information included in the antenna information element potion of the at least one message may include, for example, one or more of antenna type information, antenna gain pattern, antenna orientation, antenna identification, antenna model data, antenna diversity, beam control data, maximum gain for the antenna, transmission power, and/or any combination thereof.

The receiving wireless device may receive the at least message upon entering a geographical area covered/served by the transmitting node communicating the at least one message. For example, in situations where antenna information is transmitted via broadcast messages, the receiving wireless device will receive the information when it comes within range of the broadcast messages. In situations where antenna information is conveyed after first establishing a communication link, the receiving device may initiate communication with the transmitting node in response to determining that it is located within range of the transmitting node (as determined through various location determination procedures, and/or based on assistance data identifying the transmitting nodes operating at various locations), or in response to receipt of broadcast beacon data indicating the presence and identity of the transmitting node (but not including the antenna information with such beacon data).

Subsequent to receiving the antenna information from the transmitting node, an information message that includes the antenna information for the first wireless node may be transmitted at block 920 by the mobile device to a remote device configured to receive and store antenna data for multiple wireless nodes, with such antenna data having been obtained by one or more wireless devices while visiting respective areas covered by the multiple wireless nodes. In some embodiments, the remote device may be configured similarly to the remote server 110 depicted in FIG. 1, and may implement a central repository (possibly with other interconnected devices) to store and manage data collected by multiple devices, e.g., arrange received information in data records that are then stored in the central repository and can be retrieved in response to a request or query from some device. In some embodiments, at least some of the data stored and managed at the remote device(s) implementing the central repository may have been obtained from other sources, such as a remote server of the manufacturer or operator of the wireless nodes with respect to which information is being collected. In those situations, the remote device implementing the central repository may receive data for one or more wireless nodes that includes the nodes' antenna information, identifying information for the nodes, location information for the nodes, etc.

As noted, in some embodiments, the information message sent by the wireless device that received the antenna information from the transmitting wireless node may also include other information that can then be stored in the central repository and be associated with the antenna information. Such information may include, for example, location data (coarse or more precise location data) determined based on one or more location determination processes performed either by the wireless device, the wireless node, or some other device. Such location determination processes may include multilateration-based procedures and/or optimization procedures that are based on signals from a satellite-positioning system and/or terrestrial nodes, location determination from heatmaps (which may also take into account the antenna information obtained by the wireless device, as more particularly described herein), location determined based on the identity and location of the transmitting node (such information may be included in the signals received from the transmitting wireless node), location determined based on assistance data received from some remote device (which may be the same or different from the remote device to which the information message with the antenna information is transmitted by the wireless device), etc. Additional information that may be included with an information message transmitted by the wireless device may include sensor data (raw or processed) measured by one or more sensors (which may be similar to any of the sensors 212a-g and/or the transmitters or receivers 204, 206, and 208 schematically depicted in FIG. 2), and may thus include signal strength values corresponding to the signals received from the transmitting node communicating with the wireless device, inertial sensor measurement, environmental sensor data (temperature, pressure, humidity, optical data, audio data, etc.), and any other sensor data that can be measured or received by the wireless device transmitting the information message. As described herein, the additional data included in the information message transmitted to the remote device (for storage and maintenance at the remote device) may be used to infer antenna information for a transmitting node for which antenna information in not otherwise available by matching available input data (e.g., location information, sensor measurements data from wireless, etc.) to values stored in records stored in the remote central repository device. Data records that include data that is similar to the available data collected by the mobile wireless device may be associated with antenna information (for other, different, wireless nodes), and thus, based on the data records identified (matching the available input data), inferences or estimates may be made or derived about possible antenna attributes for the node or device that is communicating with the mobile device collecting the available information.

The crowd-sourced data, collected through multiple wireless devices that collect antenna data for one or more wireless nodes, and then transmitted to a remote device implementing a repository, can be used to generate assistance data to provide to a requesting wireless device (which may be the same or different from the wireless device described in relation to FIG. 9). For example, in situations where the requesting wireless device (e.g., a personal mobile device) enters, or is about to enter, an area covered by a particular wireless node (e.g., a WLAN or a WWAN node), assistance data that includes antenna information for the particular wireless node (that antenna information may have previously been collected, and populated into the central repository, through the crowd-sourcing processes described herein, or through other processes) may be sent from the remote device (implementing the central repository) to the requesting wireless device. For example, the requesting device may have a coarse estimate of its location, or some other information indicative of its location (e.g., from a previous SPS-based determined location, from a location estimate derived based on measurements from its on-board inertial sensors, etc.) and/or of the identities of the wireless nodes in its vicinity. The requesting device may thus contact the remote device implementing the central repository (e.g., directly via a wireless or non-wireless connection, or indirectly via one of the wireless nodes with which the requesting device can communicate) and request antenna information associated with its estimated location or with the known identity of the wireless node with respect to which the antenna information is being requested. The central repository is configured to search its records based, for example, on the location or identity information (or some other type of information) provided, and to identify and retrieve one or more records matching the information provided. The antenna information retrieved can then be sent, along with other assistance data (e.g., map data, heatmaps, etc.) to the requesting wireless device. Thus, in such embodiments, transmission of antenna information via broadcast message or through message exchanges with the wireless nodes (e.g., via a protocol such as FTM) may not be necessary. Accordingly, procedures to obtain assistance data that includes antenna information for a transmitting node with which a mobile device is communicating, or is about to communicate, include receiving by the mobile device, from the remote device implementing the central repository, assistance data comprising data regarding an antenna for a second wireless node (the assistance data being selected from the stored multiple antenna information for the multiple wireless nodes) when the mobile device is located in an area served by the second wireless node. Such procedures may further include determining positioning information for the mobile device based, at least in part, on the data regarding the antenna for the second wireless node.

Figure 10:
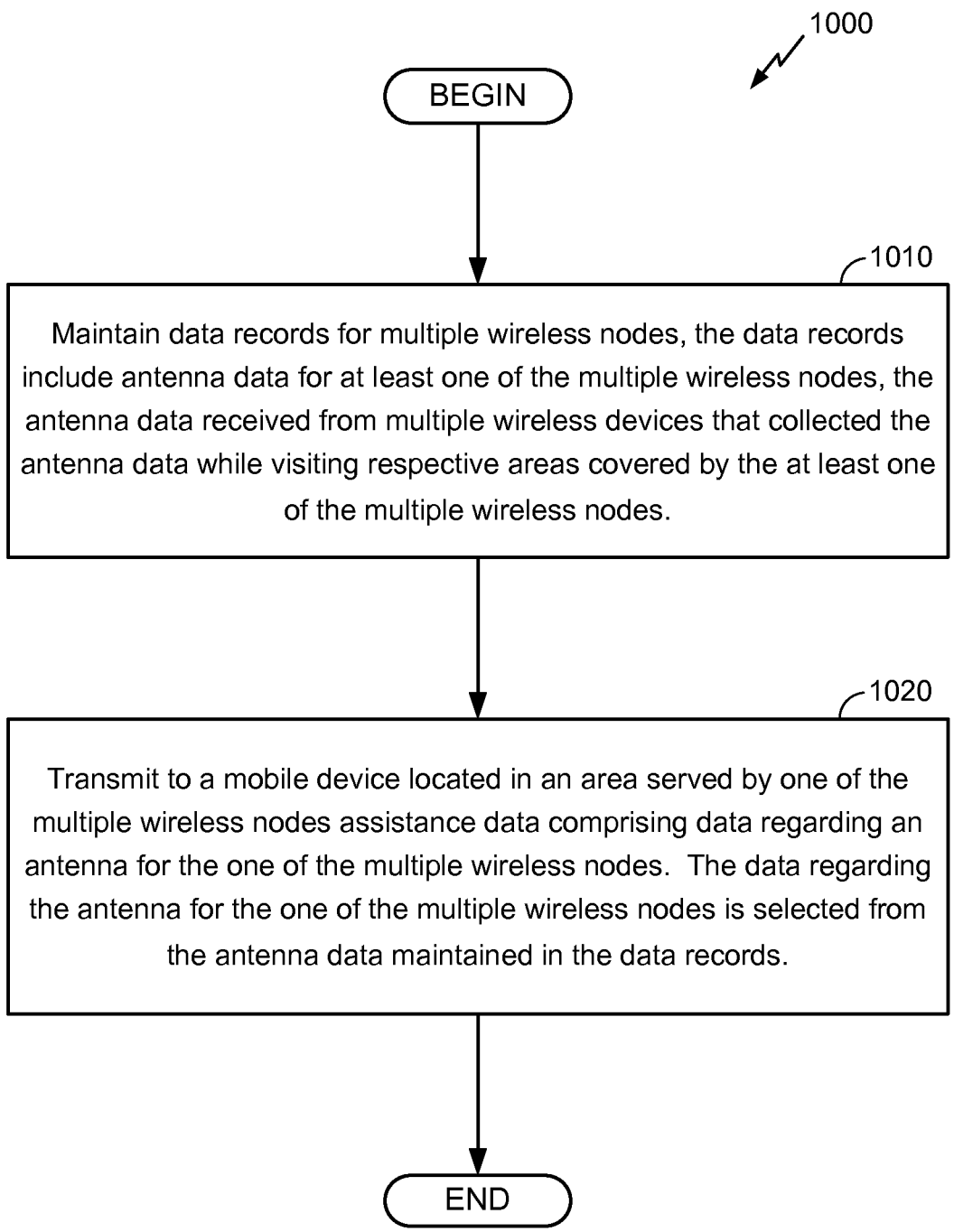
FIG. 10 is a flowchart of an example procedure to maintain crowd-source information, including antenna information, collected by multiple wireless devices, in accordance with certain example implementations.

With reference to FIG. 10, a flowchart of an example procedure 1000, generally performed by a remote device such as a central server (e.g., a server like the server 110 of FIG. 1), to receive and maintain crowd-source information, including antenna information, collected by multiple wireless devices is shown. The procedure 1000 includes maintaining at block 1010 data records (e.g., at a central repository, using an application to store, manage, and retrieve data) for multiple wireless nodes. The data records include antenna data for at least one of the multiple wireless nodes received from multiple wireless devices that collected the antenna data while visiting respective areas covered by the at least one of the multiple wireless nodes. The example procedure 1000 also includes transmitting at block 1020 to a mobile device located in an area served by one of the multiple wireless nodes assistance data comprising data regarding an antenna for the one of the multiple wireless nodes. The data regarding the antenna for the one of the multiple wireless nodes is selected from the antenna data maintained in the data records.

Determining and/or Verifying Antenna Information

In some situations, some, but not all, of the antenna information for a particular wireless device (e.g., a wireless node such as an access point, or a mobile wireless device) may be known. For example, in some embodiments, the antenna type and/or model may be known for the antennas of the particular wireless device, but the antenna direction (i.e., the direction at which the antenna(s) is pointing, and thus the direction at which the beam is propagating) may not be known. In this example, the direction at which of the antenna is pointing may have been adjusted manually by the user, and the specific resulting spatial orientation of the antenna may not have been recorded as data that can be transmitted, or may not be easily ascertained (e.g., if the user, or the wireless node lacks the instrumentation needed to express the resulting orientation through some conventional coordinate system). Thus, as described herein, in some embodiments, measurements performed by a wireless device on signals/communications received from a wireless node can be used to derive missing antenna information, or to ascertain/verify known antenna information.

Figure 11:
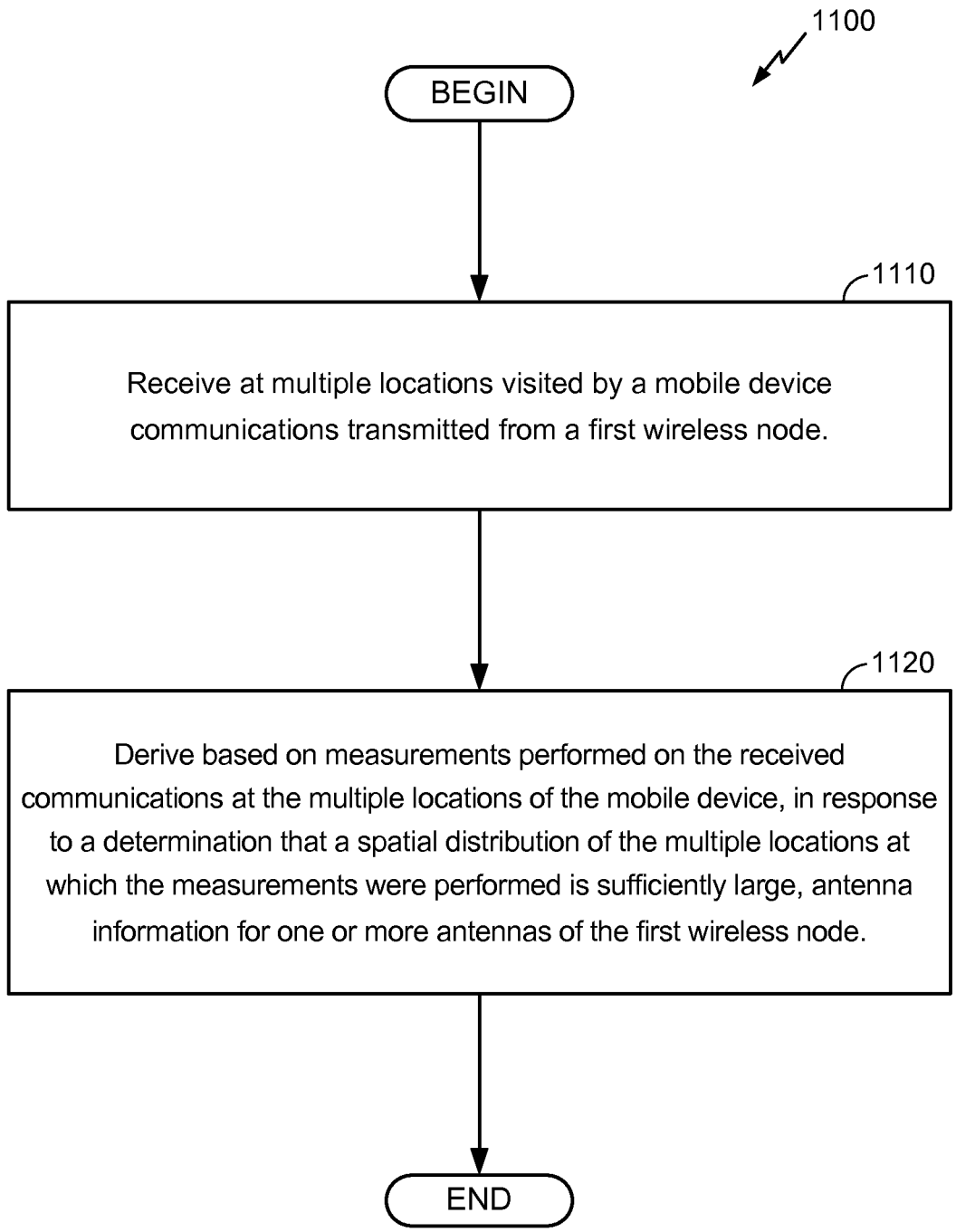
FIG. 11 is a flowchart of an example procedure to determine antenna information for an antenna(s) of a wireless node, in accordance with certain example implementations.
Figure 12:
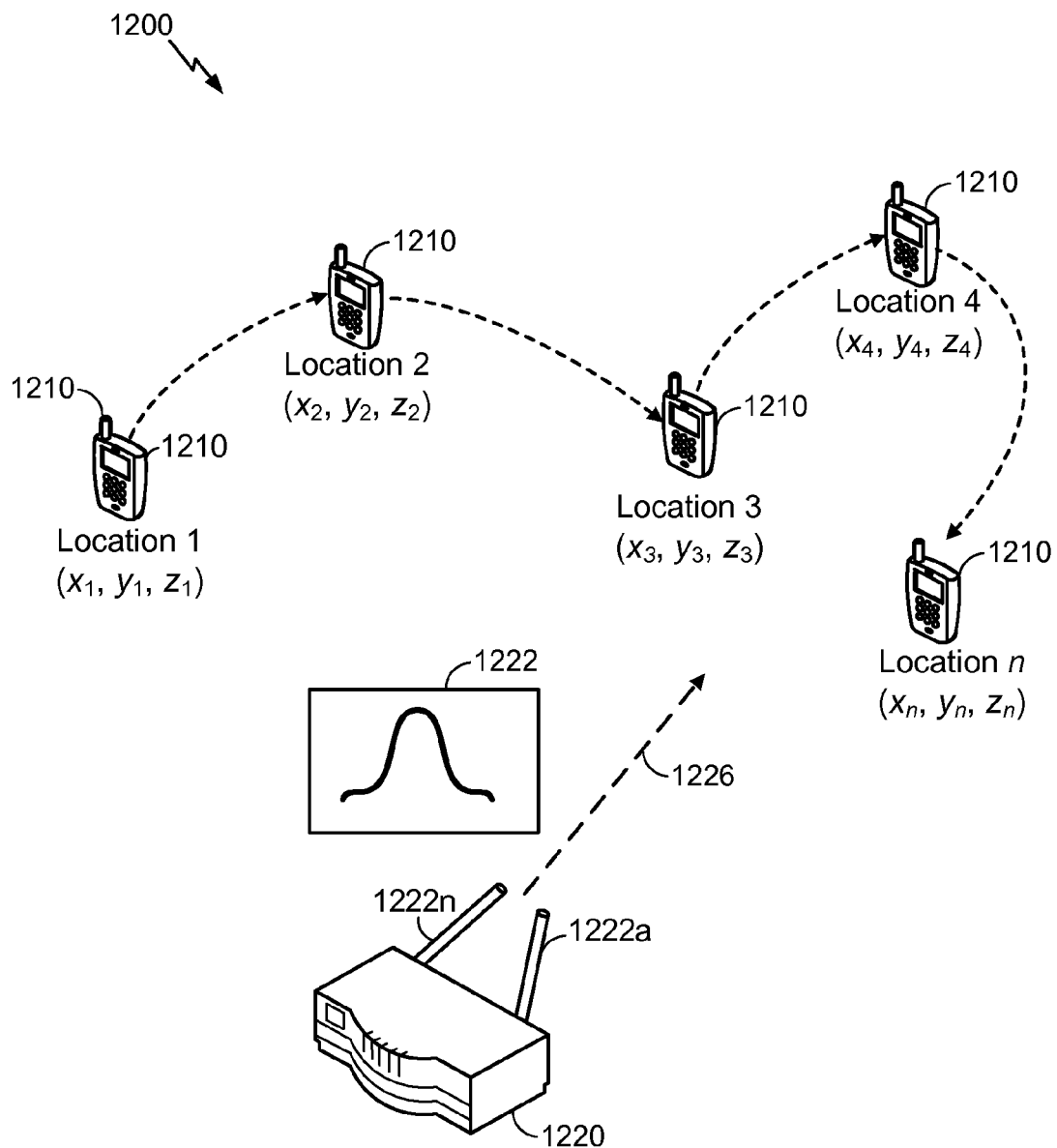
FIG. 12 is a schematic diagram of a system, comprising a mobile device performing measurements on signals from a wireless node, configured to determine antenna orientation for the node's antenna, in accordance with certain example implementations.

With reference to FIG. 11, a flowchart of an example procedure 1100 to determine antenna information for an antenna(s) of a wireless node is shown. Illustration of the embodiments of the procedure 1100 will also be provided with reference to FIG. 12, showing a schematic diagram of a system 1200, comprising a mobile device 1210 performing measurements at multiple locations (shown as locations 1, 2, 3, 4, . . . , n) on signals received from a wireless node 1220, to determine antenna information such as antenna orientation for the node's antenna(s). Thus, the procedure 1100 includes receiving at block 1110 at multiple locations visited by a mobile device (such as the mobile device 1210 of FIG. 12, which may be similar to any of the mobile devices 108, 200, and 610 discusses in relation to FIGS. 1, 2, and 6A) communications transmitted from a first wireless node (which may be similar to, in configuration and functionality, any of the wireless nodes 104a-c, 106a-e, 300, etc., discussed herein). The received communications may be data and voice-based communications, transmitted according to any number of available communication protocols and technologies, control frames (e.g., beacon frames) that are broadcast to multiple receiving devices or that are transmitted to specific individual devices, etc. The wireless node transmitting the communications may include one or more antennas that are arranged in a spatial and/or logical configuration (e.g., one or more of the antennas may be activated, pointed at a particular direction, and may transmit signals at particular power and phase) to cause the electromagnetic transmissions that can be characterized or represented according to an associated direction and associated gain pattern. An example configuration of antennas 1222a-n (for the purpose of illustration, only two antennas are shown, but any number of antennas may be used) for the wireless node 1220, and an example gain pattern 1224 associated with that configuration (the patterns is intended for illustration purposes only, and does not necessarily represents the actual pattern associated with the illustrated antenna configuration of FIG. 12) is shown. The example beam radiates at a direction 1226 that is based, in part, on the direction of the example antenna configuration for the antennas 1222 (but may also be based on such factors as control parameters for the operation of the antennas, including power and phase of signals to be transmitted). In some embodiments, the gain pattern may be represented as pre-determined data that can be provided to the wireless device 1210, e.g., as assistance data provided by a remote repository server, or in messages including antenna information that are communicated by the wireless node 1220.

As further illustrated in FIG. 12, the mobile wireless device 1210 is moved around to several locations (numbered 1, 2, . . . , N in FIG. 12) at which it receives communications from the wireless node 1220, and performs measurements, such as signal strength measurements (e.g., RSSI), for at least some of the received communications (measurements of signal timing information and/or other signal attributes may also be performed). In some embodiments, the measurements may be normalized, e.g., so that the values correspond to signal strength at some uniform or standard distance to the wireless node. For example, because the location of the wireless node is known, and the locations (or estimates thereof) at which the measurements taken by the measuring device are also known (or can be determined), the distances from the locations at which the measurements were performed to the wireless node can be computed, and the measurements can then be mapped or converted to the estimated signal strength value at some uniform (normalized) distance.

In situations involving antenna configurations resulting in directional electromagnetic transmissions (i.e., non-omnidirectional transmissions), measurements of signal strength taken at different locations relative to the wireless node will generally correlate to the antenna gain pattern associated with the particular configuration and characteristics of the node's antennas and on the direction of the antenna. Thus, based on the antenna gain pattern, or on the known antenna type/model (which may be associated with a particular gain pattern), and based on the measurements performed for by the mobile wireless device 1210, the direction of the antenna (and the direction of the electromagnetic beam) may be derived. The degree or level of confidence/certainty in the derived direction of the node's antenna(s) will generally depend on the number of measurements taken and/or spatial distribution or range over which the measurements were taken. Accordingly, derivation of an estimate of the antenna direction based on known characteristics of an antenna (type, model, gain pattern, etc.) and signal strength measurements may be performed in response to a determination that the measurement performed by the wireless device were made over a large enough spatial/geometric distribution (i.e., from a sufficient number of directions relative to the wireless node).

Thus, the procedure 1100 includes deriving at block 1120 based on measurements performed on the received communications at the multiple locations of the mobile device, in response to a determination that a spatial distribution of the multiple locations at which the measurements were performed is sufficiently large, orientation data for one or more antennas of the first wireless node. In some embodiments, the determination of whether a number of directions (corresponding to the multiple locations at which the communications from the wireless node were received at the mobile device) exceeds a pre-determined direction number threshold may include determining that the number of the directions exceeds the pre-determined direction number threshold based on computation of a horizontal dilution of propagation (HDOP) value derived, at least in part, from the communications received from the first wireless node. The derived HDOP value may be used to represent a measure of quality of a spatial/geometric distribution of the locations visited by the mobile wireless device relative to the transmitting wireless node. Adequate spatial distribution of locations of the mobile device (corresponding to sufficient number of directions relative to the node) may be represented as an HDOP metric that is, for example, lower than some HDOP threshold.

In some embodiments, HDOP (and/or other like measures of quality of a geometric distribution of signal measurements taken at multiple locations by a mobile device for communications received from a wireless node) may be classified as "low," "medium," or "high" according to the following example formulation of HDOP(h): Qualitative Uncertainty Metric: Quantitative Uncertainty Metric (in meters) $h<=1.5$ corresponds to low, $1.5<h<=2.5$ corresponds to medium, and $h>2.5$ corresponds high. Once spatial distribution (also representative of location uncertainty) is quantified as a HDOP metric (or as some other metric), the mobile wireless device (e.g., the device 1210 in the example of FIG. 12) may determine that additional measurements may be necessary in order to determine the direction of the antenna(s) of the transmitting wireless node (e.g., the node 1220 of the example of FIG. 12). In some embodiments, an insufficient HDOP value (e.g., below a required threshold) may result in a message being sent to the wireless node to adjust antenna parameters to enable more accurate measurements to be performed by the mobile device. For example, the mobile device may, in response to a computed HDOP metric (or some other metric) being lower than the corresponding threshold, transmit a message to the wireless node to increase transmission power of the node's antenna(s).

In some embodiments, derivation of an HDOP value to measure the spatial distribution of communications received from a wireless node with a known location (X, Y, Z) may be performed as follows. At every location at which signal measurements of the communications from the wireless node are taken by the mobile wireless device, the device's position/location when taking the measurements is determined. As described herein, location determination may be performed based on any number of location determination processes/techniques, including, for example, multilateration-based procedures using signals from a satellite-positioning system and/or terrestrial nodes, optimization-based procedures (e.g., least-squares, Kalman filtering, etc.) location determination using heatmaps (the heatmap, optimization, and multilateration-based techniques may take into account the antenna information obtained by the mobile wireless device), location determined based on the identity and location of the transmitting wireless node (such information may be included in the signals received from the transmitting wireless node), location determined based on assistance data received from some remote device, etc. The coordinates of the mobile device's location at the time that signal measurements of the communications sent from the wireless node may be expressed as $(x_i, y_i, z_i)$, with $i=1, 2, 3, \ldots, N$. The HDOP metric may then be computed, in some embodiments, according to the example process that includes the following example computation operations:

$$LOS_i = \begin{bmatrix} \dfrac{x_i - X}{\sqrt{(x_i - X)^2 + (y_i - Y)^2 + (z_i - Z)^2}} \\ \dfrac{y_i - Y}{\sqrt{(x_i - X)^2 + (y_i - Y)^2 + (z_i - Z)^2}} \\ \dfrac{z_i - Z}{\sqrt{(x_i - X)^2 + (y_i - Y)^2 + (z_i - Z)^2}} \end{bmatrix}$$

$$A = \begin{bmatrix} LOS_1 \\ \vdots \\ LOS_N \end{bmatrix}$$

$$Q = (A^T A)^{-1} = \begin{bmatrix} d_x^2 & d_{xy}^2 & d_{xz}^2 \\ d_{yx}^2 & d_y^2 & d_{yz}^2 \\ d_{zx}^2 & d_{zy}^2 & d_z^2 \end{bmatrix}$$

$$HDOP = \sqrt{d_x^2 + d_y^2}$$

Other processes for computing HDOP, or for computing some other metric representative of spatial/geometric distribution of measurements of communications from a transmitting wireless node may be used in addition to, or instead of, the above-described process to compute HDOP.

Upon a determination that the spatial/geometric distribution of the measurement is sufficiently large (i.e., the measurements were taken from a large enough number of directions relative to the transmitting wireless node), the measurements (e.g., signal strength value measurements) may be used to produce a corresponding measured antenna gain pattern representative of the expected relative received signal power (e.g., as a function of the angular position (or some other positional and/or temporal dependence) with respect to the transmitting wireless node). In implementations in which the determination of whether the spatial/geometric distribution of measurements is adequate is based on HDOP metric, the determination includes deriving an HDOP metric (e.g., as described herein), and comparing the derived/computed HDOP metric to a pre-determined HDOP threshold. In some embodiments, the spatial distribution of measurements is deemed to be adequate when the derived HDOP metric is higher than the pre-determined HDOP threshold. The produced measured gain pattern, computed from signal strength measurements of the communications received from the transmitting wireless node (e.g., the node 1220 of the example FIG. 12) can be matched to the theoretical gain pattern, which may have been provided by the transmitting wireless node, or which may have been retrieved from some remote device based on the known antenna type or model of the wireless node. The antenna gain pattern will generally represent the gain pattern for a particular antenna configuration and a particular antenna direction. Thus, the rotational angle needed to rotate/shift the measured antenna gain pattern so that it would match (e.g., be congruent with) the theoretical or provided antenna gain pattern could provide the current actual direction of the antenna of the wireless node.

In some embodiments, the antenna information, such as the antenna type or model, or gain pattern (based on which the actual antenna orientation can be determined), may be provided to the mobile device by, for example, including the antenna information in a broadcast message (e.g., a beacon frame formatted according to IEEE 802.11 standard), in an FTM-type message, in assistance data sent to the mobile device from a remote mobile device (e.g., implementing a central repository of antenna information for multiple wireless nodes), etc. As noted, information pertaining to antenna(s) of a wireless node may be collected, or determined, by individual mobile devices in communication with the wireless node, and the antenna information so collected or determined may be transmitted to a remote device configured to collect and maintain antenna data for multiple wireless nodes (or other devices) that it receives from multiple device (e.g., individual mobile devices). Thus, in some embodiments, the mobile device 1210 of FIG. 12 may be configured, upon determination of the antenna orientation of the antenna(s) of the wireless node it received communications from, to transmit an information message that includes the antenna orientation for the transmitting wireless node to a remote device (e.g., such as the server 110 of FIG. 1) configured to receive and store antenna data (for multiple wireless nodes) obtained by one or more wireless devices while visiting respective areas covered by the multiple wireless nodes. The remote device is configured to store the derived antenna orientation data (included in the information message received from the mobile device) for the antenna(s) of the wireless node for which the mobile device obtained or determined the antenna orientation, associate the stored derived antenna orientation data for that wireless node with other information for that wireless node, and, in some embodiments, include a trust indicator, associated with the derived antenna orientation and the other information for the first wireless node, indicating increased trust in assistance data for that wireless node. Thus, the inclusion of antenna orientation, determined by the mobile device according, for example, to the processes/techniques described herein, can increase the confidence in the accuracy of the antenna information (e.g., the antenna model, type, maximum gain, gain pattern, etc.) for the wireless node in question. The increased confidence may be used, for example, in subsequent selection of antenna information records to be provided as assistance data to one or more wireless devices. For example, records that are associated with a trust indicator, or that are associated with a higher degree of trust value, may be preferentially selected over records that lack such an indicator or that have a reduced degree of trust value.

In some embodiments, the measurements performed by a mobile device may be used to determine or confirm certain antenna information, such as the antenna type or model. For example, the gain pattern for a particular wireless node may be determined by collecting measurements (e.g., signal strength measurements, RTT measurements, etc.) for communications sent by the particular wireless node and received by one or more mobile devices. As described herein, the measurements taken can be normalized (based on the known location of the wireless node and determined locations of the mobile device(s) at which the measurements are taken) so that computed values correspond to a uniform distance from the wireless node. The normalized measurements would then correspond to a gain pattern associated the antennas of the wireless node. A determination may next be made as to whether the measurements were taken at locations corresponding to a sufficient number of directions relative to the wireless node (i.e., that the spatial/geometric distribution of the locations at which the measurements were performed is adequate). For example, as described herein, a spatial distribution metric such as HDOP may be derived. In situations where the model or type of antenna is to be verified/confirmed, if it is determined that the spatial/geometric distribution is adequate, a determination may be made as to whether the determined gain pattern matches a gain pattern associated with the unconfirmed antenna type or model of the wireless node. For example, the normalized measured gain pattern can be compared to the gain pattern (which may be provided in normalized form) associated with the unconfirmed antenna type or model of the node to determine if the two gain patterns match (angular offsets can be removed by rotating one pattern relative to the other). When the antenna model, antenna type, or gain pattern for a wireless node are not known, the measured gain pattern can be used to search a database of a plurality of pre-determined known gain patterns, and to identify from the plurality of pre-determined gain patterns a pattern matching the measured gain pattern. The identified pre-determined gain pattern is generally associated with an antenna type or model (and with other relevant antenna information), and thus the antenna type or model for the particular wireless node may be inferred/determined based on the measured antenna gain pattern.

Figure 13:
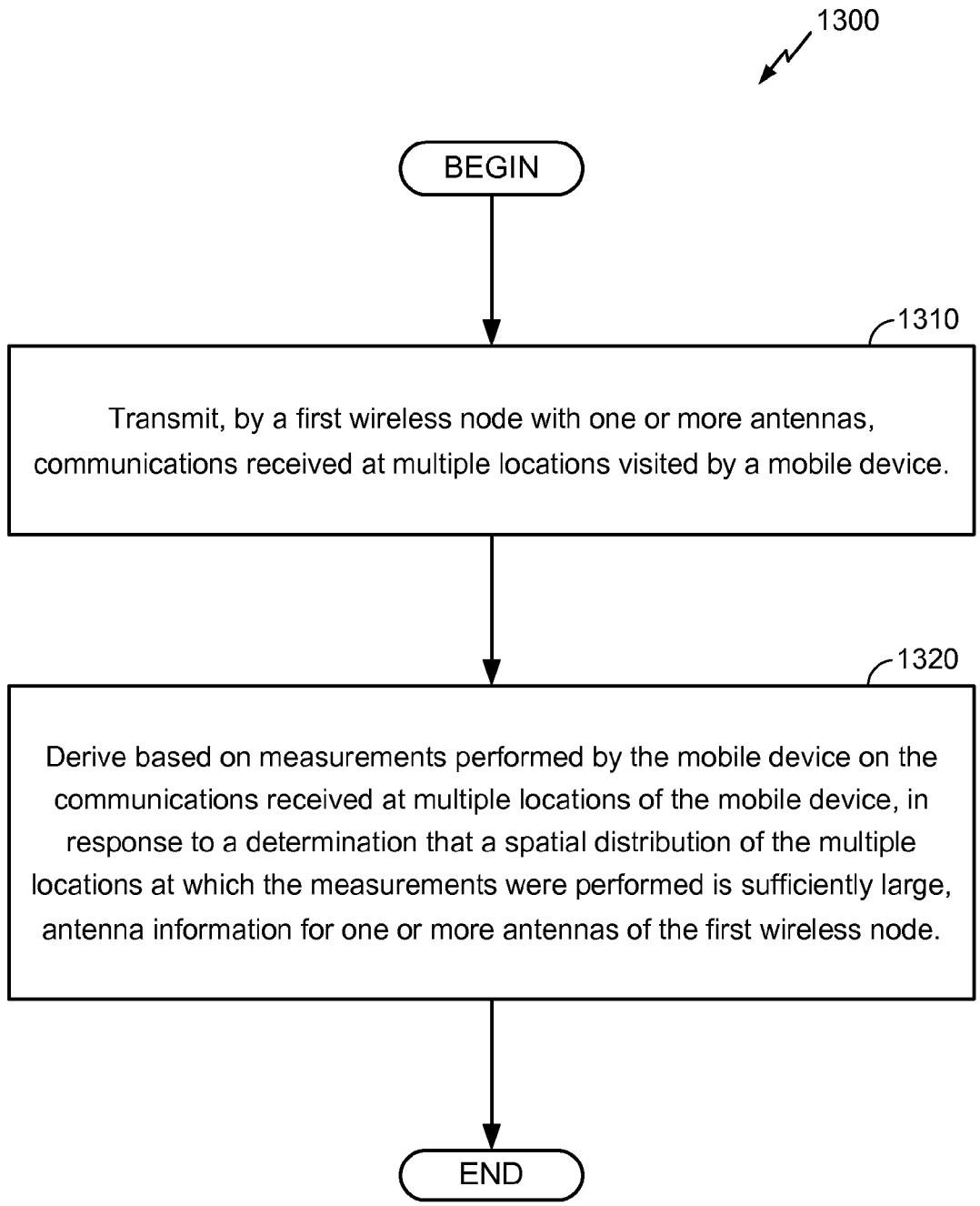
FIG. 13 is a flowchart of an example procedure to facilitate verification and/or determination of antenna information for a wireless node, in accordance with certain example implementations.

With reference now to FIG. 13, a flowchart of an example procedure 1300, generally performed at a first wireless node, to facilitate verification and/or determination of antenna information for the wireless node, is shown. The procedure 1300 includes transmitting at block 1310, by a first wireless node with one or more antennas, communications received at multiple locations visited by a mobile device. The procedure 1300 further includes deriving at block 1320 based on measurements performed by the mobile device on the communications received at multiple locations of the mobile device, and in response to a determination that a spatial distribution of the multiple locations at which the measurements were performed is sufficiently large (e.g., based on computation of a metric such as HDOP), antenna information (e.g., antenna orientation, antenna type or model, etc.) for the one or more antennas of the first wireless node.

Determining Missing Antenna Information for a Wireless Node

Under some circumstances, some antenna information for a wireless node (such as any of the access points or base stations schematically depicted in FIG. 1) may be known, while other information may not be available. For example, the antenna model number or antenna type for a particular wireless node may be known (or can be ascertained, for example, from a central repository of information), but information such as antenna pattern, beamwidth, etc., may be missing and cannot be determined by referencing only the known information. In some situations, all antenna information (including antenna type or model) for a particular wireless node may be missing. Accordingly, in some implementations, the known/available information for a particular wireless node (be it partial antenna information, such as antenna type or model, or different type of information, such as location information) may be used to search information records for other, different, wireless devices or nodes, and to infer the antenna information missing for the particular wireless node from identified records that include at least some information common with information that is available for the particular wireless node.

Figure 14:
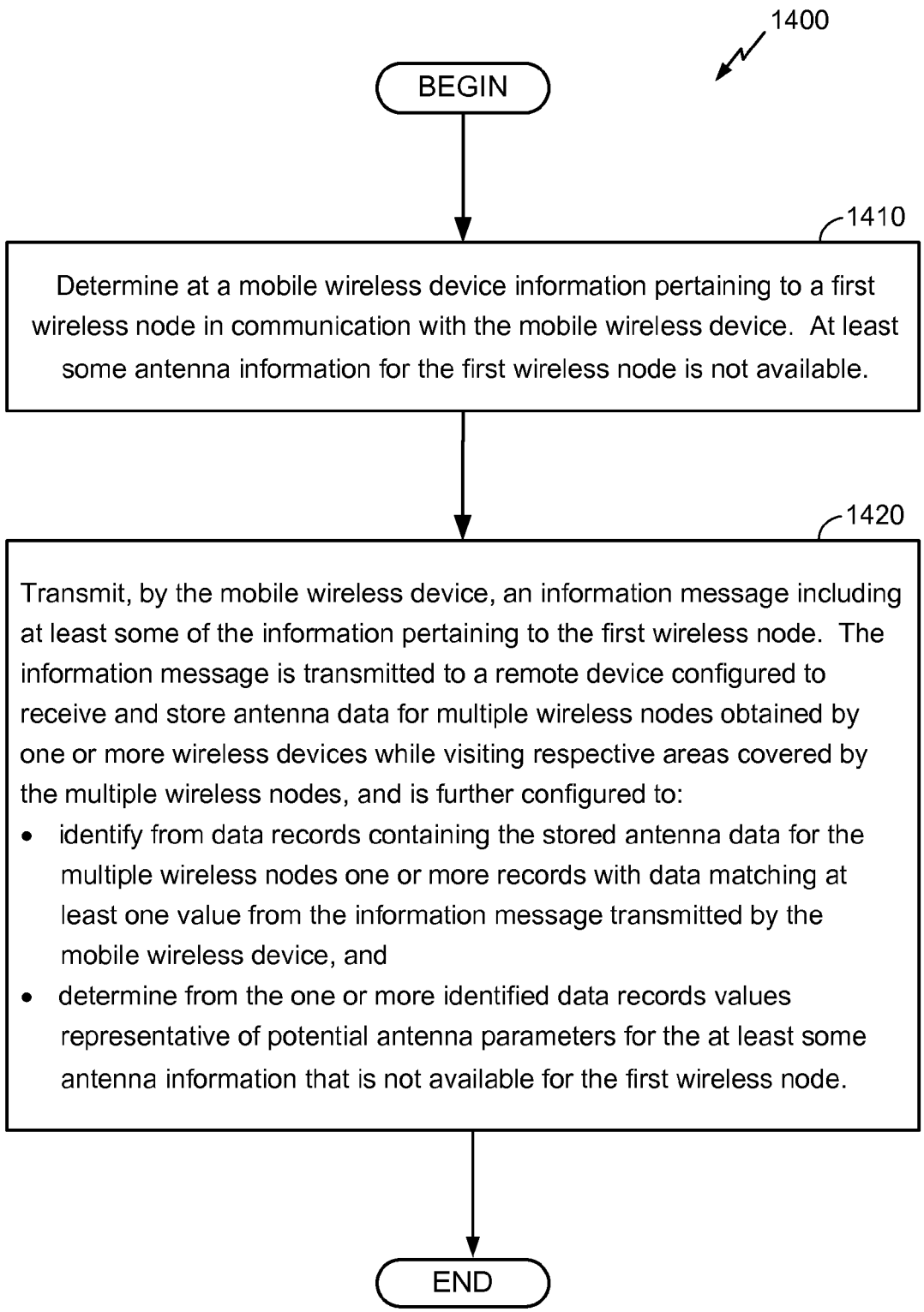
FIG. 14 is a flowchart for an example procedure to determine/infer missing antenna information for a first wireless node, in accordance with certain example implementations.

Thus, with reference to FIG. 14, a flowchart for an example procedure 1400 to determine/infer missing antenna information for a first wireless node, is shown. The procedure 1400 includes determining at block 1410 at a mobile wireless device (e.g., such as the personal mobile wireless device 108 depicted in FIG. 1) information pertaining to a first wireless node that is in communication with the mobile wireless device. The information pertaining to the first wireless node may include location information (coarse, or more precise location information), and possibly information such as antenna type or model for one or more antennas used by the first wireless node. Partial antenna information obtained for the first wireless node may be obtained by the mobile wireless devices by including such information in messages transmitted to the mobile wireless device (e.g., a broadcast message sent, for example, by the wireless node, a message sent as part of a message exchange protocol such as the FTM-protocol, an assistance data communication/message sent from a remote server, etc.) In the present example embodiments, at least some antenna information, e.g., antenna pattern, beamwidth, etc., for the first wireless node is not available.

In some embodiments, the mobile wireless device may determine/obtain the information pertaining to the transmitting first wireless node upon entering a geographical area covered/served by the wireless node. For example, as noted, in some situations the wireless node's information (e.g., its identity, location information for the node, partial antenna information such as transmit power, antenna model, and the like) may be obtained by the mobile wireless device via a broadcast message (e.g., IEEE 802.11 beacon frame) when it comes within range of broadcast messages transmitted by wireless node, or the mobile wireless device may initiate communication with the particular node in order to request information from the particular wireless node in response to determining that it located in an area covered by the particular wireless node.

With the information determined or obtained by the mobile wireless device, an information message including at least some of the information pertaining to the first wireless node may be transmitted at block 1420 by the mobile wireless device to a remote device (e.g., a remote server implementing a repository for wireless nodes data). The remote device is configured to receive and store antenna data for multiple wireless nodes obtained by one or more wireless devices while visiting respective areas covered by the multiple wireless nodes. As described herein, in some embodiments, at least some of the data stored and managed at the remote device(s) implementing the central repository may have been obtained through crowd sourcing techniques (i.e., from information collected by individual mobile devices' interaction with various ones of the multiple wireless nodes with respect to which data is maintained by the remote device/server), from other remote servers/sources (e.g., a remote server of the manufacturer or operator of the wireless nodes with respect to which data is being maintained), etc. In some embodiments, at least some of the data received in the information message (transmitted at block 1420) may be processed (e.g., parsed and/or used to generate additional data) and/or stored in the repository as new or existing records associated with the wireless node with respect to which the mobile device has sent the information message.

The data included in the information message that may be stored as new or existing records of the remote device may include location information for the mobile device that sent the information message, measured and/or processed sensor data obtained by one or more sensors of the mobile device (such sensors may be similar to any of the sensors 212a-g and/or the transmitters or receivers 204, 206, and 208 schematically depicted in FIG. 2), etc.

The remote device implementing a central repository of wireless node information for the multiple wireless nodes is further configured to, in some embodiments, identify from data records containing the stored antenna data for the multiple wireless nodes (such multiple wireless nodes may be different from the first wireless node) one or more records with data matching at least one value from the information message transmitted by the mobile wireless device, and to determine from the one or more identified data records values representative of potential antenna parameters for the first wireless node. Thus, the remote device is configured to infer missing antenna information for the antenna(s) of first wireless node from antenna information for other wireless nodes that share, or are associated with, information common to the first wireless node and the other nodes. That common information is information known (available) for the first wireless node.

An example of information available for the first wireless node that may be used to infer antenna parameters for the first wireless node based on the known antenna parameters for other wireless nodes is location information or a service set identifier (SSID) information. For instance, if the first wireless node is part of a multi-node network (e.g., operated in a particular indoor area by a particular entity), it may be a reasonable assumption to make that the nodes (and thus their antennas) operating in the particular indoor location are similar (in configuration, implementation, and/or functionality) so that there is a consistent level of performance by all the nodes of the network. Accordingly, if the SSID information, or coarse location, for the first wireless node is known, but antenna information for that node is not known, the SSID or coarse location may be obtained/determined by the mobile wireless node interacting with the first wireless node, and provided (via an information message) to a remote server implementing a repository. The remote server may then identify all data records for wireless nodes that are associated with the same SSID or coarse (or more exact) location estimate for the first wireless node and/or the mobile wireless device. The antenna information (and other types of information), including, for example, the antenna type, model, antenna gain pattern, antenna configuration, and all germane antenna information, may be extracted from the identified records sharing the information common with the information that was available for the first wireless node. Based on the antenna information extracted from the identified records, the missing antenna information for the first wireless node may be computed. For example, the values for each parameter from the identified records can be averaged (or weighed in some manner) to obtain average antenna parameters to be imputed as the missing antenna parameters of the first wireless node. Alternatively, other operations may be performed on the various extracted values to impute the missing values for the antenna information for the first wireless node, e.g., selecting the maximum value, or the median value, from the records, performing more complex computational processes such as regression or interpolation operations, etc.

In another example, information available for the first wireless node that may be used to search and identify records for other wireless nodes (from which missing antenna information for the first wireless node may be inferred) may include partial antenna information such as antenna type and model. In this example, the mobile wireless device can receive the partial antenna information from the first wireless node, and provide that information to a remote server to search and identify records for other wireless nodes that are associated with the same antenna type or model. From the identified records, antenna information that was missing for the first wireless node (e.g., antenna gain pattern, maximum gain, etc.) is extracted. The extracted information is then used to derive imputed antenna information that is otherwise missing for the first wireless node. Here too, such derivation may include performing, for example, an averaging operation, performing some more complex computation process (e.g., regression operation), applying rules, etc.

In some embodiments, determination of missing antenna information for the first wireless node may be performed based on machine learning procedures. In such embodiments, a remote server may include a dynamically configurable learning/analysis module operable to determine missing antenna information for a particular wireless node as a function of data that is available for the particular wireless node. Such a machine learning module may be configured to iteratively analyze training input data (e.g., a set of partial data such as coarse location data, partial antenna information for wireless nodes, etc.) and the training input data's corresponding output, e.g., antenna information for the wireless node that in a real-live situation may not be available. In some embodiments, the machine learning module may be implemented, in whole or in part, on the first wireless node and/or on the mobile device. Using the training data, such a machine learning implementation may be configured to derive functions, models, rules, processes, etc., that cause subsequent inputs of, for example, available data for a particular wireless node to produce outputs (e.g., values representative of potential antenna information for the particular wireless node) that are consistent with the learning machine's learned behavior. In some embodiments, the learning machine implementation may be realized using a neural network system. A neural network may include interconnected processing elements (effectively the systems' neurons). The connections between processing elements in the neural network may have weights that cause output from one processing element to be weighted before being provided as input to the next interconnected processing elements. The weight values between connections may be varied, thereby enabling the neural network to adapt (or learn) in response to training data it receives. In some embodiments, the learning machine may be implemented using support vector machines, decision trees techniques, regression techniques to derive best-fit curves, and/or other types of machine learning procedures/techniques.

In some embodiments, upon determining/inferring the antenna information that is not otherwise available for the first wireless node, the determined/inferred information is transmitted to the mobile device that sent the information message. The determined/inferred information (e.g., beamwidth, antenna gain pattern, etc.) may be transmitted as a message using any type of messaging or communication protocol supported by the mobile wireless device and by the remote device implementing the central repository of antenna data for multiple wireless nodes. In some embodiments, the determined/inferred information received by the mobile wireless device may be used, for example, to perform location determination operations, as more particularly described below. In some embodiments, the determined/inferred information received by the mobile device from the remote server may be used as a "first guess." Subsequently, the "first guess" information may be confirmed or verified using, for example, the procedures and other implementations described herein. The "first guess" information may also serve as interim values to be used while more refined values of the missing information are being determined via more time consuming operations (e.g., through more computationally intensive procedures, through retrieval of needed information from remote and harder-to-access servers, etc.)

Figure 15:
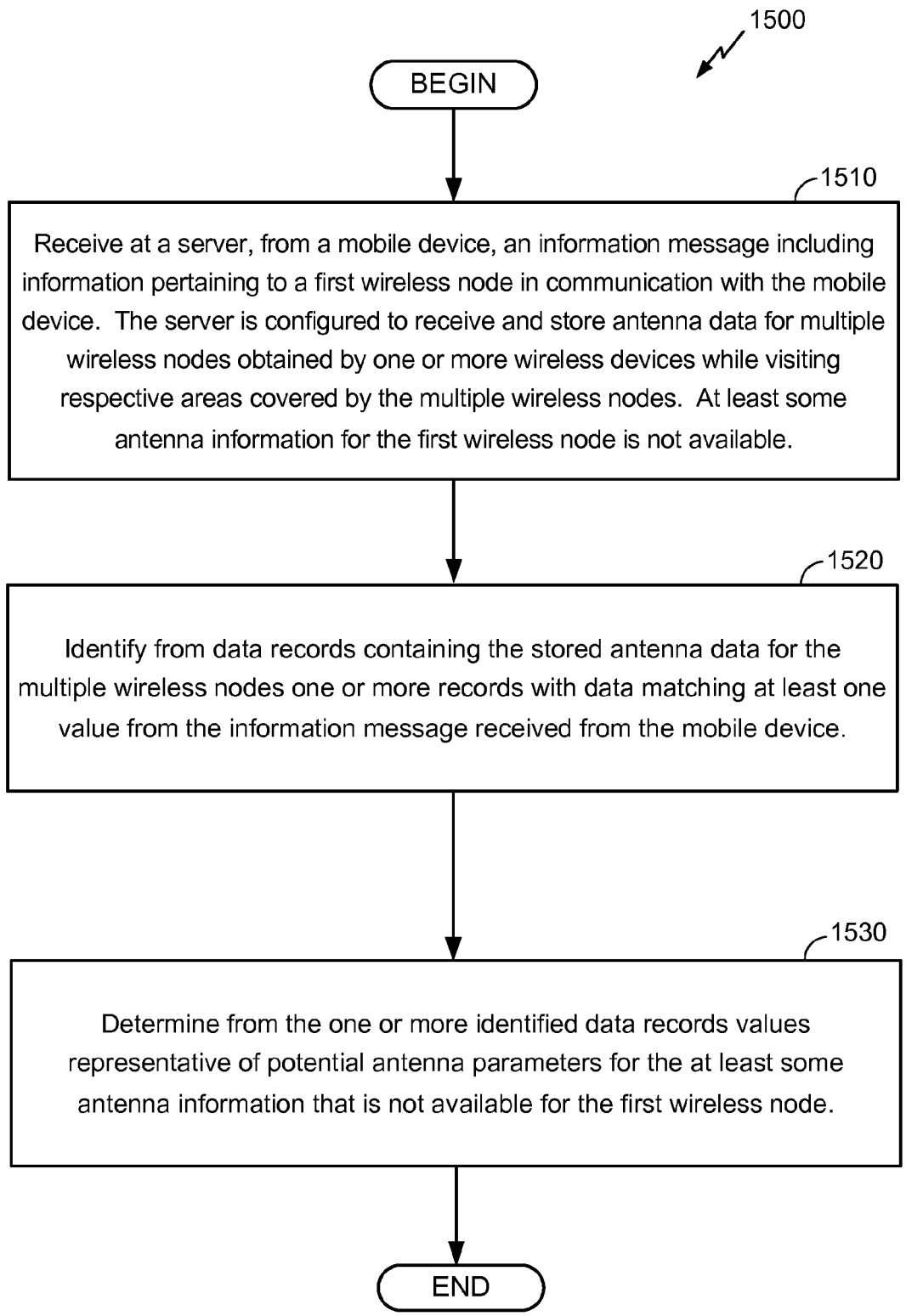
FIG. 15 is a flowchart of an example procedure, generally performed at a server, to determine or infer missing antenna information for a wireless node, in accordance with certain example implementations.

With reference now to FIG. 15, a flowchart of an example procedure 1500, generally performed at a server, to determine or infer missing antenna information for a wireless node (such as any of the AP's of FIG. 1) is shown. The procedure 1500 includes receiving at block 1510 at the server, from a mobile device, an information message including information pertaining to a first wireless node in communication with the mobile device. The server implements a central repository of information and thus is configured to receive and store antenna data for multiple wireless nodes obtained by one or more wireless devices while those one or more wireless devices visit respective areas covered by the multiple wireless nodes. At least some antenna information for the first wireless node is not available.

Using the information in the information message received from the mobile device, one or more data records may be identified at block 1520, from the records that contain the stored antenna data for the multiple wireless nodes, that match at least one value from the information message received from the mobile wireless device. From the one or more identified data records, values representative of potential antenna parameters for the at least some antenna information that may not be available for the first wireless node is determined at block 1530. Determination of the potential antenna parameters can be performed through averaging operations, or through some other type of computational process, performed on values extracted from the identified records. In some embodiments, determination of a node's missing information may be performed through applications of pre-determined rules on the data of the identified records, through use of a machine-learning engine, etc.

Location Determination Operations Using a Node's Antenna Information

As noted, in some embodiments, antenna information associated with a transmitting wireless node (such as, but not only, the AP's or base stations depicted in FIG. 1) may be used to perform position/location determination operations so as to refine data used for positioning (such as heatmaps), or refine actual position estimates. For example, in embodiments based on the use of heatmaps, a mobile device may determine its location according to a heatmap(s) by comparing measured wireless signal characteristics (e.g., RSSI, RTT, RTD, TOA, AOA, etc.) to one or more values in the heatmap (a heatmap generally includes data indicating one or more received wireless signal characteristic values that correspond to a given position; if a mobile device acquires at least one signal having characteristic(s) that match wireless signal characteristic value(s) that correspond to a given position as indicated by a heatmap, it may be inferred that the mobile device is located at the given position). Knowledge of antenna information associated with the wireless nodes transmitting the signals that are measured by the mobile device and compared to the values in a heatmap may be used to generate or refine the heatmaps in order to improve the accuracy of positions estimates determined based on the heatmap(s).

Figure 16:
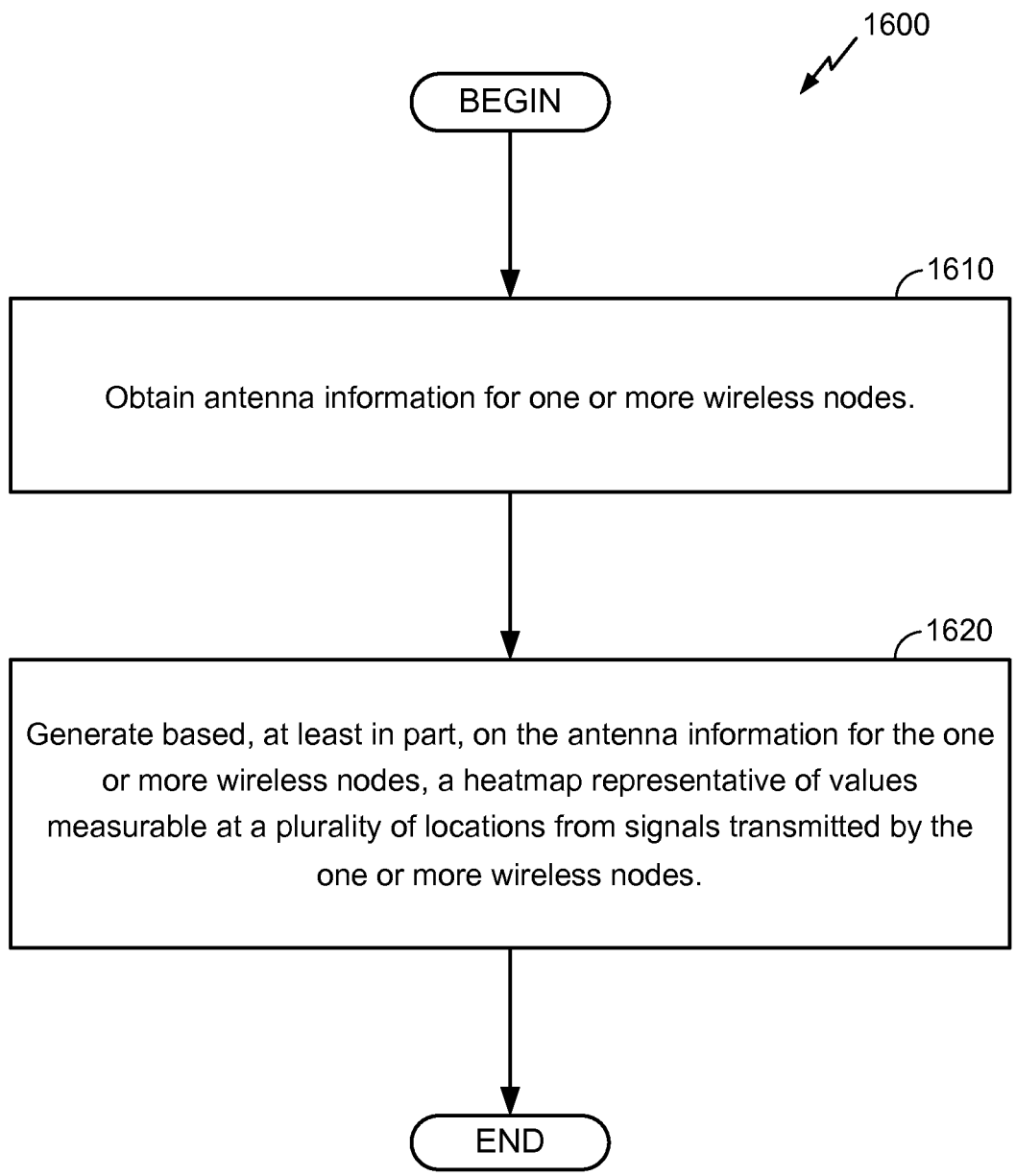
FIG. 16 is a flowchart of an example procedure to generate heatmaps based on antenna information for wireless nodes, in accordance with certain example implementations.

Thus, with reference to FIG. 16, a flowchart of an example procedure 1600 to generate heatmaps based on antenna information for wireless nodes is shown. The procedure 1600 includes obtaining at block 1610 antenna information for one or more wireless nodes. As described herein, antenna information for the one or more wireless nodes with respect to which heatmaps are to be generated may be obtained by including such antenna information in messages transmitted to the device that is to generate the heatmap. For example, the device generating the heatmap may receive a broadcast message sent by the wireless node(s) for which a heatmap is to be generated (e.g., a beacon frame message configured according to IEEE 802.11), a message sent as part of a message exchange protocol such as the FTM-protocol, an assistance data communication/message sent from a remote server, etc. In the example embodiments discussed herein, the antenna information provided to the device generating the heatmap may include antenna gain pattern information, antenna type/model information, antenna configuration information (e.g., information about the antennas activated, their transmission powers, phase information, orientation, etc.), antenna diversity information, and so on. In some embodiments, the device generating the heatmap may initiate a process to obtain antenna information for the one or more wireless nodes, while in some other embodiments obtaining the antenna information for the wireless nodes may be performed in response to receipt of a message/communication requesting that the device commence heatmap-generation operations.

As further illustrated in FIG. 16, having received the antenna information required for heatmap-generation, a heatmap representative of values measurable at a plurality of locations may be generated at block 1620 from signals transmitted by the one or more wireless nodes and based, at least in part, on the antenna information for the one or more wireless nodes. The measurable values that are determined for populating the heatmap may include such values as signal strength values (e.g., RSSI values), time-based values (RTT, time-of-arrival measurements, and so on), etc.

Various heatmap-generation procedures that rely on antenna information (for the wireless nodes that are to transmit signals for use in location determination operations once the heatmap is generated) may be implemented. For example, in some embodiments, heatmap generation may be implemented based on use of a propagation model that provides theoretical estimates of what signal characteristics at various locations (e.g., as functions of distance and/or angular position relative to a wireless node that is to transmit the signals based on which position of the mobile device is to be determined). In some embodiments, the propagation model may be expressed according to the relationship RSSI (dBm)=TX power (dBm)−path loss (dB), where 'path loss' may be determined as a function of variables affecting the path loss at various locations. In some embodiments, derivation of the propagation model may be based on antenna information for the wireless node whose signals are to be used by a measuring device for position determination. For example, the antenna orientation (e.g., the way the antenna is positioned relative to some reference point), antenna model or type (which may be associated with a known antenna gain pattern), transmission power, antenna configuration (e.g., respective phase delays for various ones of multiple antennas for the wireless node), actual location of the wireless node (and thus of the antenna), and other such data germane to determination/derivation of a propagation model for the antennas of the particular wireless node may be taken into account and used to establish the propagation model (e.g., those factors may be used to compute the path loss). Generating a heatmap based on a propagation model may be performed at any device which obtained or derived the propagation model, including a personal mobile device, a wireless node (such as an AP or base station), some remote server, etc.

In some embodiments, some of the antenna information may not be available and/or cannot be obtained from some other device (e.g., via a broadcasting message, an FTM message, an assistance data message, etc.) In such embodiments, missing information may be computed directly based on the available antenna information, and/or other antenna information. For example, and as described herein, in situations in which antenna orientation information is not known, the orientation of antennas for a particular wireless node may be derived according to a procedure such as the procedure 1100 of FIG. 11, where antenna orientation is derived based on antenna gain pattern information and measurements performed by a measuring device (e.g., a mobile wireless device) of signal characteristics for signals transmitted by the particular wireless node. Additionally and/or alternatively, as more particularly described herein in relation to the procedure 1400, missing information may be obtained based on available information for the particular wireless node and/or for a receiving measuring device in communication with the particular wireless node, by identifying, at a central repository, based on the available information, data records for other wireless nodes that share common values with the available information for the wireless nodes and/or for the measuring device, and inferring missing antenna information for the particular wireless node from the identified records.

In some embodiments, heatmap generation may be implemented based on measurements, performed at a mobile wireless device, of signal characteristics (e.g., RSSI, RTT, etc.) for signals received from a particular wireless node or from multiple wireless nodes (heatmaps generated based on measurements performed by a mobile device are also referred to as autarkic or fingerprints heatmaps). The heatmap values for other locations (i.e., at which measurements were not performed) can then be computed using, for example, one or more interpolation procedures. Examples of interpolation procedures or techniques that may be used include a nearest neighbor interpolation procedure, a bilinear interpolation procedure, a bicubic interpolation procedure, a trilinear interpolation procedure, a sinc filter procedure, Lanczos resampling procedure, a Gaussian process regression procedure, and other types of interpolation procedures. In some embodiments, such interpolation procedures may take into account antenna information for the one or more wireless nodes with respect to which the heatmap is to be generated. For example, to interpolate signal characteristic values between two locations at which actual signal measurements were performed, the antenna gain pattern information for the one or more wireless node may be used to adjust the interpolated values. For example, the antenna gain pattern (which may correspond to some non-linear signal strength behavior as a function of angular position at a particular range(s) from the wireless node(s)) may be used to weigh the interpolated values of the signal characteristics at locations between locations where actual signal measurements were performed.

Thus, in some embodiments, generating the heatmap may include measuring at multiple locations signal characteristic values for the signals transmitted by the one or more nodes, and determining, based on antenna gain pattern information (or some other pertinent antenna information) for at least one of the one or more wireless nodes and on the signal characteristic values measured at the multiple locations, interpolated signal characteristic values at locations different from the multiple locations at which the signal characteristics values for the signals transmitted by the one or more wireless nodes were measured. The multiple locations at which the signal characteristic values were directly measured from signals received from the one or more wireless nodes can be determined according to one or more location determination procedures. For example, the locations of the measuring device at the time that signal measurements were performed may be determined according to multilateration-based procedures using signals from a satellite-positioning system and/or terrestrial nodes (including from the wireless nodes for which heatmap(s) are to be generated), location determination using existing heatmaps (which may, or may not, have taken antenna information into account), location determined based on the identity and location of the transmitting wireless nodes (such information may be included in the signals received from the transmitting wireless node), location determined based on assistance data received from some remote device, etc. The signal characteristic values measured and the respective determined locations at which the measurements were performed, as well as the interpolated signal characteristic values and their corresponding locations, are used to populate a data structure constituting the heatmap (e.g., a matrix-type data structure). In some embodiments, signal characteristic values may be computed for locations (positions or points) outside the area spanned by the positions/locations at which signal measurements (to determine signal characteristic values) were performed according to one or more extrapolation procedures.

As noted, in some situations, available antenna information, such as antenna gain pattern, may be used to determine missing antenna information, such as antenna orientation (e.g., according to the procedure 1100 described herein). Thus, in such situations, prior to performing interpolation operations using signal characteristic values directly computed from signal measurements at multiple locations, the directly computed signal characteristic values are used, in conjunction with the available antenna gain pattern information, to estimate the antenna orientation for at least one of the one or more wireless nodes for which a heatmap(s) is to be generated. Once the antenna orientation information is determined, that information may be used to constrain interpolation of the signal characteristic values. For example, the center axis or point of a beam radiating from antennas of the wireless nodes may be determined from the antenna orientation(s) estimated, and interpolated values may be more heavily weighed closer to the center of the radiation beam, and weighed less heavily as the angular positions (relative to the radiation beam) for the locations for which interpolation operations are performed move away from the center of the beam (e.g., measurements close to the center of a beam can be more greatly trusted than measurements that are farther away from the center of the beam). Accordingly, in such embodiments, determining the interpolated signal characteristic values may include deriving antenna orientation for the at least one of the one or more wireless nodes based on the signal characteristic values measured at the multiple locations for the signals transmitted by the one or more wireless nodes, and on antenna gain pattern information for the one or more nodes, and performing interpolation operations, constrained by one or more of the antenna gain pattern information or the derived antenna orientation, on the measured signal characteristic values to determine the interpolated signal characteristic values at the locations different from the multiple locations at which the signal characteristics values for the signals transmitted by the one or more wireless nodes were measured.

Signal Strength Adjustment

As noted, location determination operations may be based, in some embodiments, on computation of signal strength (or some metric/value derived therefrom, such as RSSI) for a signal transmitted from a wireless node(s) in order to compute a distance (range) to a transmitting wireless node(s), or to compute a position estimate (e.g., based on multilateration procedures, heatmap-based procedures, etc.) for the receiving device. The measured signal strength value (such as the RSSI) may depend, at least in part, on the particular receiver of the receiving device obtaining the measurement. For example, different mobile devices (e.g., from different manufacturers) may have different receiver gains, resulting in different RSSI measurement values for signals transmitted from the same transmitting wireless node that are received at the same location. Consequently, the receiver gain value used or assumed for a receiving device impacts the accuracy of the position or range determined from signals received by the receiving device. Generally, the term "receiver gain" may refer to an increase or decrease in received signal strength measured at a mobile device relative to, for example, a predicted signal strength from a radio heatmap, and may be expressed using negative values, positive values, or values that approximate 0.0. For example, if a value for received signal strength at a particular location, as indicated on a radio heatmap, may be approximated as −40.0 dBm, and a receiver of a mobile device measures signal strength of approximately −30.0 dBm, then the receiver may observe a gain of approximately 10.0 dB. Receiver gain of a mobile device may be brought about by factors such as an increase or a decrease in antenna gain of a wireless transmitter and/or of a mobile device, an unexpected increase in transmitter power, and so forth.

In some embodiments, to mitigate the problem of reduced positioning accuracy resulting from differences between receiver gains for different receiving devices, the receiving devices' respective receiver gains can be estimated on the fly, and the resultant estimate can be used to adjust signal strength measurements (such as RSSI). Generally, however, the estimated gain represents not only the gain of the actual receiving device's receiver, but also the transmitting node's transmitter's gain, as well as the difference between the actual and assumed transmission power used by the transmitter's antenna(s) to transmit the signals on which signal strength measurements are performed. In other words, the compensation value computed to adjust the signal strength measurements is a consolidated/composite value that factors into it, in this example, three estimates, namely, the receiver gain estimate, the transmitter gain estimate, and the difference between actual and assumed transmission power. These estimates are each associated with a corresponding uncertainly factor (namely, an uncertainty factor for the receiver gain estimate, an uncertainty value for the transmitter gain estimate, and an uncertainty factor for the assumed transmission power of the transmitter).

To reduce at least some of the uncertainty associated with the estimates (and thus improve accuracy of the position estimates), in some embodiments, antenna information for a transmitting wireless node that is obtained by the measuring device (e.g., a personal mobile wireless device, such as the devices 108 or 200 of FIGS. 1 and 2, respectively), including antenna gain value for the antenna transmitter of wireless node, may be used to adjust signal strength determined for signals received from the wireless node. Accordingly, with reference to FIG. 17, a flowchart of an example procedure 1700 to perform signal strength adjustment based on antenna information for a wireless node(s) transmitting signals received by a measuring device is shown. As illustrated, the procedure 1700 includes receiving at block 1710, at a wireless device (such as a personal mobile device) antenna information that includes a transmitter gain for a wireless node (a wireless node such as any of the AP's or base stations depicted in FIG. 1). As discussed herein, in some embodiments, the antenna information for the wireless node (transmitting the signals for which signal strength values, or other signal characteristics, are measured/determined) may be provided by including such antenna information in messages transmitted to the mobile device that is to receive and measure the signals from the wireless node. For example, the mobile device may receive a broadcast message sent by the wireless node (or by a different wireless node sending beacon messages on behalf of the wireless node), a message sent as part of a message exchange protocol such as the FTM-protocol, an assistance data communication/message sent from a remote server, etc. In the example embodiments discussed herein, the antenna information provided to the mobile device that is to measure signal strength for the signals from the wireless node may include the transmitter gain for the node, antenna gain pattern information, antenna type/model information, antenna configuration information (e.g., information about the antennas activated, their transmission power, phase information, orientation, etc.), antenna diversity information, etc.

Figure 17:
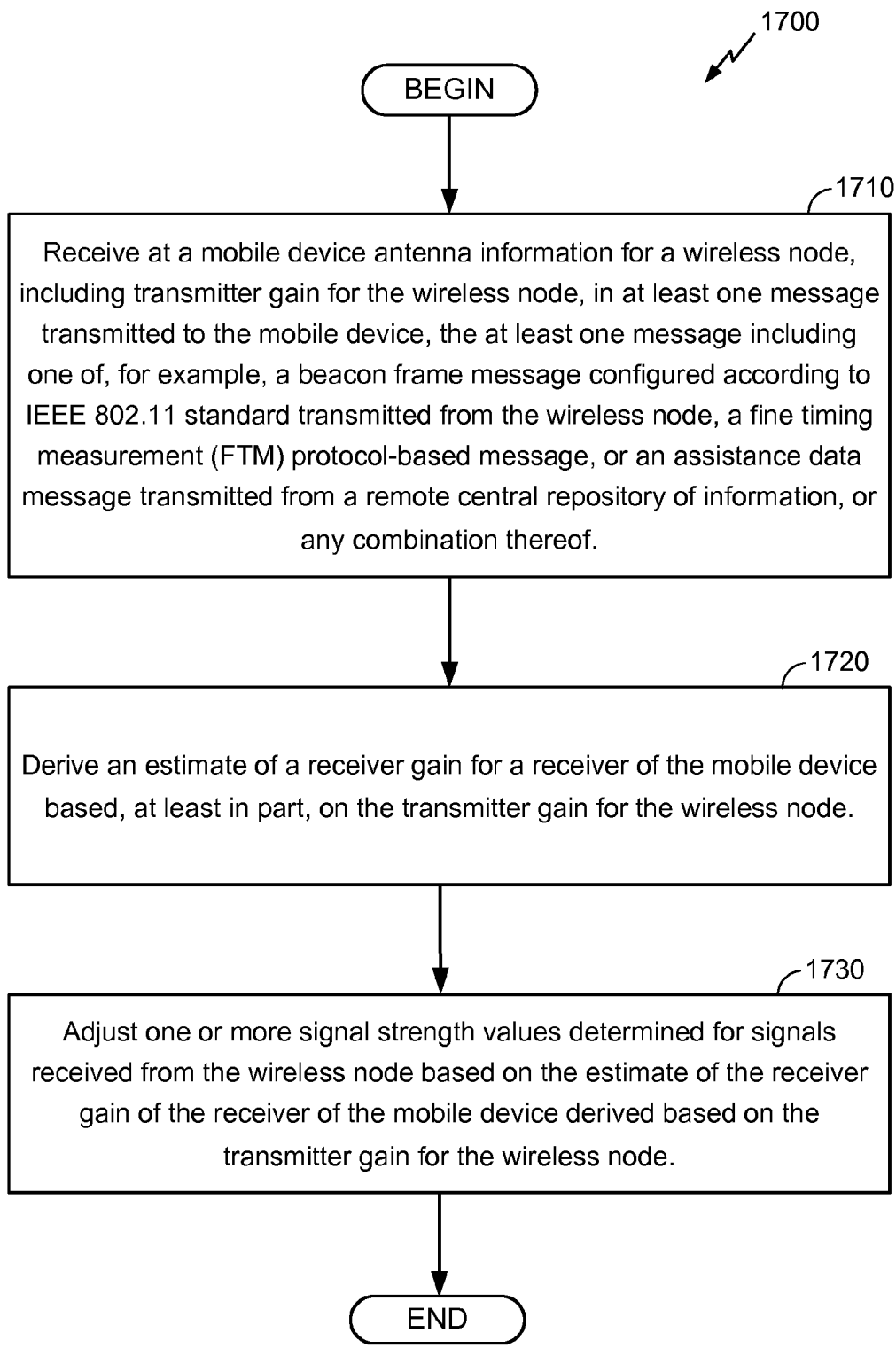
FIG. 17 is a flowchart of an example procedure to perform signal strength adjustment based on antenna information for a wireless node(s) transmitting signals received by a measuring device, in accordance with certain example implementations.

With continued reference to FIG. 17, based, at least in part, on the transmitter gain for the wireless node (included in the antenna information that was obtained), an estimate of a receiver gain for a receiver of the mobile device may be derived at block 1720. By knowing the transmitter gain for the wireless node (the transmitter information may have been previously determined and recorded at the wireless transmitter or at some repository of information, and then provided to the mobile device), the specific gain for the receiver can be determined, thus enabling determination of a more accurate adjustment value that is to be used to adjust the measured signal strength values. In some embodiments, the antenna information obtained for the wireless node may further include actual transmission power for the wireless node. In such embodiments, deriving the estimate of the receiver gain for the receiver of the mobile device may include deriving the estimate of the receiver gain for the receiver of the mobile device based, at least in part, on the transmitter gain for the wireless node and the actual transmission power. For example, in some embodiments, the mobile device receiver gain, Mobile_$R_x$_Gain, may be derived according to:

$$\text{Mobile\_}R_x\text{\_Gain} = \text{RSSI}_{measured} - (\text{AP\_Tx\_Power} + \text{AP\_Tx\_Gain})$$

where $\text{RSSI}_{measured}$ is the actual RSSI value measured at the mobile device of a signal transmitted by the network node (e.g., an AP), AP_$T_x$_Power is the known transmitter power of the transmitting AP, which may have been provided to the mobile device as part of the antenna information transmitted to the mobile device, and AP_$T_x$_Gain is the known transmitter gain for the transmitting AP (which also may have been provided to the mobile device via a message including antenna information). In some embodiments, where the access point is configured to first receive a signal from the mobile device, compute an RSSI value for that signal, and send it back to the mobile device, the receiver gain of the mobile device may be derived according to:

$$\text{Mobile\_}R_{x\_Gain} = RSSI_{measured} - AP\_T_x\_\text{Power} - (RSSI@AP - \text{Mobile\_}T_x\_\text{Power} - AP\_Tx\_gain)$$

where RSSI@AP is the RSSI of the signal sent by the mobile device as measured by the receiving AP, and Mobile_$T_x$_Power is the transmission power for that signal. The above values used to compute Mobile_$R_x$ Gain may be provided in one of, for example, dBm units, decibels relative to 1.0 watt (dBW) units, decibels above 1.0 microwatt (dBµW) units, and/or any other appropriate units.

As further shown in FIG. 17, one or more signal strength values (e.g., RSSI values) determined for signals received from the wireless node may be adjusted at block 1730 based on the estimate of the receiver gain of the receiver of the mobile device (derived based, at least in part, on the transmitter gain for the wireless node). Because the receiver gain estimate can be determined with substantially accurate estimates of the transmitter gain and/or the transmitter's transmission power (as those values may have been provided as part of the antenna information obtained by the mobile device), the adjusted one or more signal strength values can subsequently be used to obtain more accurate position estimate (be it through, for example, multilateration-based procedures, heatmap-based procedures, etc.) Thus, in some embodiments, the mobile device may perform one or more of, for example, determining a distance to the wireless node based on the adjusted one or more signal strength values, identifying a location estimate in a previously generated heatmap based on the adjusted one or more signal strength values, and/or generating a heatmap based, at least in part, on the adjusted one or more signal strength values (generating a heatmap may be performed according to the procedures described in relation to FIG. 16).

Figure 18:
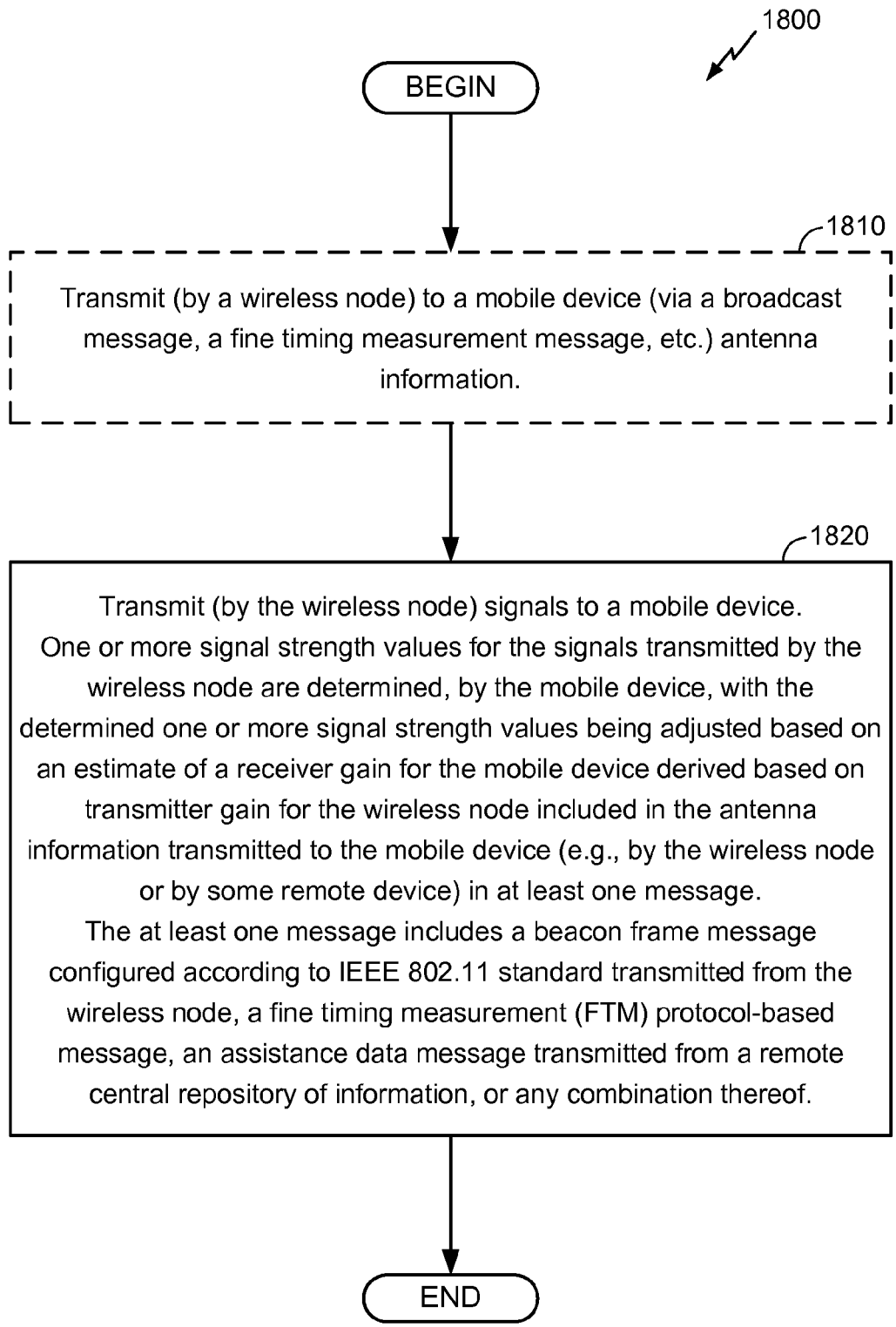
FIG. 18 is a flowchart of an example procedure, generally performed at a wireless node (such as an AP or a base station), to facilitate position determination for a mobile device, in accordance with certain example implementations.

With reference to FIG. 18, a flowchart of an example procedure 1800, generally performed at a wireless node (such as an AP or base station), to facilitate position determination for a mobile device is shown. The procedure 1800 optionally includes transmitting at block 1810 (e.g., transmitting a broadcast message, a fine timing measurement message, etc., by the wireless node), to a mobile device, antenna information that includes transmitter gain for the wireless node.

As further shown in FIG. 18, the procedure 1800 includes transmitting at block 1820, by the wireless node, signals to the mobile device. One or more signal strength values for the signals transmitted by the wireless node are determined by the mobile device, with the determined one or more signal strength values being adjusted based on an estimate of a receiver gain for the mobile device derived based on a transmitter gain for the wireless node included in antenna information transmitted to the mobile device in at least one message. The at least one message includes, for example, a beacon frame message configured according to IEEE 802.11 standard transmitted from the wireless node, a fine timing measurement (FTM) protocol-based message (which, as noted, may also have been transmitted to the mobile device from the wireless node), an assistance data message transmitted from a remote central repository of information, or any combination thereof.

Location Determination Based on Range Computation and Antenna Information

As noted, location determination operation may be performed based on ranges (i.e., distances between a receiving device and a transmitting device) that are computed from signals transmitted by the transmitting device. For example, a receiving device, such as a personal mobile wireless device, may be configured to compute signal strength values (e.g., RSSI values) for signals received from one or more wireless nodes, and determine the distance to the transmitting nodes based on the signal strength values. Generally, the nodes' transmission powers and locations are known, thus enabling determination of the distances of the receiving device to the transmitting nodes. The determined ranges can then be used to compute a position estimate for the receiving mobile device according to one or more range-based position determination procedures such as, for example, a multilateration procedure, a least-squares procedure, an extended Kalman filter procedure, etc. (such procedures may be performed at the mobile device or at a remote positioning server implemented at a server such as the server 110 of FIG. 1).

When the nodes providing the signals include omnidirectional antennas with a substantially uniform radial gain pattern, position determination for the receiving device generally provides a good position estimate or approximation. However, when a transmitting node includes a directional antenna (i.e., an antenna configured to transmit signals in particular directions, such as to particular sectors) and/or has a non-uniform radial gain pattern, ranges determined based on signals transmitted by such a node may lead to inaccurate position estimates. This is because the same signal strength (RSSI) measured at two different angles from the directional antenna of such a node may correspond to different ranges.

Accordingly, in some embodiments, position determination procedures include operations to prevent or inhibit the use of ranging signals from directional antenna. Thus, with reference to FIG. 19, a flowchart of an example procedure 1900 for range determination (e.g., to facilitate location determination) for a mobile device (such as the mobile devices 108 or 200 of FIGS. 1 and 2, respectively), is shown. As illustrated, the procedure 1900 includes obtaining at block 1910 antenna information for a wireless node. As discussed herein, in some embodiments, the antenna information for the wireless node (transmitting the signals for which signal strength values, and/or other signal characteristic values, are measured/determined) may be provided by including such antenna information in messages transmitted to the mobile device that is to receive and measure the signals from the wireless node. For example, the mobile device may receive a broadcast message (e.g., configured according to the IEEE 802.11 standard) sent by each wireless node (or by a different wireless node sending beacon messages on behalf of one or more wireless nodes) that is to send signals utilized for position determination, a message sent as part of a message exchange protocol such as the FTM-protocol, an assistance data communication/message sent from a remote server (e.g., including antenna information for each wireless node that is to transmit signals utilized for position determination), etc. In the example embodiments discussed herein, the antenna information provided to the mobile device may include antenna type (or other information) indicating whether the antennas for the respective transmitting nodes are directional or omnidirectional antennas. Other information that may be provided with the antenna information (such other information may separately be used to determine whether an antenna is a directional or omnidirectional antenna) may include, for example, antenna gain pattern information (e.g., a substantially uniform pattern may indicate that the corresponding antenna is omnidirectional), antenna configuration information (e.g., information about the antennas activated, their transmission power, phase information, orientation, etc., which may be used in determining the resulting signal radiation behavior for respective wireless node), antenna diversity information, etc. In situations where antenna information for a particular node is not directly available, the antenna information, including the antenna type, for the particular node may be inferred based on information that is available for the node (e.g., its location, other known characteristics and attributes of the node, etc.) For example, as discussed in relation to the procedures 1400 and 1500 illustrated in FIGS. 14 and 15 respectively, known antenna information for other nodes that share at least some of the attributes and characteristics of the particular node may be used for inferring the missing antenna information for the particular node.

Figure 19:
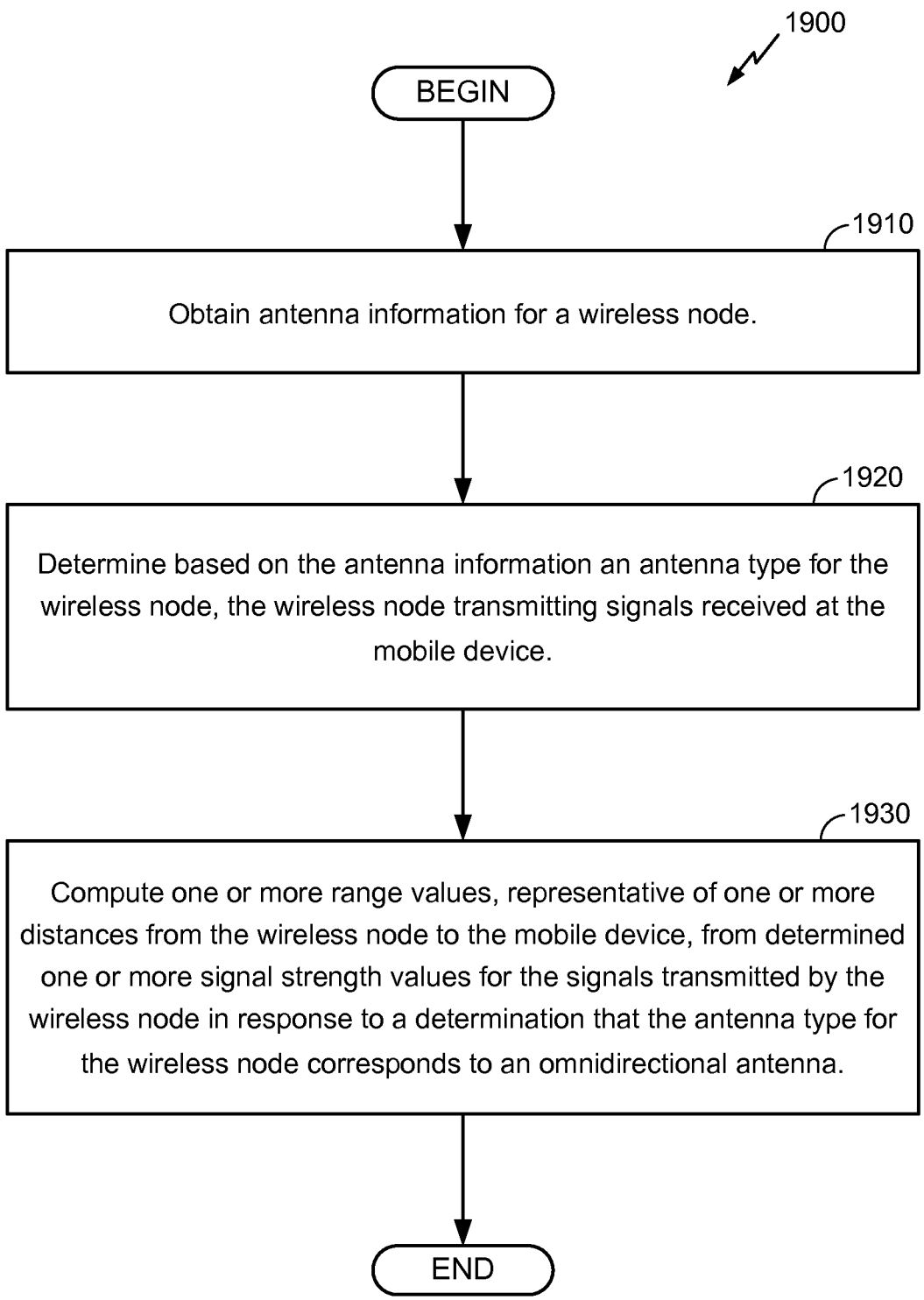
FIG. 19 is a flowchart of an example procedure for range determination (e.g., to facilitate location determination) for a mobile device, in accordance with certain example implementations.

With continued reference to FIG. 19, based on the obtained antenna information for the wireless node, an antenna type for that wireless node may be determined at block 1920. In some embodiments, the received antenna information may specify the antenna type (e.g., directional or omnidirectional), whereas in some other embodiments, the antenna type may be implicitly provided and thus may be indirectly determined from the antenna information that was provided. For example, as noted, the antenna information provided may include antenna gain pattern data, and based on that data a determination may be made of whether the gain pattern is non-uniform (thus indicating the antenna is a directional antenna) or is substantially uniform over a substantially 360° angular span of the antenna (thus indicating the antenna(s) corresponds to an omnidirectional antenna).

Having determined the antenna type of the antenna for a particular wireless node transmitting signals, one or more range values, representative of one or more distances of the wireless node to the mobile device, may be computed at block 1930 from determined one or more signal strength values for the signals transmitted by the wireless node in response to a determination that the antenna type for the particular wireless node corresponds to an omnidirectional antenna. When the antenna type for the particular wireless node (e.g., as determined from the antenna information for the wireless node) is determined to correspond to a directional antenna, the one or more signal strength values for signals received from the wireless node are disregarded. In some embodiments, a determination of the antenna type for the wireless node may be made before signals transmitted by the wireless node are measured/processed (to determine their signal strength values), and thus, in such embodiments, the receiving device may be configured to forego performing processing on signals that are identified as originating from that particular wireless device (e.g., when SSID information, or some other identifying information, included in a signal frame transmitted by the wireless node, identifies the wireless node as the node determined to have a directional antenna(s)).

As noted, in situations where received signals are determined to have originated from a wireless node that has an omnidirectional antenna, at least some of the range values computed from the signals may be used (with or without range values derived from signals transmitted by other wireless nodes in communication with the receiving device) to determine a location/position estimate for the mobile device. Location determination techniques/processes may be based on, for example, multilateration-based procedures, and/or by data-fitting procedures such as least-squares analysis, Kalman filtering, etc., which may be used to mitigate noise and/or uncertainties associated with measured data. For example, in some embodiments, the location of the mobile device may be derived based, at least in part, on an Extended Kalman Filter (EKF) process. Briefly, an EKF-based system is configured to estimate the location, or state, of a discrete-time controlled system governed by a non-linear stochastic differentiable function from noisy measurements. An EKF system starts with an initial state estimate and covariance estimate for an initial time step. The initial state estimate is used to determine a predicted state and a predicted covariance, which are refined using, for example, raw measurements (e.g., range measurements), to produce an output state and output covariance. The predicted state estimate and the output state are computed for each time step until the difference between them reaches some pre-defined error tolerance.

Figure 20:
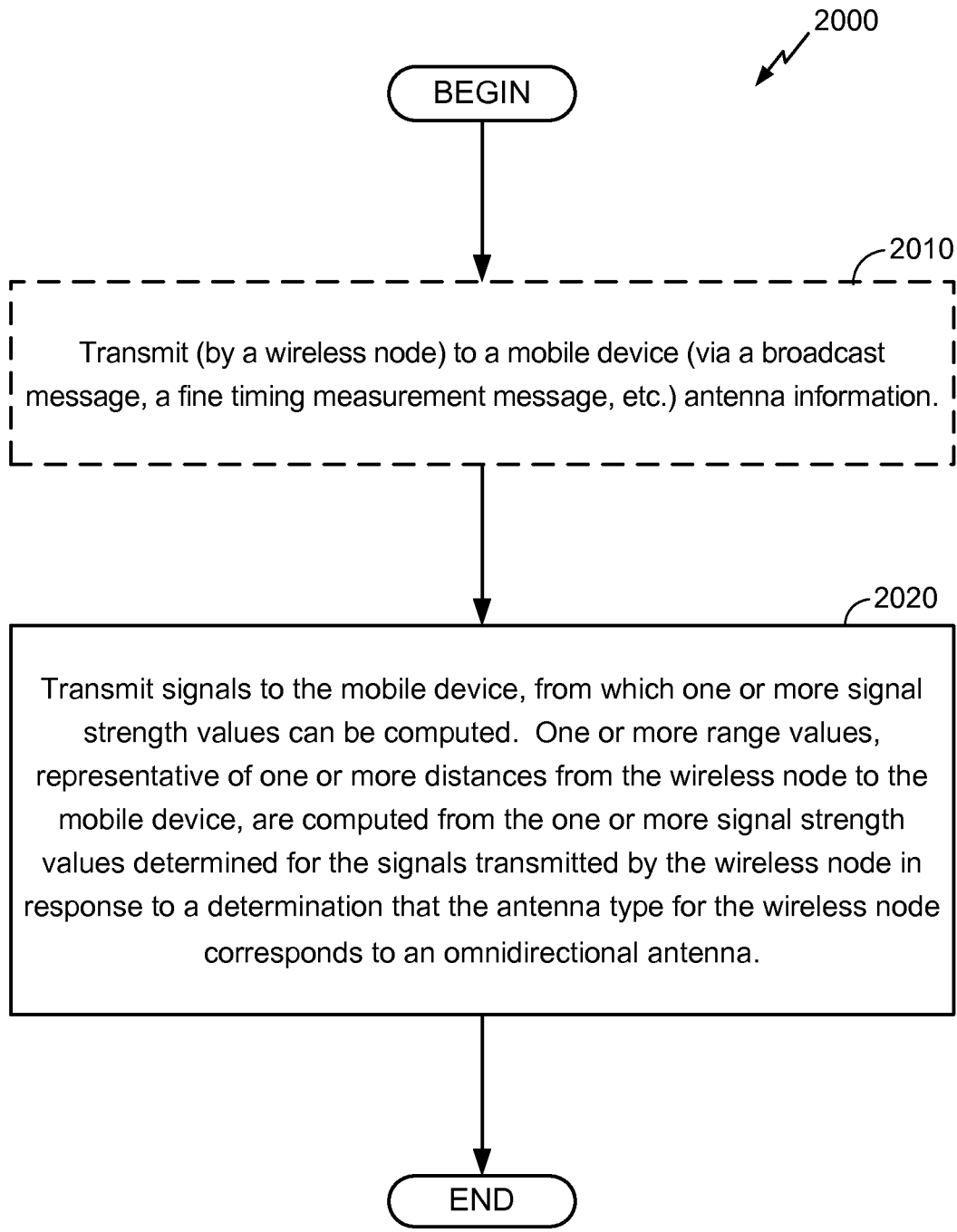
FIG. 20 is a flowchart of an example procedure, generally performed at a wireless node, to facilitate location determination operations using range-based measurements, in accordance with certain example implementations.

With reference now to FIG. 20, a flowchart of an example procedure 2000, generally performed at a wireless node (such as an AP or base station transmitting signals that may be measured at a receiving mobile device), to facilitate location determination operations using range-based measurements, is shown. The procedure 2000 optionally includes transmitting at block 2010 to a mobile device (e.g., transmitting a broadcast message, a fine timing measurement message, etc., by the wireless node) antenna information for the wireless node. The antenna information may be used to determine an antenna type for the wireless node. The antenna information may specify the antenna type, e.g., omnidirectional or directional antenna, or may include data, such as gain pattern data, from which the antenna type may be determined. The procedure 2000 further includes transmitting at block 2020 signals to the mobile device, from which one or more signal strength values can be computed. One or more range values (representative of one or more distances from the wireless node to the mobile device) are computed from the one or more signal strength values determined for the signals transmitted by the wireless node in response to a determination that the antenna type for the wireless node corresponds to an omnidirectional antenna.

Additional Embodiments

Figure 21:
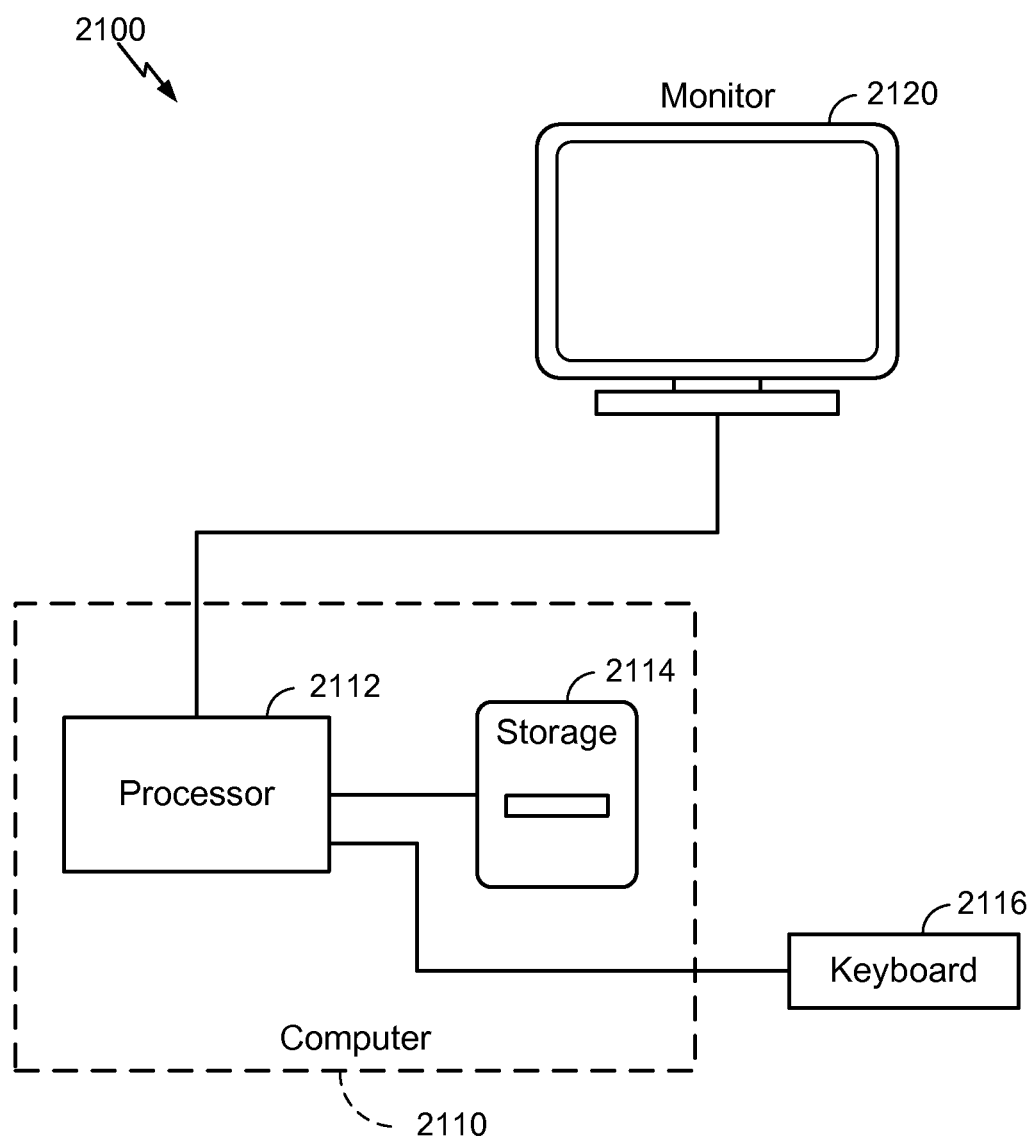
FIG. 21 is a schematic diagram of an example computing system, in accordance with certain example implementations.

Performing the procedures described herein may be facilitated by a processor-based computing system. With reference to FIG. 21, a schematic diagram of an example computing system 2100 is shown. The computing system 2100 may be housed in, for example, a handheld mobile device such as the devices 108 and 200 of FIGS. 1 and 2, respectively, or may comprise part or all of servers, nodes, access points, or base stations such as the nodes 104*a*-*c*, 106*a*-*e*, or 300 depicted in FIGS. 1 and 3. The computing system 2100 includes a computing-based device 2110 such as a personal computer, a specialized computing device, a controller, and so forth, that typically includes a central processor unit (CPU) 2112. In addition to the CPU 2112, the system includes main memory, cache memory and bus interface circuits (not shown). The computing-based device 2110 may include a mass storage device 2114, such as a hard drive and/or a flash drive associated with the computer system. The computing system 2100 may further include a keyboard, or keypad, 2116, and a monitor 2120, e.g., a CRT (cathode ray tube) or LCD (liquid crystal display) monitor, that may be placed where a user can access them (e.g., a mobile device's screen).

The computing-based device 2110 may be configured to facilitate, for example, the implementation of one or more of the procedures described herein (including the procedures to disseminate, collect, and/or and manage antenna information, the procedures to perform location determination operations, etc.) The mass storage device 2114 may thus include a computer program product that when executed on the computing-based device 2110 causes the computing-based device to perform operations to facilitate the implementation of the procedures described herein. The computing-based device may further include peripheral devices to enable input/output functionality. Such peripheral devices may include, for example, a CD-ROM drive and/or flash drive, or a network connection, for downloading related content to the connected system. Such peripheral devices may also be used for downloading software containing computer instructions to enable general operation of the respective system/device. Alternatively and/or additionally, in some embodiments, special purpose logic circuitry, e.g., an FPGA (field programmable gate array), a DSP processor, or an ASIC (application-specific integrated circuit) may be used in the implementation of the computing system 2100. Other modules that may be included with the computing-based device 2110 are speakers, a sound card, a pointing device, e.g., a mouse or a trackball, by which the user can provide input to the computing system 2100. The computing-based device 2110 may include an operating system.

Computer programs (also known as programs, software, software applications or code) include machine instructions for a programmable processor, and may be implemented in a high-level procedural and/or object-oriented programming language, and/or in assembly/machine language. As used herein, the term "machine-readable medium" refers to any non-transitory computer program product, apparatus and/or device (e.g., magnetic discs, optical disks, memory, Programmable Logic Devices (PLDs)) used to provide machine instructions and/or data to a programmable processor, including a non-transitory machine-readable medium that receives machine instructions as a machine-readable signal.

Memory may be implemented within the computing-based device 2110 or external to the device. As used herein the term "memory" refers to any type of long term, short term, volatile, nonvolatile, or other memory and is not to be limited to any particular type of memory or number of memories, or type of media upon which memory is stored.

If implemented in-part by hardware or firmware along with software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

As used herein, a mobile device or station (MS) refers to a device such as a cellular or other wireless communication device, a smartphone, tablet, personal communication system (PCS) device, personal navigation device (PND), Personal Information Manager (PIM), Personal Digital Assistant (PDA), laptop or other suitable mobile device which is capable of receiving wireless communication and/or navigation signals, such as navigation positioning signals. The term "mobile station" (or "mobile device" or "wireless device") is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, "mobile station" is intended to include all devices, including wireless communication devices, computers, laptops, tablet devices, etc., which are capable of communication with a server, such as via the Internet, WiFi, or other network, and to communicate with one or more types of nodes, regardless of whether satellite signal reception, assistance data reception, and/or position-related processing occurs at the device, at a server, or at another device or node associated with the network. Any operable combination of the above are also considered a "mobile station." A mobile device may also be referred to as a mobile terminal, a terminal, a user equipment (UE), a device, a Secure User Plane Location Enabled Terminal (SET), a target device, a target, or by some other name.

While some of the techniques, processes, and/or implementations presented herein may comply with all or part of one or more standards, such techniques, processes, and/or implementations may not, in some embodiments, comply with part or all of such one or more standards.

Although particular embodiments have been disclosed herein in detail, this has been done by way of example for purposes of illustration only, and is not intended to be limiting with respect to the scope of the appended claims, which follow. In particular, it is contemplated that various substitutions, alterations, and modifications may be made without departing from the spirit and scope of the invention as defined by the claims. Other aspects, advantages, and modifications are considered to be within the scope of the following claims. The claims presented are representative of the embodiments and features disclosed herein. Other unclaimed embodiments and features are also contemplated. Accordingly, other embodiments are within the scope of the following claims.

What is claimed is:

1. A method comprising, at a processor-based device:
receiving at a mobile wireless device at least one wireless message including antenna information for one or more wireless access points, wherein the at least one wireless message transmitted from at least one of the one or more wireless access points, and wherein the antenna information comprises antenna gain pattern information for the one or more wireless access points; and
generating, at the mobile wireless device, based, at least in part, on the antenna information for the one or more wireless access points included in the at least one wireless message transmitted from the at least one of the one or more wireless access points, a heatmap representative of values measurable, by the mobile wireless device, at a plurality of locations from signals transmitted by the one or more wireless access points, wherein generating the heatmap comprises:
measuring at multiple locations signal characteristic values for the signals transmitted by the one or more access points; and
determining, based on the antenna gain pattern information for the one or more wireless access points received in the at least one wireless message from the at least one of the one or more wireless access point, and based on the signal characteristic values measured at the multiple locations from the signals transmitted by the one or more wireless access points, interpolated signal characteristic values at locations different from the multiple locations at which the signal characteristics values for the signals transmitted by the one or more wireless access points were measured.

2. The method of claim 1, wherein the values measureable at the plurality of locations comprise one or more of: signal strength values, round trip signal propagation time (RTT) values, or any combination thereof.

3. The method of claim 1, wherein the at least one wireless message includes one of: a beacon frame message, a fine timing measurement (FTM) protocol-based message, an assistance data message, or any combination thereof.

4. The method of claim 1, wherein generating the heatmap further comprises:
determining a propagation model for a respective at least one wireless access point from the one or more wireless access points based, at least in part, on antenna orientation and antenna type obtained for the respective at least one wireless access point from the one or more wireless access points, the propagation model being representative of expected measurable values at multiple locations for corresponding signals transmitted from the respective at least one wireless access point from the one or more wireless access points.

5. The method of claim 1, wherein determining the interpolated signal characteristic values comprises:
deriving antenna orientation for the one or more wireless access points based on the signal characteristic values measured at the multiple locations for the signals transmitted by the one or more wireless access points, and on the antenna gain pattern information for the one or more access points; and
performing interpolation operations, constrained by one or more of the antenna gain pattern information or the derived antenna orientation, on the measured signal characteristic values to determine the interpolated signal characteristic values at the locations different from the multiple locations at which the signal characteristics values for the signals transmitted by the one or more wireless access points were measured.

6. A mobile wireless device comprising:
at least one transceiver to communicate with one or more remote devices;
memory; and
one or more processors coupled to the memory and the at least one transceiver;
the mobile wireless device configured to:
receive at least one wireless message including antenna information for one or more wireless access points, wherein the at least one wireless message transmitted from at least one of the one or more wireless access points, and wherein the antenna information comprises antenna gain pattern information for the one or more wireless access points; and
generate based, at least in part, on the antenna information for the one or more wireless access points included in the at least one wireless message transmitted from the at least one of the one or more wireless access points, a heatmap representative of values measurable, by the mobile wireless device, at a plurality of locations from signals transmitted by the one or more wireless access points, wherein the mobile wireless device configured to generate the heatmap is configured to:
measure at multiple locations signal characteristic values for the signals transmitted by the one or more access points; and
determine, based on the antenna gain pattern information for the one or more wireless access points received in the at least one wireless message from the at least one of the one or more wireless access point, and based on the signal characteristic values measured at the multiple locations from the signals transmitted by the one or more wireless access points, interpolated signal characteristic values at locations different from the multiple locations at which the signal characteristics values for the signals transmitted by the one or more wireless access points were measured.

7. The device of claim 6, wherein the values measureable at the plurality of locations comprise one or more of: signal strength values, round trip signal propagation time (RTT) values, or any combination thereof.

8. The device of claim 6, wherein the at least one wireless message includes one of: a beacon frame message, a fine timing measurement (FTM) protocol-based message, an assistance data message, or any combination thereof.

9. The device of claim 6, wherein the device configured to generate the heatmap is further configured to:
determine a propagation model for a respective at least one wireless access point from the one or more wireless access points based, at least in part, on antenna orientation and antenna type obtained for the respective at least one wireless access point from the one or more wireless access points, the propagation model being representative of expected measurable values at multiple locations for corresponding signals transmitted from the respective at least one wireless access point from the one or more wireless access points.

10. The device of claim 6, wherein the device configured to determine the interpolated signal characteristic values is configured to:
- derive antenna orientation for the one or more wireless access points based on the signal characteristic values measured at the multiple locations for the signals transmitted by the one or more wireless access points, and on the antenna gain pattern information for the one or more access points; and
- perform interpolation operations, constrained by one or more of the antenna gain pattern information or the derived antenna orientation, on the measured signal characteristic values to determine the interpolated signal characteristic values at the locations different from the multiple locations at which the signal characteristics values for the signals transmitted by the one or more wireless access points were measured.

11. An apparatus comprising:
- means for receiving, at a mobile wireless device, at least one wireless message including antenna information for one or more wireless access points, wherein the at least one wireless message transmitted from at least one of the one or more wireless access points, and wherein the antenna information comprises antenna gain pattern information for the one or more wireless access points; and
- means for generating, at the mobile wireless device, based, at least in part, on the antenna information for the one or more wireless access points included in the at least one wireless message transmitted from the at least one of the one or more wireless access points, a heatmap representative of values measurable, by the mobile wireless device, at a plurality of locations from signals transmitted by the one or more wireless access points, wherein the means for generating the heatmap comprises:
  - means for measuring at multiple locations signal characteristic values for the signals transmitted by the one or more access points; and
  - means for determining, based on the antenna gain pattern information for the one or more wireless access points received in the at least one wireless message from the at least one of the one or more wireless access point, and based on the signal characteristic values measured at the multiple locations from the signals transmitted by the one or more wireless access points, interpolated signal characteristic values at locations different from the multiple locations at which the signal characteristics values for the signals transmitted by the one or more wireless access points were measured.

12. The apparatus of claim 11, wherein the values measureable at the plurality of locations comprise one or more of: signal strength values, round trip signal propagation time (RTT) values, or any combination thereof.

13. The apparatus of claim 11, wherein the at least one wireless message includes one of: a beacon frame message, a fine timing measurement (FTM) protocol-based message, or an assistance data message, or any combination thereof.

14. The apparatus of claim 11, wherein the means for generating the heatmap further comprises:
- means for determining a propagation model for a respective at least one wireless access point from the one or more wireless access points based, at least in part, on antenna orientation and antenna type obtained for the respective at least one wireless access point from the one or more wireless access points, the propagation model being representative of expected measurable values at multiple locations for corresponding signals transmitted from the respective at least one wireless access point from the one or more wireless access points.

15. The apparatus of claim 11, wherein the means for determining the interpolated signal characteristic values comprises:
- means for deriving antenna orientation for the one or more wireless access points based on the signal characteristic values measured at the multiple locations for the signals transmitted by the one or more wireless access points, and on the antenna gain pattern information for the one or more access points; and
- means for performing interpolation operations, constrained by one or more of the antenna gain pattern information or the derived antenna orientation, on the measured signal characteristic values to determine the interpolated signal characteristic values at the locations different from the multiple locations at which the signal characteristics values for the signals transmitted by the one or more wireless access points were measured.

16. A non-transitory computer readable media programmed with a set of instructions, executable on a processor, to:
- receive at a mobile wireless device at least one wireless message including antenna information for one or more wireless access points, wherein the at least one wireless message transmitted from at least one of the one or more wireless access points, and wherein the antenna information comprises antenna gain pattern information for the one or more wireless access points; and
- generate, at the mobile wireless device, based, at least in part, on the antenna information for the one or more wireless access points included in the at least one wireless message transmitted from the at least one of the one or more wireless access points, a heatmap representative of values measurable, by the mobile wireless device, at a plurality of locations from signals transmitted by the one or more wireless access points, wherein the set of instructions to generate the heatmap comprises computer instructions to:
  - measure at multiple locations signal characteristic values for the signals transmitted by the one or more access points; and
  - determine, based on the antenna gain pattern information for the one or more wireless access points received in the at least one wireless message from the at least one of the one or more wireless access point, and based on the signal characteristic values measured at the multiple locations from the signals transmitted by the one or more wireless access points, interpolated signal characteristic values at locations different from the multiple locations at which the signal characteristics values for the signals transmitted by the one or more wireless access points were measured.

17. The computer readable media of claim 16, wherein the values measureable at the plurality of locations comprise one or more of: signal strength values, round trip signal propagation time (RTT) values, or any combination thereof.

18. The computer readable media of claim 16, wherein the at least one wireless message including includes one of: a beacon frame message, a fine timing measurement (FTM) protocol-based message, an assistance data message, or any combination thereof.

19. The computer readable media of claim 16, wherein the set of instructions to generate the heatmap comprises further computer instructions to:
- determine a propagation model for a respective at least one wireless access point from the one or more wireless access points based, at least in part, on antenna orientation and antenna type obtained for the respective at least one wireless access point from the one or more wireless access points, the propagation model being representative of expected measurable values at multiple locations for corresponding signals transmitted from the respective at least one wireless access point from the one or more wireless access points.

20. The computer readable media of claim 16, wherein the computer instructions to determine the interpolated signal characteristic values comprise instructions to:
- derive antenna orientation for the one or more wireless access points based on the signal characteristic values measured at the multiple locations for the signals transmitted by the one or more wireless access points, and on the antenna gain pattern information for the one or more access points; and
- perform interpolation operations, constrained by one or more of the antenna gain pattern information or the derived antenna orientation, on the measured signal characteristic values to determine the interpolated signal characteristic values at the locations different from the multiple locations at which the signal characteristics values for the signals transmitted by the one or more wireless access points were measured.

21. The method of claim 1, further comprising:
- measuring, by the mobile wireless device, one or more wireless signals transmitted by the one or more wireless access points; and
- determining, based on the measured one or more wireless signals and the heatmap generated at the mobile wireless device, a location of the mobile wireless device.

22. The method of claim 1, further comprising:
- receiving by the mobile wireless device, from a remote central data repository device that stores antenna data relating to a plurality of access points, additional antenna information for the one or more wireless access points, the additional antenna information, selected from the antenna data based, at least in part, on the antenna information included in the received at least one wireless message.

* * * * *